(12) United States Patent
Hart et al.

(10) Patent No.: US 10,451,773 B2
(45) Date of Patent: Oct. 22, 2019

(54) HIGH LIGHT TRANSMISSION AND SCRATCH-RESISTANT ANTI-REFLECTIVE ARTICLES

(71) Applicant: CORNING INCORPORATED, Corning, NY (US)

(72) Inventors: Shandon Dee Hart, Corning, NY (US); Karl William Koch, III, Elmira, NY (US); Charles Andrew Paulson, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/434,920

(22) Filed: Feb. 16, 2017

(65) Prior Publication Data
US 2017/0160434 A1   Jun. 8, 2017

Related U.S. Application Data

(62) Division of application No. 15/264,765, filed on Sep. 14, 2016.
(Continued)

(51) Int. Cl.
*G02B 1/11* (2015.01)
*G02B 1/14* (2015.01)
(Continued)

(52) U.S. Cl.
CPC .............. *G02B 1/11* (2013.01); *C03C 3/097* (2013.01); *C03C 17/3435* (2013.01);
(Continued)

(58) Field of Classification Search
CPC ...... G02B 5/282; G02B 5/208; G02B 5/0833; G02B 1/10; G02B 1/11; G02B 1/115;
(Continued)

(56) References Cited

U.S. PATENT DOCUMENTS 3,922,068 A   11/1975   Uetsuki
4,995,684 A   1/1985   Sander et al.
(Continued)

FOREIGN PATENT DOCUMENTS

CN   101019043 A   8/2007
CN   101236264 A   8/2008
(Continued)

OTHER PUBLICATIONS

Xu et al; "Chemical control of physical properties in silicon nitride films"; Appl Phys A (20163) 111: 867-876.
(Continued)

*Primary Examiner* — Jie Lei

(57) ABSTRACT

Embodiments of articles with optical coatings are described herein. According to one embodiment, an article may comprise a substrate having a major surface, and an optical coating disposed on the major surface and forming an anti-reflective surface, the optical coating comprising an anti-reflective coating. The article may exhibit a maximum hardness of about 12 GPa or greater as measured on the anti-reflective surface by a Berkovich Indenter Hardness Test along an indentation depth of about 100 nm or greater. The article may exhibit a single side average light reflectance measured at the anti-reflective surface of about 8% or less over an optical wavelength regime in the range from about 400 nm to about 800 nm. The article may exhibit an average light transmission of about 90% or greater over an optical wavelength regime in the range from about 400 nm to about 800 nm.

30 Claims, 54 Drawing Sheets

Related U.S. Application Data

(60) Provisional application No. 62/218,241, filed on Sep. 14, 2015.

(51) Int. Cl.
  *H05K 5/00* (2006.01)
  *H05K 5/03* (2006.01)
  *G02B 1/115* (2015.01)
  *C03C 3/097* (2006.01)
  *C03C 17/34* (2006.01)
  *C03C 17/42* (2006.01)

(52) U.S. Cl.
  CPC .............. *C03C 17/42* (2013.01); *G02B 1/115* (2013.01); *G02B 1/14* (2015.01); *H05K 5/0017* (2013.01); *H05K 5/03* (2013.01)

(58) Field of Classification Search
  CPC .......... G02B 1/116; G02B 1/14; G02B 1/105; C03C 3/097; C03C 17/3435; C03C 17/36; C03C 14/42; C03C 21/002; C03C 17/42; H05K 5/03; H05K 5/0017
  USPC ................ 359/359, 360, 581, 584–589, 884; 428/328, 327, 425.9, 432, 410
  See application file for complete search history.

(56) References Cited

U.S. PATENT DOCUMENTS

| | | |
|---|---|---|
| 4,826,734 A | 5/1989 | Jackson et al. |
| 4,851,095 A | 7/1989 | Scobey et al. |
| 5,077,569 A | 12/1991 | Notagashira et al. |
| 6,129,980 A * | 10/2000 | Tsukada ................ G02B 1/111 313/479 |
| 6,174,599 B1 | 1/2001 | Boire et al. |
| 6,217,272 B1 | 4/2001 | Felsenthal et al. |
| 6,652,974 B1 | 11/2003 | Krisko |
| 7,332,213 B2 | 2/2008 | Mimura et al. |
| 7,498,058 B2 | 3/2009 | Harris et al. |
| 8,273,801 B2 | 9/2012 | Baikerikar et al. |
| 8,312,739 B2 | 11/2012 | Lee et al. |
| 8,460,804 B2 | 6/2013 | Henn et al. |
| 8,561,429 B2 | 10/2013 | Allan et al. |
| 8,691,351 B2 | 4/2014 | Asakura et al. |
| 8,854,623 B2 | 10/2014 | Fontaine et al. |
| 9,023,457 B2 | 5/2015 | Carrilero et al. |
| 9,041,885 B2 | 5/2015 | Weber et al. |
| 9,249,049 B2 | 2/2016 | Fujii |
| 9,296,648 B2 | 3/2016 | Henn et al. |
| 9,359,261 B2 | 6/2016 | Bellman et al. |
| 9,366,784 B2 | 6/2016 | Bellman et al. |
| 9,411,180 B2 | 8/2016 | Gollier et al. |
| 9,573,842 B2 | 2/2017 | Gollier et al. |
| 9,574,262 B2 | 2/2017 | Henn et al. |
| 9,663,400 B2 | 5/2017 | O'Malley et al. |
| 9,701,579 B2 | 7/2017 | Gollier et al. |
| 9,957,609 B2 | 5/2018 | Lee et al. |
| 2003/0116270 A1 | 6/2003 | Hawa et al. |
| 2006/0017707 A1 | 1/2006 | Fukui et al. |
| 2009/0217968 A1 | 9/2009 | Joshi et al. |
| 2012/0052271 A1 | 3/2012 | Gomez et al. |
| 2012/0107607 A1 | 5/2012 | Takak1 et al. |
| 2012/0247152 A1 | 10/2012 | Ohara et al. |
| 2014/0111859 A1* | 4/2014 | Duraes ................ G02B 1/105 359/487.02 |
| 2014/0113083 A1 | 4/2014 | Lee et al. |
| 2014/0334006 A1 | 11/2014 | Adib et al. |
| 2014/0376094 A1 | 12/2014 | Bellman et al. |
| 2015/0322270 A1 | 11/2015 | Amin et al. |
| 2016/0076135 A1 | 3/2016 | Cheah et al. |
| 2017/0075039 A1 | 3/2017 | Hart et al. |
| 2017/0199307 A1 | 7/2017 | Hart et al. |
| 2019/0077352 A1 | 3/2019 | Bhatia et al. |

FOREIGN PATENT DOCUMENTS

| | | |
|---|---|---|
| CN | 101295030 A | 10/2008 |
| CN | 104422971 A | 3/2015 |
| EP | 2328818 B1 | 10/2016 |
| JP | 63238260 A | 10/1988 |
| JP | 09068602 A | 3/1997 |
| JP | 11311702 A | 11/1999 |
| JP | 2004138662 A | 5/2004 |
| JP | 2005114649 A | 4/2005 |
| JP | 2005219223 A | 8/2005 |
| JP | 2009109850 A | 5/2009 |
| JP | 2009199022 A | 9/2009 |
| JP | 2009204506 A | 9/2009 |
| JP | 2013097356 A | 5/2013 |
| JP | 2013142817 A | 7/2013 |
| JP | 2013205634 A | 10/2013 |
| JP | 2014056215 A | 3/2014 |
| JP | 2014194530 A | 10/2014 |
| JP | 2015058605 A | 3/2015 |
| KR | 1103041 B1 | 1/2012 |
| KR | 1194257 B1 | 10/2012 |
| KR | 2013031689 A | 3/2013 |
| KR | 2014034172 A | 3/2014 |
| WO | 1997013003 A2 | 4/1997 |
| WO | 1998037254 A2 | 8/1998 |
| WO | 0037384 A1 | 6/2000 |
| WO | 0242843 A2 | 5/2002 |
| WO | 2006099765 A1 | 9/2006 |
| WO | 2008108332 A1 | 9/2008 |
| WO | 2012144499 A1 | 10/2012 |
| WO | 2013001023 A1 | 1/2013 |
| WO | 2013088856 A1 | 6/2013 |
| WO | 2013098641 A1 | 7/2013 |
| WO | 2013160233 A1 | 10/2013 |
| WO | 2014167293 A1 | 10/2014 |
| WO | 2015009377 A1 | 1/2015 |
| WO | 2015031428 A2 | 3/2015 |
| WO | 2015041257 A1 | 3/2015 |
| WO | 2015085283 A1 | 6/2015 |
| WO | 2015142837 A1 | 9/2015 |
| WO | 2015179739 A1 | 11/2015 |
| WO | 2016018490 A1 | 2/2016 |
| WO | 2016118462 A2 | 7/2016 |

OTHER PUBLICATIONS

Yamamoto et al; "Manufacture Ir-Reflecting Bent Plate Glass." Jpn. Kokai Tokkyo Koho, 1988.

Yamashita et al; "Preparation and Properties of AlON—SiAlON Composites." Journal of the Ceramic Society of Japan 109, pp. 434-439, 2001.

Yan et al; "The Preparation and Properties of Y2O3/AlN Anti-Reflection Films on Chemical Vapor Deposition Diamond." Elsevier, Thin Solid Films, 520, pp. 734-738, 2011.

Yang et al; "Preparation and Properties of C-Axis Preferred Orientation AlN Thin Films by Pure Nitrogen Reactive Sputtering." Xianjiang Daxue Xuebao, Ziran Kexueban, 26 (4), pp. 444-449, 2009.

Yang et al; "Preparation and Properties of AlN Thin Films by Pure Nitrogen Reactive Sputtering." Rengong Jingti Xuebao, 39 (1), pp. 190-196, 2010.

Yun, et al., "Optical and Structural Investigation of AlN Grown on Sapphire with Reactive MBE Using RF Nitrogen or Ammonia." Mat. Res. Soc. Symp. Proc., vol. 764, 2003.

Zabinski et al; "Stoichiometry and characterization of aluminium oxynitride thin films grown by ion-beam assisted pulsed laser deposition." Elsevier, Thin Solid Films, 516, pp. 6215-6219, 2008.

Zayats et al; "Optical Studies of AlN/n—Si(100) Films Obtained by the Method of High-Frequency Magnetron Sputtering."

Wang at al. "Tribological and optical properties of crystalline and amorphous alumina thin films grown by low temperature reactive magnetron sputter-deposition", Surface and coatings technology, pp. 146-147 (2001) p. 189-194.

Oliver et al. "An improved technique for determining hardness and elastic modulus using load and displacement sensing indentation experiments". J. Mater. Res., vol. 7, No. 6, 1992, 1564-1583.

(56) References Cited

OTHER PUBLICATIONS

Oliver et al. "Measurement of Hardness and Elastic Modulus by Instrument Indentation: Advances in Understanding and Refinements to Methodology", J. Mater. Res., vol. 19, No. 1, 2004, 3-20.
Southwell, "Coating design using very thin high-and low-index layers." Applied Optics, vol. 24, Issue 4, pp. 457, (1985).
English Translation of CN201480037881.2 Office Action dated Mar. 24, 2017, China Patent Office.
Corning, Corning Gorilla Glass for Large Cover-Glass Applications, 2013, pp. 1-3.
Corning, Corning Eagle2000 Glass, Material Information, Revised Aug. 2000, pp. 1-5.
Corning, Corning Eagle XG AMLCD Glass Substrates Material Information, Mie 301, Issued: Jan. 2006, pp. 1-3.
English Translation of CN201680039563.9 First Office Action dated Apr. 30, 2019, China Patent Office, 11 Pgs.
Caceres and Prieto, "Mechanical properties of sputtered silicon notride thin films", Journal of Applied Physics 94 (12) 2003, pp. 7868-7873.
Chan et al; "Fracture Toughness Improvements of Dental Ceramic Through Use of Yttria-Stabilized Zirconia (YSZ) Thin-Film Coating"; Dental Materials, 29 (2013) pp. 881-887.
Fischer-Cripps; "Critical Review of Analysis and Interpretation of Nanoindentation Test Data"; Surface & Coatings Technology 200 (2006) pp. 4153-4165.
Harding et al; "Cracking During Indentation and Its Use in the Measurement of Fracture Toughness"; Mat. Res. Soc. Symp. Proc.; vol. 356, 1995, pp. 663-668.
Hay et al; "Continuous Stiffness Measurement During Instrumented Indentation Testing"; Experimental Techniques; May/Jun. 2010; pp. 86-94.
Hu et al; "Dynamic Fracturing of Strengthened Glass Under Biaxial Tensile Loading"; Journal of Non-Crystalline Solids; 405 (2014); pp. 153-158.
Kittel, "Introduction to Solid State Physics." Seventh Edition, John Wiley & Sons, Inc., NY, 1996, pp. 611-627;.
Park et al; "Atomic Layer Deposition of Yttria-Stabilized Zirconia Thin Films for Enhanced Reactivity and Stability of Solid Oxide Fuel Cells"; Energy; vol. 116; (2016); pp. 170-176.
Ruddell et al; "The Effect of Deposition Parameters on the Properties of Yttria-Stabilzed Zirconia Thin Films"; Thin Solid Films, 445 (2003) pp. 14-19.
Shackelford, "Introduction to Materials Science for Engineers," Sixth Edition, Pearson Prentice Hall, New Jersey, 2005, pp. 404-418.
Smart and Moore; "Solid State Chemistry, an Introduction," Chapman & Hall University and Rofessional Division, London, 1992, pp. 136-151.
Sonderby et al; "Deposition of Yttria-Stabilized Zirconia Thin Films by High Power Impulse Magnetron Sputtering and Pulsed Magnetron Sputtering"; Surface & Coatings Technology; 240; (2014) pp. 1-6.
Wang et al; "Toward Hard Yet Tough Ceramic Coatings"; Surface & Coatings Technology 258 (2014) pp. 1-16.

* cited by examiner

HIGH LIGHT TRANSMISSION AND SCRATCH-RESISTANT ANTI-REFLECTIVE ARTICLES

CROSS-REFERENCE TO RELATED APPLICATIONS

This application is a divisional of and claims the benefit of priority to U.S. application Ser. No. 15/264,765 filed on Sep. 14, 2016 and U.S. Provisional Application Ser. No. 62/218,241 filed on Sep. 14, 2015, the contents of each of which are relied upon and incorporated herein by reference in their entireties.

BACKGROUND

The disclosure relates to durable and scratch resistant anti-reflective articles and methods for making the same, and more particularly to articles with multi-layer anti-reflective coatings exhibiting abrasion resistance, scratch resistance, low reflectivity, and colorless transmittance and/or reflectance.

Cover articles are often used to protect critical devices within electronic products, to provide a user interface for input and/or display, and/or many other functions. Such products include mobile devices, such as smart phones, mp3 players and computer tablets. Cover articles also include architectural articles, transportation articles (e.g., articles used in automotive applications, trains, aircraft, sea craft, etc.), appliance articles, or any article that requires some transparency, scratch-resistance, abrasion resistance or a combination thereof. These applications often demand scratch-resistance and strong optical performance characteristics, in terms of maximum light transmittance and minimum reflectance. Furthermore, some cover applications require that the color exhibited or perceived, in reflection and/or transmission, does not change appreciably as the viewing angle is changed. In display applications, this is because, if the color in reflection or transmission changes with viewing angle to an appreciable degree, the user of the product will perceive a change in color or brightness of the display, which can diminish the perceived quality of the display. In other applications, changes in color may negatively impact the aesthetic requirements or other functional requirements.

The optical performance of cover articles can be improved by using various anti-reflective coatings; however known anti-reflective coatings are susceptible to wear or abrasion. Such abrasion can compromise any optical performance improvements achieved by the anti-reflective coating. For example, optical filters are often made from multilayer coatings having differing refractive indices and made from optically transparent dielectric material (e.g., oxides, nitrides, and fluorides). Most of the typical oxides used for such optical filters are wide band-gap materials, which do not have the requisite mechanical properties, such as hardness, for use in mobile devices, architectural articles, transportation articles or appliance articles. Nitrides and diamond-like coatings may exhibit high hardness values but such materials do not exhibit the transmittance needed for such applications.

Abrasion damage can include reciprocating sliding contact from counter face objects (e.g., fingers). In addition, abrasion damage can generate heat, which can degrade chemical bonds in the film materials and cause flaking and other types of damage to the cover glass. Since abrasion damage is often experienced over a longer term than the single events that cause scratches, the coating materials disposed experiencing abrasion damage can also oxidize, which further degrades the durability of the coating.

Known anti-reflective coatings are also susceptible to scratch damage and, often, even more susceptible to scratch damage than the underlying substrates on which such coatings are disposed. In some instances, a significant portion of such scratch damage includes microductile scratches, which typically include a single groove in a material having extended length and with depths in the range from about 100 nm to about 500 nm. Microductile scratches may be accompanied by other types of visible damage, such as sub-surface cracking, frictive cracking, chipping and/or wear. Evidence suggests that a majority of such scratches and other visible damage is caused by sharp contact that occurs in a single contact event. Once a significant scratch appears on the cover substrate, the appearance of the article is degraded since the scratch causes an increase in light scattering, which may cause significant reduction in brightness, clarity and contrast of images on the display. Significant scratches can also affect the accuracy and reliability of articles including touch sensitive displays. Single event scratch damage can be contrasted with abrasion damage. Single event scratch damage is not caused by multiple contact events, such as reciprocating sliding contact from hard counter face objects (e.g., sand, gravel and sandpaper), nor does it typically generate heat, which can degrade chemical bonds in the film materials and cause flaking and other types of damage. In addition, single event scratching typically does not cause oxidization or involve the same conditions that cause abrasion damage and therefore, the solutions often utilized to prevent abrasion damage may not also prevent scratches. Moreover, known scratch and abrasion damage solutions often compromise the optical properties.

Accordingly, there is a need for new cover articles, and methods for their manufacture, which are abrasion resistant, scratch resistant and have improved optical performance.

SUMMARY

Embodiments of durable and scratch resistant anti-reflective articles are described. In one or more embodiments, the article includes a substrate and an optical coating disposed on the major surface forming an anti-reflective surface. In one or more embodiments, the optical coating includes an anti-reflective coating.

The article exhibits scratch resistance by exhibiting a maximum hardness of about 12 GPa or greater, as measured by a Berkovich Indenter Hardness Test, as described herein, along an indentation depth of about 50 nm or greater (e.g., about 100 nm or greater, from about 50 nm to about 300 nm, from about 50 nm to about 400 nm, from about 50 nm to about 500 nm, from about 50 nm to about 600 nm, from about 50 nm to about 1000 nm or from about 50 nm to about 2000 nm), on the anti-reflective surface.

The article exhibits an abrasion resistance as measured on the anti-reflective surface after a 500-cycle abrasion using a Taber Test, as described herein. In one or more embodiments, the article exhibits an abrasion resistance (as measured on the anti-reflective surface) comprising about 1% haze or less, as measured using a hazemeter having an aperture, wherein the aperture has a diameter of about 8 mm. In one or more embodiments, the article exhibits an abrasion resistance (as measured on the anti-reflective surface) comprising an average roughness Ra, as measured by atomic force microscopy, of about 12 nm or less. In one or more embodiments, the article exhibits an abrasion resistance (as measured on the anti-reflective surface) comprising a scattered light intensity of about 0.05 (in units of 1/steradian) or less, at a polar scattering angle of about 40 degrees or less, as measured at normal incidence in transmission using an imaging sphere for scatter measurements, with a 2 mm aperture at 600 nm wavelength. In some instances, the article exhibits an abrasion resistance (as measured on the anti-reflective surface) comprising a scattered light intensity of about 0.1 (in units of 1/steradian) or less, at a polar scattering angle of about 20 degrees or less, as measured at normal incidence in transmission using an imaging sphere for scatter measurements, with a 2 mm aperture at 600 nm wavelength.

The article of one or more embodiments exhibits superior optical performance in terms of light transmittance and/or light reflectance. In one or more embodiments, the article exhibits an average light transmittance (measured on the anti-reflective surface only) of about 92% or greater (e.g., about 98% or greater) over an optical wavelength regime (e.g., in the range from about 400 nm to about 800 nm or from about 450 nm to about 650 nm). In some embodiments, the article exhibits an average light reflectance (measured at the anti-reflective surface only) of about 2% or less (e.g., about 1% or less) over the optical wavelength regime. The article may exhibits an average light transmittance or average light reflectance having an average oscillation amplitude of about 1 percentage points or less over the optical wavelength regime. In one or more embodiments, the article exhibits an average photopic reflectance of about 1% or less at normal incidence, as measured on only the anti-reflective surface. In some embodiments, the article exhibits a single-side average photopic reflectance, measured at normal or near-normal incidence (e.g. 0-10 degrees) on the anti-reflective surface only of less than about 10%. In some embodiments, the single-side average photopic reflectance is about 9% or less, about 8% or less, about 7% or less, about 6% or less, about 5% or less, about 4% or less, about 3%, or about 2% or less.

In some instances, the article exhibits an angular color shift (as described herein) of less than about 10 (e.g., 5 or less, 4 or less, 3 or less, 2 or less or about 1 or less) from a reference illumination angle to an incident illumination angle in the range from about 2 degrees to about 60 degrees, when viewed at the anti-reflective surface using an illuminant. Exemplary illuminants include any one of CIE F2, CIE F10, CIE F11, CIE F12 and CIE D65. In one or more embodiment, the article may exhibit a b* value of less than about 2 in the CIE L*, a*, b* colorimetry system at all incidence illumination angles in the range from about 0 to about 60 degrees. Alternatively or additionally, the article of some embodiments exhibits a transmittance color (or transmittance color coordinates) and/or a reflectance color (or reflectance color coordinates) measured at the anti-reflective surface at normal incidence having a reference point color shift of less than about 2 from a reference point, as defined herein. In one or more embodiments, the reference point may be the origin (0, 0) in the L*a*b* color space (or the color coordinates a*=0, b*=0 or a*=−2, b*=−2) or the transmittance or reflectance color coordinates of the substrate. The angular color shift, the reference point color shift and the color coordinates (a* and/or b*) described herein are observed under a D65 and/or F2 illuminant. In some embodiments, the optical performance described herein is observed under a F2 illuminant, which is known to be more challenging due to the sharp spectral features of the F2 illuminant source.

In one or more embodiments, the anti-reflective coating may include a plurality of layers. For example, in some embodiments, the anti-reflective coating includes a period comprising a first low RI layer and a second high RI layer. The period may include a first low RI layer and a second high RI disposed on the first low RI layer or vice versa. In some embodiments, the period may include a third layer. The anti-reflective coating may include a plurality of periods such that the first low RI layer and the second high RI layer alternate. The anti-reflective coating can include up to about 10 or 20 periods.

In some embodiments, the optical coating includes a scratch resistant layer. Where scratch resistant layers are included, such layers may be disposed on the anti-reflective coating. In other embodiments, the scratch resistant coating is disposed between the anti-reflective coating and the substrate. Exemplary scratch resistant layers may exhibit a maximum hardness in the range from about 8 GPa to about 50 GPa as measured by a Berkovitch Indenter Hardness Test, as defined herein.

The scratch resistant layer may be disposed between the substrate and the anti-reflective coating. In some embodiments, the anti-reflective coating may include a first portion and a second portion such that the scratch resistant layer is disposed between the first portion and the second portion. The thickness of the scratch-resistant layer may be in the range from about 200 nanometers to about 3 micrometers.

In some embodiments, the article may include a layer having a refractive index greater than about 1.8. Materials that may be utilized in that layer include $SiN_x$, $SiO_xN_y$, $Si_uAl_vO_xN_y$, $AlN_x$, $AlO_xN_y$, or a combination thereof.

In some instances, the article may include an additional layer, such as an easy-to-clean coating, a diamond-like carbon ("DLC") coating, a scratch-resistant coating or a combination thereof. Such coatings may be disposed on the anti-reflective coating or between layers of the anti-reflective coating.

The substrate utilized in one or more embodiments of the article can include an amorphous substrate or a crystalline substrate. An of an amorphous substrate includes glass that may be selected from the group consisting of soda lime glass, alkali aluminosilicate glass, alkali containing borosilicate glass and alkali aluminoborosilicate glass. In some embodiments, the glass may be strengthened and may include a compressive stress (CS) layer with a surface CS of at least 250 MPa extending within the strengthened glass from a surface of the chemically strengthened glass to a depth of layer (DOL) of at least about 10 μm.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Reference will now be made in detail to various embodiments, examples of which are illustrated in the accompanying drawings.

Figure 1:
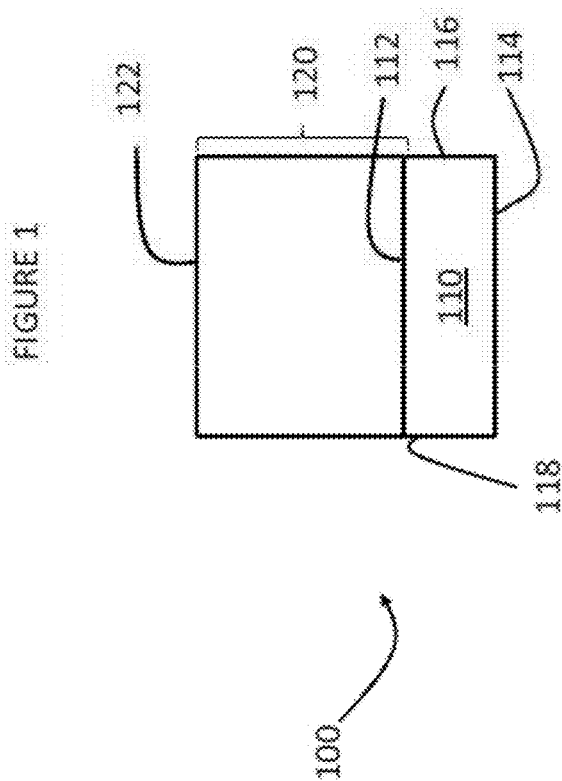
FIG. 1 is a side view of an article, according to one or more embodiments.

Referring to FIG. 1, the article 100 according to one or more embodiments may include a substrate 110, and an optical coating 120 disposed on the substrate. The substrate 110 includes opposing major surfaces 112, 114 and opposing minor surfaces 116, 118. The optical coating 120 is shown in FIG. 1 as being disposed on a first opposing major surface 112; however, the optical coating 120 may be disposed on the second opposing major surface 114 and/or one or both of the opposing minor surfaces, in addition to or instead of being disposed on the first opposing major surface 112. The optical coating 120 forms an anti-reflective surface 122.

The optical coating 120 includes at least one layer of at least one material. The term "layer" may include a single layer or may include one or more sub-layers. Such sub-layers may be in direct contact with one another. The sub-layers may be formed from the same material or two or more different materials. In one or more alternative embodiments, such sub-layers may have intervening layers of different materials disposed therebetween. In one or more embodiments a layer may include one or more contiguous and uninterrupted layers and/or one or more discontinuous and interrupted layers (i.e., a layer having different materials formed adjacent to one another). A layer or sub-layers may be formed by any known method in the art, including discrete deposition or continuous deposition processes. In one or more embodiments, the layer may be formed using only continuous deposition processes, or, alternatively, only discrete deposition processes.

The thickness of the optical coating 120 may be about 1 µm or greater while still providing an article that exhibits the optical performance described herein. In some examples, the optical coating 120 thickness may be in the range from about 1 µm to about 20 µm (e.g., from about 1 µm to about 10 µm, or from about 1 µm to about 5 µm).

As used herein, the term "dispose" includes coating, depositing and/or forming a material onto a surface using any known method in the art. The disposed material may constitute a layer, as defined herein. The phrase "disposed on" includes the instance of forming a material onto a surface such that the material is in direct contact with the surface and also includes the instance where the material is formed on a surface, with one or more intervening material(s) is between the disposed material and the surface. The intervening material(s) may constitute a layer, as defined herein.

Figure 2:
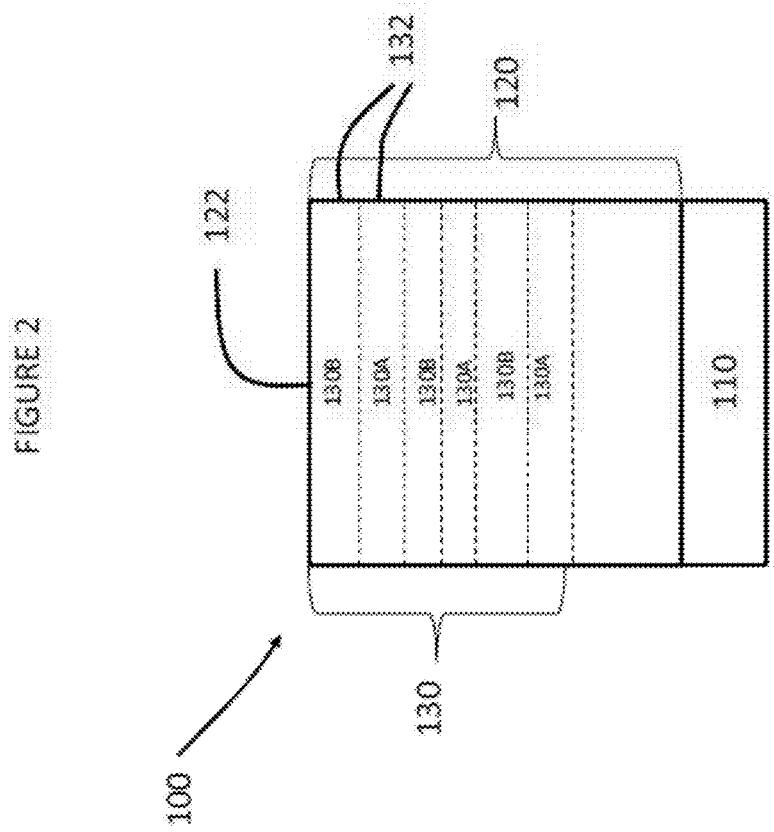
FIG. 2 is a side view of an article, according to one or more specific embodiments.

As shown in FIG. 2, the optical coating 120 includes an anti-reflective coating 130, which may include a plurality of layers (130A, 130B). In one or more embodiments, the anti-reflective coating 130 may include a period 132 comprising two or more layers. In one or more embodiments, the two or more layers may be characterized as having different refractive indices from each another. In one embodiment, the period 132 includes a first low RI layer 130A and a second high RI layer 130B. The difference in the refractive index of the first low RI layer and the second high RI layer may be about 0.01 or greater, 0.05 or greater, 0.1 or greater or even 0.2 or greater.

As shown in FIG. 2, the anti-reflective coating 130 may include a plurality of periods (132). A single period includes include a first low RI layer 130A and a second high RI layer 130B, such that when a plurality of periods are provided, the first low RI layer 130A (designated for illustration as "L") and the second high RI layer 130B (designated for illustration as "H") alternate in the following sequence of layers: L/H/L/H or H/L/H/L, such that the first low RI layer and the second high RI layer appear to alternate along the physical thickness of the anti-reflective coating 120. In the example in FIG. 2, the anti-reflective coating 130 includes three periods. In some embodiments, the anti-reflective coating 130 may include up to 25 periods. For example, the anti-reflective coating 130 may include from about 2 to about 20 periods, from about 2 to about 15 periods, from about 2 to about 10 periods, from about 2 to about 12 periods, from about 3 to about 8 periods, from about 3 to about 6 periods.

Figure 3:
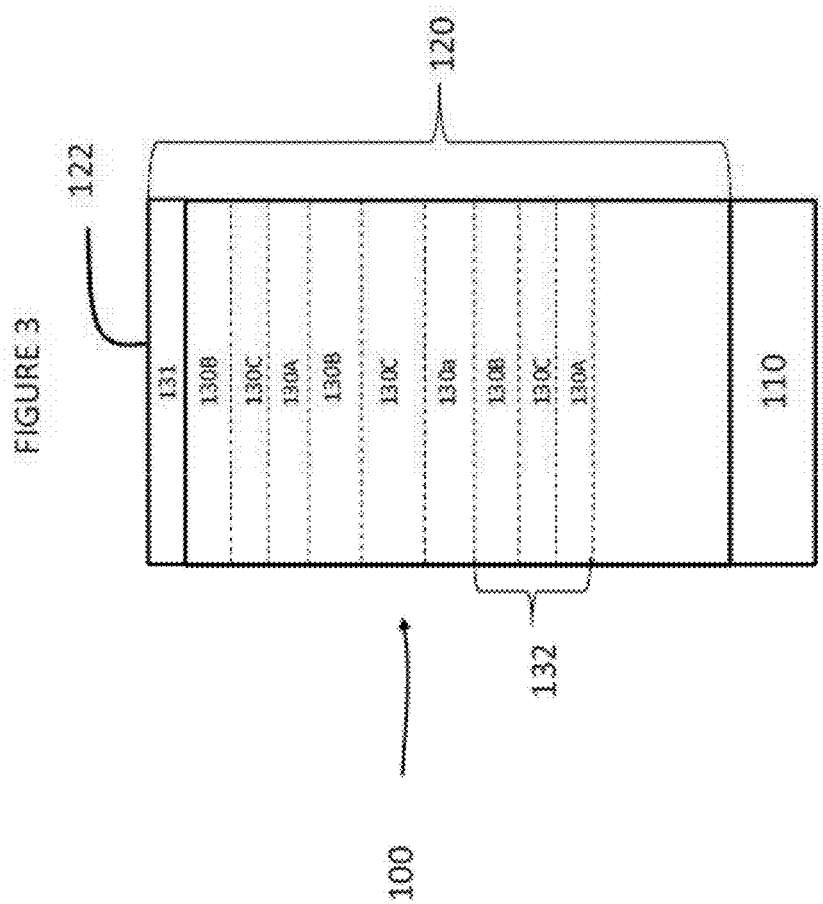
FIG. 3 is a side view of an article, according to one or more embodiments.

In the embodiment shown in FIG. 3, the anti-reflective coating 130 may include an additional capping layer 131, which may include a lower refractive index material than the second high RI layer 130B. In some embodiments, the period 132 may include one or more third layers 130C, as shown in FIG. 3. The third layer(s) 130C may have a low RI, a high RI or a medium RI. In some embodiments, the third layer(s) 130C may have the same RI as the first low RI layer 130A or the second high RI layer 130B. In other embodiments, the third layer(s) 130C may have a medium RI that is between the RI of the first low RI layer 130A and the RI of the second high RI layer 130B. Alternatively, the third layer(s) 130C may have a refractive index greater than the $2^{nd}$ high RI layer 130B. The third layer may be provided in the anti-reflective coating 120 in the following exemplary configurations: $L_{third\ layer}$/H/L/H/L; $H_{third\ layer}$/L/H/L/H; L/H/L/H/$L_{third\ layer}$; H/L/H/L/$H_{third\ layer}$; $L_{third\ layer}$/H/L/H/ L/$H_{third\ layer}$; $H_{third\ layer}$/L/H/L/H/$L_{third\ layer}$; $L_{third\ layer}$/L/H/ L/H; $H_{third\ layer}$/H/L/H/L; H/L/H/L/$L_{third\ layer}$; L/H/L/H/ $H_{third\ layer}$; $L_{third\ layer}$/L/H/L/H/$H_{third\ layer}$; $H_{third\ layer}$//H/L/ H/L/$L_{third\ layer}$; L/$M_{third\ layer}$/H/L/M/H; H/M/L/H/M/L; M/L/H/L/M; and other combinations. In these configurations, "L" without any subscript refers to the first low RI layer and "H" without any subscript refers to the second high RI layer. Reference to "$L_{third\ sub-layer}$" refers to a third layer having a low RI, "$H_{third\ sub-layer}$" refers to a third layer having a high RI and "M" refers to a third layer having a medium RI, all relative to the $1^{st}$ layer and the $2^{nd}$ layer.

As used herein, the terms "low RI", "high RI" and "medium RI" refer to the relative values for the RI to another (e.g., low RI<medium RI<high RI). In one or more embodiments, the term "low RI" when used with the first low RI layer or with the third layer, includes a range from about 1.3 to about 1.7 or 1.75. In one or more embodiments, the term "high RI" when used with the second high RI layer or with the third layer, includes a range from about 1.7 to about 2.5 (e.g., about 1.85 or greater). In some embodiments, the term "medium RI" when used with the third layer, includes a range from about 1.55 to about 1.8. In some instances, the ranges for low RI, high RI and medium RI may overlap; however, in most instances, the layers of the anti-reflective coating 130 have the general relationship regarding RI of: low RI<medium RI<high RI.

Figure 4:
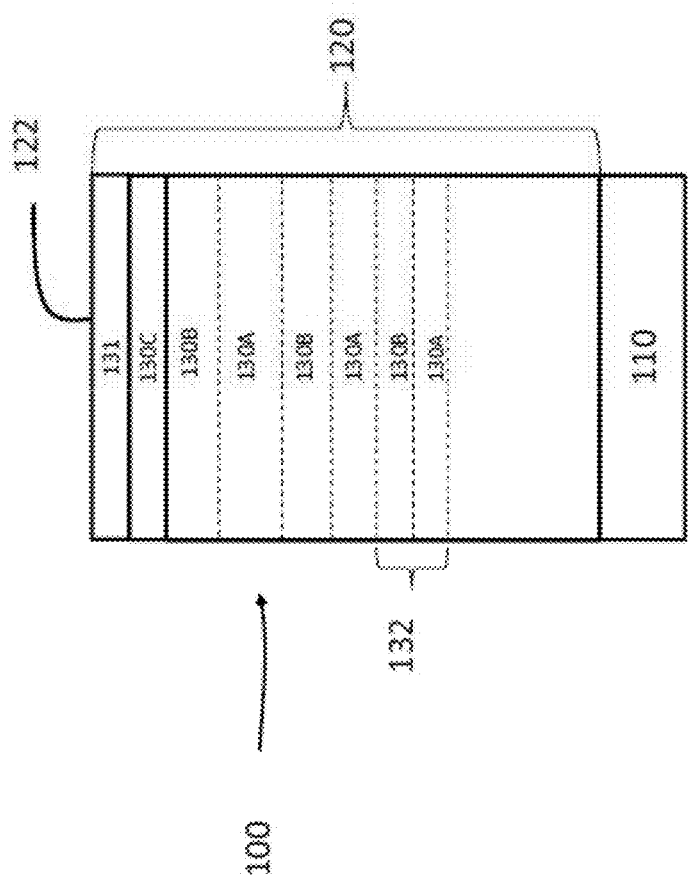
FIG. 4 is a side view of an article, according to one or more embodiments.
Figure 5:
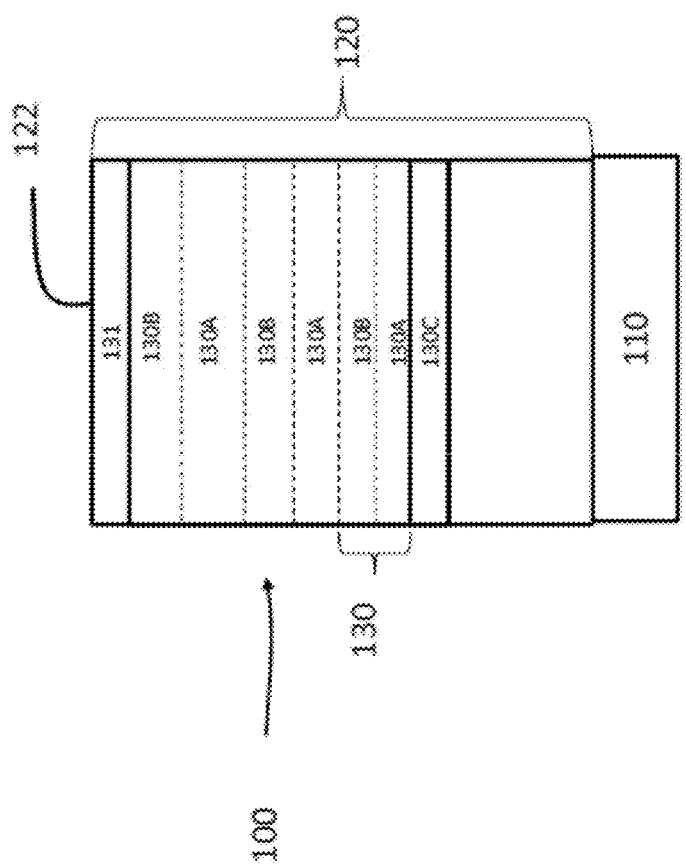
FIG. 5 is a side view of an article, according to one or more embodiments.
Figure 6:
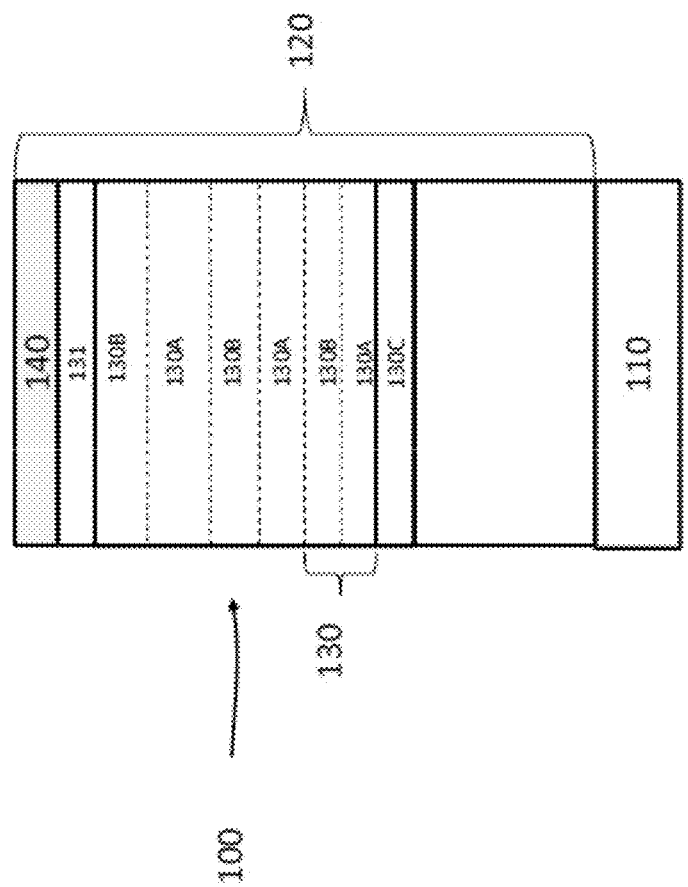
FIG. 6 is a side view of an article, according to one or more embodiments.

The third layer(s) 130C may be provided as a separate layer from a period 132 and may be disposed between the period or plurality of periods and the capping layer 131, as shown in FIG. 4. The third layer(s) may also be provided as a separate layer from a period 132 and may have disposed between the substrate 110 and the plurality of periods 132, as shown in FIG. 5. The third layer(s) 130C may be used in addition to an additional coating 140 instead of the capping 131 or in addition to the capping layer, as shown in FIG. 6.

Exemplary materials suitable for use in the anti-reflective coating 130 include: $SiO_2$, $Al_2O_3$, $GeO_2$, SiO, AlOxNy, AlN, SiNx, $SiO_xN_y$, $Si_uAl_vO_xN_y$, $Ta_2O_5$, $Nb_2O_5$, $TiO_2$, $ZrO_2$, TiN, MgO, MgF$_2$, BaF$_2$, CaF$_2$, SnO$_2$, HfO$_2$, Y$_2$O$_3$, MoO$_3$, DyF$_3$, YbF$_3$, YF$_3$, CeF$_3$, polymers, fluoropolymers, plasma-polymerized polymers, siloxane polymers, silsesquioxanes, polyimides, fluorinated polyimides, polyetherimide, polyethersulfone, polyphenylsulfone, polycarbonate, polyethylene terephthalate, polyethylene naphthalate, acrylic polymers, urethane polymers, polymethylmethacrylate, other materials cited below as suitable for use in a scratch-resistant layer, and other materials known in the art. Some examples of suitable materials for use in the first low RI layer include SiO$_2$, Al$_2$O$_3$, GeO$_2$, SiO, AlO$_x$N$_y$, SiO$_x$N$_y$, Si$_u$Al$_v$O$_x$N$_y$, MgO, MgAl$_2$O$_4$, MgF$_2$, BaF$_2$, CaF$_2$, DyF$_3$, YbF$_3$, YF$_3$, and CeF$_3$. The nitrogen content of the materials for use in the first low RI layer may be minimized (e.g., in materials such as Al$_2$O$_3$ and MgAl$_2$O$_4$). Some examples of suitable materials for use in the second high RI layer include Si$_u$Al$_v$O$_x$N$_y$, Ta$_2$O$_5$, Nb$_2$O$_5$, AlN, Si$_3$N$_4$, AlO$_x$N$_y$, SiO$_x$N$_y$, SiN$_x$, SiN$_x$:H$_y$, HfO$_2$, TiO$_2$, ZrO$_2$, Y$_2$O$_3$, Al$_2$O$_3$, MoO$_3$ and diamond-like carbon. In examples, the high RI layer may also be a high hardness layer or a scratch resistant layer, and the high RI materials listed above may also comprise high hardness or scratch resistance. The oxygen content of the materials for the second high RI layer and/or the scratch-resistant layer may be minimized, especially in SiNx or AlNx materials. AlO$_x$N$_y$ materials may be considered to be oxygen-doped AlNx, that is they may have an AlNx crystal structure (e.g. wurtzite) and need not have an AlON crystal structure. Exemplary preferred AlO$_x$N$_y$ high RI materials may comprise from about 0 atom % to about 20 atom % oxygen, or from about 5 atom % to about 15 atom % oxygen, while including 30 atom % to about 50 atom % nitrogen. Exemplary preferred Si$_u$Al$_v$O$_x$N$_y$ high RI materials may comprise from about 10 atom % to about 30 atom % or from about 15 atom % to about 25 atom % silicon, from about 20 atom % to about 40 atom % or from about 25 atom % to about 35 atom % aluminum, from about 0 atom % to about 20 atom % or from about 1 atom % to about 20 atom % oxygen, and from about 30 atom % to about 50 atom % nitrogen. The foregoing materials may be hydrogenated up to about 30% by weight. Where a material having a medium refractive index is desired, some embodiments may utilize AlN and/or SiO$_x$N$_y$. The hardness of the second high RI layer and/or the scratch-resistant layer may be characterized specifically. In some embodiments, the maximum hardness of the second high RI layer and/or the scratch-resistant layer, as measured by the Berkovitch Indenter Hardness Test, may be about 8 GPa or greater, about 10 GPa or greater, about 12 GPa or greater, about 15 GPa or greater, about 18 GPa or greater, or about 20 GPa or greater. In some cases, the second high RI layer material may be deposited as a single layer and may be characterized as a scratch resistant layer, and this single layer may have a thickness between about 500 and 2000 nm for repeatable hardness determination.

In one or more embodiments at least one of the layer(s) of the anti-reflective coating 130 may include a specific optical thickness range. As used herein, the term "optical thickness" is determined by (n*d), where "n" refers to the RI of the sub-layer and "d" refers to the physical thickness of the layer. In one or more embodiments, at least one of the layers of the anti-reflective coating 130 may include an optical thickness in the range from about 2 nm to about 200 nm, from about 10 nm to about 100 nm, from about 15 nm to about 100 nm, from about 15 to about 500 nm, or from about 15 to about 5000 nm. In some embodiments, all of the layers in the anti-reflective coating 130 may each have an optical thickness in the range from about 2 nm to about 200 nm, from about 10 nm to about 100 nm, from about 15 nm to about 100 nm, from about 15 to about 500 nm, or from about 15 to about 5000 nm. In some cases, at least one layer of the anti-reflective coating 130 has an optical thickness of about 50 nm or greater. In some cases, each of the first low RI layers have an optical thickness in the range from about 2 nm to about 200 nm, from about 10 nm to about 100 nm, from about 15 nm to about 100 nm, from about 15 to about 500 nm, or from about 15 to about 5000 nm. In other cases, each of the second high RI layers have an optical thickness in the range from about 2 nm to about 200 nm, from about 10 nm to about 100 nm, from about 15 nm to about 100 nm, from about 15 to about 500 nm, or from about 15 to about 5000 nm. In yet other cases, each of the third layers have an optical thickness in the range from about 2 nm to about 200 nm, from about 10 nm to about 100 nm, from about 15 nm to about 100 nm, from about 15 to about 500 nm, or from about 15 to about 5000 nm.

In some embodiments, the thickness of one or more of the layers of the optical coating 130 may be minimized. In one or more embodiments, the thickness of the thickness of the high RI layer(s) and/or the medium RI layer(s) are minimized such that they are less than about 500 nm. In one or more embodiments, the combined thickness of the high RI layer(s), the medium RI (layers) and/or the combination of the high RI and medium RI layers is less than about 500 nm.

In some embodiments, the amount of low RI material in the optical coating may be minimized. Without being bound by theory, the low RI material is typically also a lower-hardness material, owing to the nature of atomic bonding and electron densities that simultaneously affect refractive index and hardness, and thus minimizing such material can maximize the hardness, while maintaining the reflectance and color performance described herein. Expressed as a fraction of physical thickness of the optical coating, the low RI material may comprise less than about 60%, less than about 50%, less than about 40%, less than about 30%, less than about 20%, less than about 10%, or less than about 5% of the physical thickness of the optical coating. Alternately or additionally, the amount of low RI material may be quantified as the sum of the physical thicknesses of all layer of low RI material that are disposed above the thickest high RI layer in the optical coating (i.e. on the side opposite the substrate, user side or air side). Without being bound by theory, the thick high RI layer having a high hardness effectively shields the layers underneath (or between the thick RI layer and the substrate) from many or most scratches. Accordingly, the layers disposed above the thickest high RI layer may have an outsized effect on scratch resistance of the overall article. This is especially relevant when the thickest high RI layer has a physical thickness that is greater than about 400 nm and has a hardness greater than about 12 GPa as measured by the Berkovich Indenter Hardness Test. The amount of low RI material disposed on the thickest high RI layer (i.e. on the side opposite the substrate, user side or air side) may have a thickness less than or equal to about 150 nm, less than or equal to about 120 nm, less than or equal to about 110 nm, 100 nm, 90 nm, 80 nm, 70 nm, 60 nm, 50 nm, 40 nm, 30 nm, 25 nm, 20 nm, 15 nm, or less than or equal to about 12 nm.

In some embodiments, the top-most air-side layer may comprise a high RI layer that also exhibits high hardness, as shown in Modeled Examples 8-9. In some embodiments, an additional coating 140 may be disposed on top of this top-most air-side high RI layer (e.g., the additional coating may include low-friction coating, an oleophobic coating, or an easy-to-clean coating). Moreover, as illustrated by Modeled Example 10, the addition of a low RI layer having a very low thickness (e.g., about 10 nm or less, about 5 nm or less or about 2 nm or less) has minimal influence on the optical performance, when added to the top-most air-side layer comprising a high RI layer. The low RI layer having a very low thickness may include $SiO_2$, an oleophobic or low-friction layer, or a combination of $SiO_2$ and an oleophobic material. Exemplary low-friction layers may include diamond-like carbon, such materials (or one or more layers of the optical coating) may exhibit a coefficient of friction less than 0.4, less than 0.3, less than 0.2, or even less than 0.1.

In one or more embodiments, the anti-reflective coating 130 has a physical thickness of about 800 nm or less. The anti-reflective coating 130 may have a physical thickness in the range from about 10 nm to about 800 nm, from about 50 nm to about 800 nm, from about 100 nm to about 800 nm, from about 150 nm to about 800 nm, from about 200 nm to about 800 nm, from about 10 nm to about 750 nm, from about 10 nm to about 700 nm, from about 10 nm to about 650 nm, from about 10 nm to about 600 nm, from about 10 nm to about 550 nm, from about 10 nm to about 500 nm, from about 10 nm to about 450 nm, from about 10 nm to about 400 nm, from about 10 nm to about 350 nm, from about 10 nm to about 300 nm, from about 50 to about 300, and all ranges and sub-ranges therebetween.

In one or more embodiments, the combined physical thickness of the second high RI layer(s) may be characterized. For example, in some embodiments, the combined thickness of the second high RI layer(s) may be about 100 nm or greater, about 150 nm or greater, about 200 nm or greater, about 500 nm or greater. The combined thickness is the calculated combination of the thicknesses of the individual high RI layer(s) in the anti-reflective coating 130, even when there are intervening low RI layer(s) or other layer(s). In some embodiments, the combined physical thickness of the second high RI layer(s), which may also comprise a high-hardness material (e.g., a nitride or an oxynitride material), may be greater than 30% of the total physical thickness of the anti-reflective coating. For example, the combined physical thickness of the second high RI layer(s) may be about 40% or greater, about 50% or greater, about 60% or greater, about 70% or greater, about 75% or greater, or even about 80% or greater, of the total physical thickness of the anti-reflective coating. Additionally or alternatively, the amount of the high refractive index material, which may also be a high-hardness material, included in the optical coating may be characterized as a percentage of the physical thickness of the upper most (i.e., user side or side of the optical coating opposite the substrate) 500 nm of the article or optical coating 120. Expressed as a percentage of the upper most 500 nm of the article or optical coating, the combined physical thickness of the second high RI layer(s) (or the thickness of the high refractive index material) may be about 50% or greater, about 60% or greater, about 70% or greater, about 80% or greater, or even about 90% or greater. In some embodiments, greater proportions of hard and high-index material within the anti-reflective coating can also simultaneously be made to also exhibit low reflectance, low color, and high abrasion resistance as further described elsewhere herein. In one or more embodiments, the second high RI layers may include a material having a refractive index greater than about 1.85 and the first low RI layers may include a material having a refractive index less than about 1.75. In some embodiments, the second high RI layers may include a nitride or an oxynitride material. In some instances, the combined thickness of all the first low RI layers in the optical coating (or in the layers that are disposed on the thickest second high RI layer of the optical coating) may be about 200 nm or less (e.g., about 150 nm or less, about 100 nm or less, about 75 nm or less, or about 50 nm or less).

In some embodiments, the anti-reflective coating 130 exhibits an average light reflectance of about 9% or less, about 8% or less, about 7% or less, about 6% or less, about 5% or less, about 4% or less, about 3% or less, or about 2% or less over the optical wavelength regime, when measured at the anti-reflective surface 122 only (e.g., when removing the reflections from an uncoated back surface (e.g., 114 in FIG. 1) of the article, such as through using index-matching oils on the back surface coupled to an absorber, or other known methods). The average reflectance (which may be a photopic average) may be in the range from about 0.4% to about 9%, from about 0.4% to about 8%, from about 0.4% to about 7%, from about 0.4% to about 6%, or from about 0.4% to about 5% and all ranges therebetween. In some instances, the anti-reflective coating 120 may exhibit such average light reflectance over other wavelength ranges such as from about 450 nm to about 650 nm, from about 420 nm to about 680 nm, from about 420 nm to about 700 nm, from about 420 nm to about 740 nm, from about 420 nm to about 850 nm, or from about 420 nm to about 950 nm. In some embodiments, the anti-reflective surface 122 exhibits an average light transmission of about 90% or greater, 92% or greater, 94% or greater, 96% or greater, or 98% or greater, over the optical wavelength regime. Unless otherwise specified, the average reflectance or transmittance is measured at an incident illumination angle from about 0 degrees to about 10 degrees (however, such measurements may be provided at incident illumination angles of 45 degrees or 60 degrees).

The article 100 may include one or more additional coatings 140 disposed on the anti-reflective coating, as shown in FIG. 6. In one or more embodiments, the additional coating may include an easy-to-clean coating. An example of a suitable an easy-to-clean coating is described in U.S. patent application Ser. No. 13/690,904, entitled "PROCESS FOR MAKING OF GLASS ARTICLES WITH OPTICAL AND EASY-TO-CLEAN COATINGS," filed on Nov. 30, 2012, which is incorporated herein in its entirety by reference. The easy-to-clean coating may have a thickness in the range from about 5 nm to about 50 nm and may include known materials such as fluorinated silanes. The easy-to-clean coating may alternately or additionally comprise a low-friction coating or surface treatment. Exemplary low-friction coating materials may include diamond-like carbon, silanes (e.g. fluorosilanes), phosphonates, alkenes, and alkynes. In some embodiments, the easy-to-clean coating may have a thickness in the range from about 1 nm to about 40 nm, from about 1 nm to about 30 nm, from about 1 nm to about 25 nm, from about 1 nm to about 20 nm, from about 1 nm to about 15 nm, from about 1 nm to about 10 nm, from about 5 nm to about 50 nm, from about 10 nm to about 50 nm, from about 15 nm to about 50 nm, from about 7 nm to about 20 nm, from about 7 nm to about 15 nm, from about 7 nm to about 12 nm or from about 7 nm to about 10 nm, and all ranges and sub-ranges therebetween.

The additional coating 140 may include a scratch resistant layer or layers. In some embodiments, the additional coating 140 includes a combination of easy-to-clean material and scratch resistant material. In one example, the combination includes an easy-to-clean material and diamond-like carbon. Such additional coatings 140 may have a thickness in the range from about 5 nm to about 20 nm. The constituents of the additional coating 140 may be provided in separate layers. For example, the diamond-like carbon may be disposed as a first layer and the easy-to clean can be disposed as a second layer on the first layer of diamond-like carbon. The thicknesses of the first layer and the second layer may be in the ranges provided above for the additional coating. For example, the first layer of diamond-like carbon may have a thickness of about 1 nm to about 20 nm or from about 4 nm to about 15 nm (or more specifically about 10 nm) and the second layer of easy-to-clean may have a thickness of about 1 nm to about 10 nm (or more specifically about 6 nm). The diamond-like coating may include tetrahedral amorphous carbon (Ta—C), Ta—C:H, and/or a-C—H.

Figure 7:
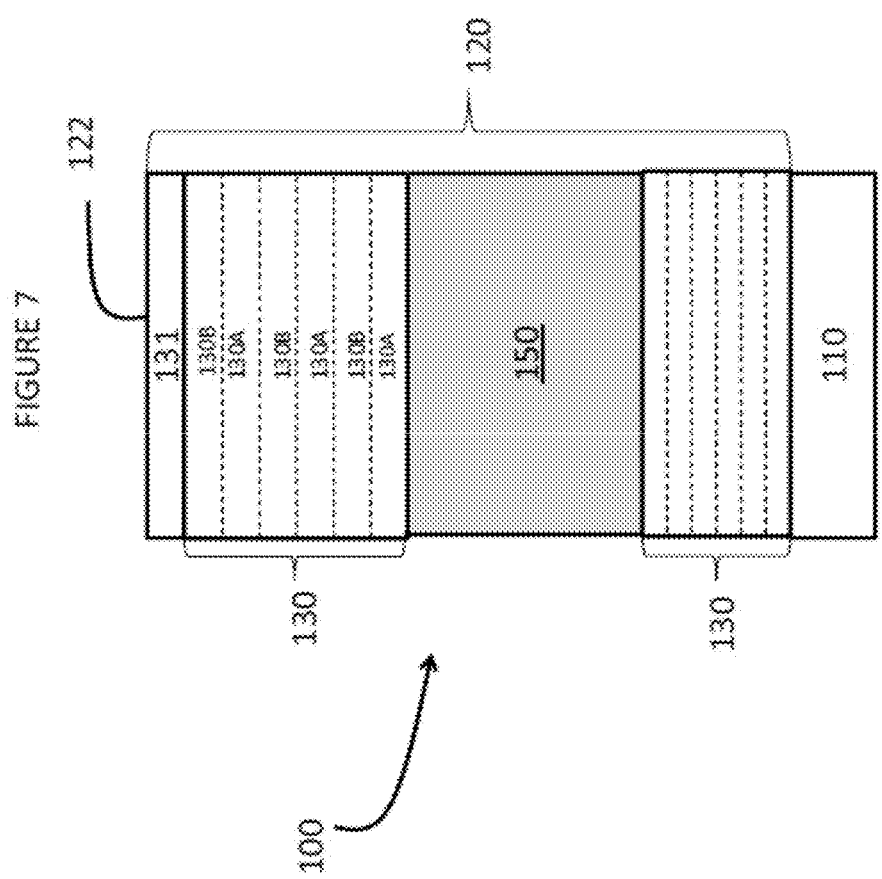
FIG. 7 is a side view of an article, according to one or more embodiments.

As mentioned herein, the optical coating 120 may include a scratch resistant layer 150 or coating (when a plurality of scratch resistant layers are utilized), which may be disposed between the anti-reflective coating 130 and the substrate 110. In some embodiment, the scratch resistant layer 150 or coating is disposed between the layers of the anti-reflective coating 130 (such as 150 as shown in FIG. 7). The two sections of the anti-reflective coating (i.e., a first section disposed between the scratch resistant layer 150 and the substrate 110, and a second section disposed on the scratch resistant layer) may have a different thickness from one another or may have essentially the same thickness as one another. The layers of the two sections of the anti-reflective coating may be the same in composition, order, thickness and/or arrangement as one another or may differ from one another.

Exemplary materials used in the scratch resistant layer 150 or coating (or the scratch-resistant layer/coating used as an additional coating 140) may include an inorganic carbide, nitride, oxide, diamond-like material, or combination of these. Examples of suitable materials for the scratch resistant layer or coating include metal oxides, metal nitrides, metal oxynitride, metal carbides, metal oxycarbides, and/or combinations thereof combination thereof. Exemplary metals include B, Al, Si, Ti, V, Cr, Y, Zr, Nb, Mo, Sn, Hf, Ta and W. Specific examples of materials that may be utilized in the scratch resistant layer or coating may include $Al_2O_3$, AlN, $AlO_xN_y$, $Si_3N_4$, $SiO_xN_y$, $Si_uAl_vO_xN_y$, diamond, diamond-like carbon, $Si_xC_y$, $Si_xO_yC_z$, $ZrO_2$, $TiO_xN_y$ and combinations thereof. The scratch resistant layer or coating may also comprise nanocomposite materials, or materials with a controlled microstructure to improve hardness, toughness, or abrasion/wear resistance. For example the scratch resistant layer or coating may comprise nanocrystallites in the size range from about 5 nm to about 30 nm. In embodiments, the scratch resistant layer or coating may comprise transformation-toughened zirconia, partially stabilized zirconia, or zirconia-toughened alumina. In embodiments, the scratch resistant layer or coating exhibits a fracture toughness value greater than about 1 MPa√m and simultaneously exhibits a hardness value greater than about 8 GPa.

The scratch resistant layer may include a single layer 150 (as shown in FIG. 7), or multiple sub-layers or sub-layers or single layers that exhibit a refractive index gradient. Where multiple layers are used, such layers form a scratch resistant coating. For example, a scratch resistant coating may include a compositional gradient of $Si_uAl_vO_xN_y$ where the concentration of any one or more of Si, Al, O and N are varied to increase or decrease the refractive index. The refractive index gradient may also be formed using porosity. Such gradients are more fully described in U.S. patent application Ser. No. 14/262,224, entitled "Scratch-Resistant Articles with a Gradient Layer", filed on Apr. 28, 2014, which is hereby incorporated by reference in its entirety.

Figure 8:
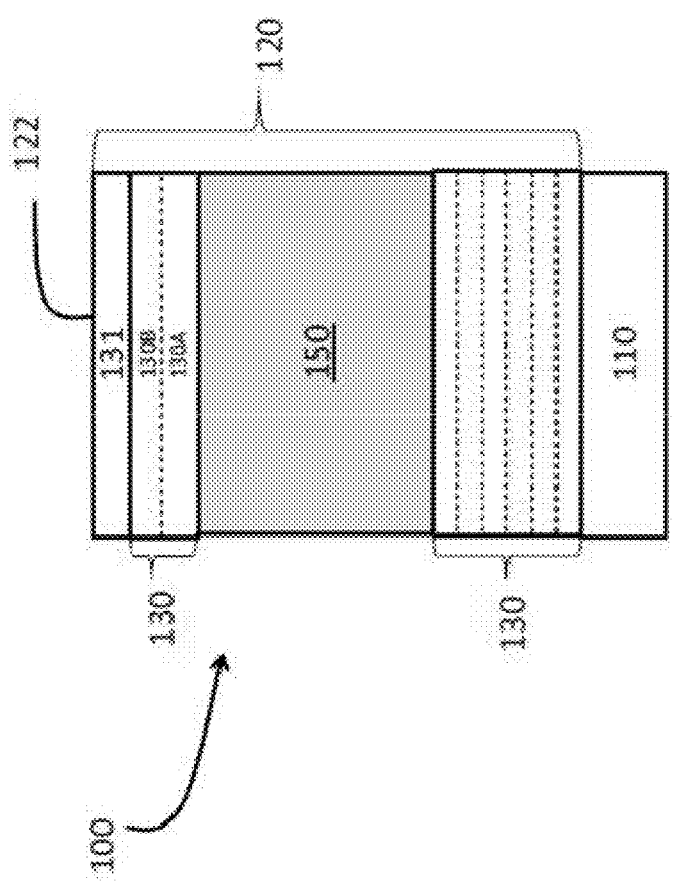
FIG. 8 is a side view of an article, according to one or more embodiments.

In one embodiment, depicted in FIG. 8, the optical coating 120 may comprise a scratch resistant layer 150 that is integrated as a high RI layer, and one or more low RI layers 130A and high RI layers 130B may be positioned over the scratch resistant layer 150, with an optional capping layer 131 positioned over the low RI layers 130A and high RI layers 130B, where the capping layer 131 comprises a low RI material. The scratch resistant layer may be alternately defined as the thickest hard layer or the thickest high RI layer in the overall optical coating or in the overall article. Without being bound by theory, it is believed that the article 100 may exhibit increased hardness at indentation depths when a relatively thin amount of material is deposited over the scratch resistant layer 150. However, the inclusion of low RI and high RI layers over the scratch resistant layer 150 may enhance the optical properties of the article 100. In some embodiments, relatively few layers (e.g., only 1, 2, 3, 4, or 5 layers) may positioned over the scratch resistant layer 150 and these layers may each be relatively thin (e.g. less than 100 nm, less than 75 nm, less than 50 nm, or even less than 25 nm).

In embodiments, the layers deposited over the scratch resistant layer 150 (i.e., on the air side of the scratch resistant layer 150) may have a total thickness (i.e., in combination) of less than or equal to about 1000 nm, less than or equal to about 500 nm, less than or equal to about 450 nm, less than or equal to about 400 nm, less than or equal to about 350 nm, less than or equal to about 300 nm, less than or equal to about 250 nm, less than or equal to about 225 nm, less than or equal to about 200 nm, less than or equal to about 175 nm, less than or equal to about 150 nm, less than or equal to about 125 nm, less than or equal to about 100 nm, less than or equal to about 90 nm, less than or equal to about 80 nm, less than or equal to about 70 nm, less than or equal to about 60 nm, or even less than or equal to about 50 nm.

In embodiments, the total thickness of low RI layer(s) (the sum of thickness of all low RI layers, even if they are not in contact) that are positioned over the scratch resistant layer 150 (i.e., on the air side of the scratch resistant layer 150) may be less than or equal to about 500 nm, less than or equal to about 450 nm, less than or equal to about 400 nm, less than or equal to about 350 nm, less than or equal to about 300 nm, less than or equal to about 250 nm, less than or equal to about 225 nm, less than or equal to about 200 nm, less than or equal to about 175 nm, less than or equal to about 150 nm, less than or equal to about 125 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 20 nm, or even less than or equal to about 10 nm.

In embodiments, the optical coating 120 may comprise, in the uppermost 500 nm of thickness (i.e., on the air side of the optical coating 120), at least about 50%, at least about 55%, at least about 60%, at least about 65%, at least about 70%, at least about 75%, at least about 80%, at least about 85%, at least about 90%, or even at least about 95% of high RI (high hardness) material, when calculated as a thickness percentage or a volume percentage of the uppermost 500 nm of material. For example, when the layers positioned over the scratch resistant layer 150 are relatively thin, the scratch resistant layer 150 which may be made of a hard material may comprise the majority of the uppermost 500 nm of the optical coating 120. In embodiments, the optical coating 120 may comprise, in the uppermost 500 nm of thickness (i.e., on the air side of the optical coating 120), less than about 50%, less than about 45%, less than about 40%, less than about 35%, less than about 30%, less than about 25%, less than about 20%, less than about 15%, less than about 10%, or even less than about 5% of low RI (low hardness) material.

The composition of the scratch resistant layer or coating may be modified to provide specific properties (e.g., hardness). In one or more embodiments, the scratch resistant layer or coating exhibits a maximum hardness in the range from about 5 GPa to about 30 GPa as measured on a major surface of the scratch resistant layer or coating, by the Berkovitch Indenter Hardness Test. In one or more embodiments, the scratch resistant layer or coating exhibits a maximum hardness in the range from about 6 GPa to about 30 GPa, from about 7 GPa to about 30 GPa, from about 8 GPa to about 30 GPa, from about 9 GPa to about 30 GPa, from about 10 GPa to about 30 GPa, from about 12 GPa to about 30 GPa, from about 5 GPa to about 28 GPa, from about 5 GPa to about 26 GPa, from about 5 GPa to about 24 GPa, from about 5 GPa to about 22 GPa, from about 5 GPa to about 20 GPa, from about 12 GPa to about 25 GPa, from about 15 GPa to about 25 GPa, from about 16 GPa to about 24 GPa, from about 18 GPa to about 22 GPa and all ranges and sub-ranges therebetween. In one or more embodiments, the scratch resistant coating may exhibit a maximum hardness that is greater than 15 GPa, greater than 20 GPa, or greater than 25 GPa. In one or more embodiments, the scratch resistant layer exhibits a maximum hardness in the range from about 15 GPa to about 150 GPa, from about 15 GPa to about 100 GPa, or from about 18 GPa to about 100 GPa. Maximum hardness is the highest hardness value measured over a range of indentation depths. Such maximum hardness values are exhibited along an indentation depth of about 50 nm or greater or 100 nm or greater (e.g., from about 100 nm to about 300 nm, from about 100 nm to about 400 nm, from about 100 nm to about 500 nm, from about 100 nm to about 600 nm, from about 200 nm to about 300 nm, from about 200 nm to about 400 nm, from about 200 nm to about 500 nm, or from about 200 nm to about 600 nm).

In embodiments, the article 100 comprises a hardness profile, which may be defined by the nanohardness of the article at a combination of indentation depths. For example, the article may exhibit a hardness profile where the article 100 has a nanohardness of greater than a specified value at about a 100 nm indentation depth and/or a nanohardness of greater than another specified value at about a 300 nm indentation depth and/or a nanohardness of greater than another specified value at about a 500 nm indentation depth and/or a nanohardness of greater than another specified value at about a 700 nm indentation depth. For example two or more indentations depths may be selected to establish a hardness profile. Having high hardness that extends out to deeper indentation depths helps protect against more severe scratch events responsible for more visible scratches. Maintaining higher hardness at shallower indentation depths helps to protect against less severe scratch events. Accordingly, it is desirable to have a hardness profile wherein the hardness quickly increases at shallow indentation depths (for example, from the surface up to 100 nm), and is maintained as deep as possible, for example at depths from 100 nm up to about 700 or 800 nm, as measured from the surface. In embodiments, the article 100 may comprise a hardness of at least about 5 GPa, at least about 6 GPa, at least about at least about 7 GPa, at least about 8 GPa, at least about 9 GPa, at least about 10 GPa, at least about 11 GPa, at least about 12 GPa, at least about 13 GPa, at least about 14 GPa, at least about 15 GPa, at least about 16 GPa, at least about 17 GPa, at least about 18 GPa, at least about 19 GPa, at least about 20 GPa, at least about 22 GPa, or even at least about 25 GPa at an indentation depth of 100 nm; may also comprise a harness of at least about 5 GPa, at least about 6 GPa, at least about at least about 7 GPa, at least about 8 GPa, at least about 9 GPa, at least about 10 GPa, at least about 11 GPa, at least about 12 GPa, at least about 13 GPa, at least about 14 GPa, at least about 15 GPa, at least about 16 GPa, at least about 17 GPa, at least about 18 GPa, at least about 19 GPa, at least about 20 GPa, at least about 22 GPa, or even at least about 25 GPa at an indentation depth of 300 nm; may comprise a hardness of at least about 5 GPa, at least about 6 GPa, at least about at least about 7 GPa, at least about 8 GPa, at least about 9 GPa, at least about 10 GPa, at least about 11 GPa, at least about 12 GPa, at least about 13 GPa, at least about 14 GPa, at least about 15 GPa, at least about 16 GPa, at least about 17 GPa, at least about 18 GPa, at least about 19 GPa, at least about 20 GPa, at least about 22 GPa, or even at least about 25 GPa at an indentation depth of 500 nm; and/or may comprise a hardness of at least about 5 GPa, at least about 6 GPa, at least about at least about 7 GPa, at least about 8 GPa, at least about 9 GPa, at least about 10 GPa, at least about 11 GPa, at least about 12 GPa, at least about 13 GPa, at least about 14 GPa, at least about 15 GPa, at least about 16 GPa, at least about 17 GPa, at least about 18 GPa, at least about 19 GPa, at least about 20 GPa, at least about 22 GPa, or even at least about 25 GPa at an indentation depth of 700 nm. For example, embodiments described herein may have a hardness of at least about 12 GPa at a 100 nm indentation depth, a hardness of at least about 15 GPa at a 300 nm indentation depth, a hardness of at least about 15 GPa at a 500 nm indentation depth, and a hardness of at least about 15 GPa at a 700 nm indentation depth.

The physical thickness of the scratch resistant coating or layer may be in the range from about 1 nm to about 5 μm. In some embodiments, the physical thickness of the scratch resistant coating may be in the range from about 1 nm to about 3 μm, from about 1 nm to about 2.5 μm, from about 1 nm to about 2 μm, from about 1 nm to about 1.5 μm, from about 1 nm to about 1 μm, from about 1 nm to about 0.5 μm, from about 1 nm to about 0.2 μm, from about 1 nm to about 0.1 μm, from about 1 nm to about 0.05 μm, from about 5 nm to about 0.05 μm, from about 10 nm to about 0.05 μm, from about 15 nm to about 0.05 μm, from about 20 nm to about 0.05 μm, from about 5 nm to about 0.05 μm, from about 200 nm to about 3 μm, from about 400 nm to about 3 μm, from about 800 nm to about 3 μm, and all ranges and sub-ranges therebetween. In some embodiments, the physical thickness of the scratch resistant coating may be in the range from about 1 nm to about 25 nm. In some instances, the scratch-resistant layer may include a nitride or an oxy-nitride material and may have a thickness of about 200 nm or greater, 500 nm or greater or about 1000 nm or greater.

The article of one or more embodiments may be described as abrasion resistant as measured by various methods, after being abraded on the anti-reflective surface 122 according to a Taber Test after at least about 500 cycles. Various forms of abrasion test are known in the art, such as the test method specified in ASTM D1044-99, using abrasive media supplied by Taber Industries. Modified abrasion methods related to ASTM D1044-99 can be created using different types of abrading media, abradant geometry and motion, pressure, etc. in order to provide repeatable and measurable abrasion or wear tracks to meaningfully differentiate the abrasion resistance of different samples. For example, different test conditions will usually be appropriate for soft plastics vs. hard inorganic test samples. The embodiments described herein were subjected to a Taber Test, as defined herein, which is a specific modified version of ASTM D1044-99 that gives clear and repeatable differentiation of durability between different samples which comprise primarily hard inorganic materials, such as oxide glasses and oxide or nitride coatings. As used herein, the phrase "Taber Test" refers to a test method using a Taber Linear Abraser 5750 (TLA 5750) and accessories supplied by Taber Industries, in an environment including a temperature of about 22° C.±3° C. and Relative Humidity of up to about 70%. The TLA 5750 includes a CS-17 abraser material having a 6.7 mm diameter abraser head. Each sample was abraded according to the Taber Test and the abrasive damage was evaluated using both Haze and Bidirectional Transmittance Distribution Function (CCBTDF) measurements, among other methods. In the Taber Test, the procedure for abrading each sample includes placing the TLA 5750 and a flat sample support on a rigid, flat surface and securing the TLA 5750 and the sample support to the surface. Before each sample is abraded under the Taber Test, the abraser is refaced using a new S-14 refacing strip adhered to glass. The abraser is subjected to 10 refacing cycles using a cycle speed of 25 cycles/minute and stroke length of 1 inch, with no additional weight added (i.e., a total weight of about 350 g is used during refacing, which is the combined weight of the spindle and collet holding the abraser). The procedure then includes operating the TLA 5750 to abrade the sample, where the sample is placed in the sample support in contact with the abraser head and supporting the weight applied to the abraser head, using a cycle speed of 25 cycles/minute, and a stroke length of 1 inch, and a weight such that the total weight applied to the sample is 850 g (i.e., a 500 g auxiliary weight is applied in addition to the 350 g combined weight of the spindle and collet). The procedure includes forming two wear tracks on each sample for repeatability, and abrading each sample for 500 cycle counts in each of the two wear tracks on each sample.

In one or more embodiments, the anti-reflective surface 122 of the article 100 is abraded according to the above Taber Test and the article exhibits a haze of about 10% of less, as measured on the abraded side using a hazemeter supplied by BYK Gardner under the trademark Haze-Gard Plus®, using an aperture over the source port, the aperture having a diameter of 8 mm.

The article 100 of one or more embodiments exhibits such abrasion resistance with and without any additional coatings (including the additional coating 140, which will be described herein). In some embodiments, the haze may be about 9% or less, about 8% or less, about 7% or less, about 6% or less, about 5% or less, about 4% or less, about 3% or less, about 2% or less, about 1% or less, about 0.5% or less or about 0.3% or less. In some specific embodiments, the article 100 exhibits a haze in the range from about 0.1% to about 10%, from about 0.1% to about 9%, from about 0.1% to about 8%, from about 0.1% to about 7%, from about 0.1% to about 6%, from about 0.1% to about 5%, from about 0.1% to about 4%, from about 0.1% to about 3%, from about 0.1% to about 2%, from about 0.1% to about 1%, 0.3% to about 10%, from about 0.5% to about 10%, from about 1% to about 10%, from about 2% to about 10%, from about 3% to about 10%, from about 4% to about 10%, from about 5% to about 10%, from about 6% to about 10%, from about 7% to about 10%, from about 1% to about 8%, from about 2% to about 6%, from about 3% to about 5%, and all ranges and sub-ranges therebetween.

Alternate methods for quantifying the abrasion resistance are also contemplated here. In one or more embodiments, article 100 abraded by the Taber Test on the anti-reflective surface 122 may exhibit an abrasion resistance as measured by atomic force microscopy (AFM) surface profiling, which may be carried out for example over an 80×80 micron area, or multiple 80×80 micron areas (to sample a larger portion of the abraded area) of the anti-reflective surface 122. From these AFM surface scans, surface roughness statistics such as RMS roughness, Ra roughness, and peak-to-valley surface height may be evaluated. In one or more embodiments, the article 100 (or specifically, the anti-reflective surface 122) may exhibit average surface roughness (Ra) values of about 50 nm or less, about 25 nm or less, about 12 nm or less, about 10 nm or less, or about 5 nm or less, after being abraded under the Taber Test described above.

In one or more embodiments, the article 100 may exhibit an abrasion resistance, after the anti-reflective surface 122 is abraded by the Taber Test as measured by a light scattering measurement. In one or more embodiments, the light scattering measurement includes a bi-directional reflectance distribution function (BRDF) or bi-directional transmittance distribution function (BTDF) measurement carried out using a Radiant Zemax IS-SA™ instrument. This instrument has the flexibility to measure light scattering using any input angle from normal to about 85 degrees incidence in reflection, and from normal to about 85 degrees incidence in transmission, while also capturing all scattered light output in either reflection or transmission into 2*Pi steradians (a full hemisphere in reflection or transmission). In one embodiment, the article 100 exhibits an abrasion resistance, as measured using BTDF at normal incidence and analyzing the transmitted scattered light at a selected angular range, for example from about 10° to about 80° degrees in polar angles and any angular range therein. The full azimuthal range of angles can be analyzed and integrated, or particular azimuthal angular slices can be selected, for example from about 0° and 90° azimuthally. In the case of linear abrasion, it may be desired to choose an azimuthal direction that is substantially orthogonal to the abrasion direction so as to increase signal-to-noise of the optical scattering measurement. In one or more embodiments, the article 100 may exhibit a scattered light intensity as measured at the anti-reflective coating 120, of about less than about 0.1, about 0.05 or less, about 0.03 or less, about 0.02 or less, about 0.01 or less, about 0.005 or less, or about 0.003 or less (in units of 1/steradian), when using the Radiant Zemax IS-SA tool in CCBTDF mode at normal incidence in transmission, with a 2 mm aperture and a monochrometer set to 600 nm wavelength, and when evaluated at polar scattering angles in the range from about 15° to about 60° (e.g. specifically, about 20° or about 40°). Normal incidence in transmission may be otherwise known as zero degrees in transmission, which may be denoted as 180° incidence by the instrument software. In one or more embodiments, the scattered light intensity may be measured along an azimuthal direction substantially orthogonal to the abraded direction of a sample abraded by the Taber Test. In one example, the Taber Test may use from about 10 cycles to about 1000 cycles, and all values in between. These optical intensity values may also correspond to less than about 1%, less than about 0.5%, less than about 0.2%, or less than about 0.1% of the input light intensity that is scattered into polar scattering angles greater than about 5 degrees, greater than about 10 degrees, greater than about 30 degrees, or greater than about 45 degrees.

Generally speaking, BTDF testing at normal incidence, as described herein, is closely related to the transmission haze measurement, in that both are measuring the amount of light that is scattered in transmission through a sample (or, in this case the article 100, after abrading the anti-reflective coating 120). BTDF measurements provide more sensitivity as well as more detailed angular information, compared to haze measurements. BTDF allows measurement of scattering into different polar and azimuthal angles, for example allowing us to selectively evaluate the scattering into azimuthal angles that are substantially orthogonal to the abrasion direction in the linear Taber test (these are the angles where light scattering from linear abrasion is the highest). Transmission haze is essentially the integration of all scattered light measured by normal incidence BTDF into the entire hemisphere of polar angles greater than about +/−2.5 degrees.

The optical coating 120 and the article 100 may be described in terms of a hardness measured by a Berkovich Indenter Hardness Test. As used herein, the "Berkovich Indenter Hardness Test" includes measuring the hardness of a material on a surface thereof by indenting the surface with a diamond Berkovich indenter. The Berkovich Indenter Hardness Test includes indenting the anti-reflective surface 122 of the article or the surface of the optical coating 120 (or the surface of any one or more of the layers in the anti-reflective coating) with the diamond Berkovich indenter to form an indent to an indentation depth in the range from about 50 nm to about 1000 nm (or the entire thickness of the anti-reflective coating or layer, whichever is less) and measuring the maximum hardness from this indentation along the entire indentation depth range or a segment of this indentation depth (e.g., in the range from about 100 nm to about 600 nm), generally using the methods set forth in Oliver, W. C.; Pharr, G. M. An improved technique for determining hardness and elastic modulus using load and displacement sensing indentation experiments. *J. Mater. Res.*, Vol. 7, No. 6, 1992, 1564-1583; and Oliver, W. C.; Pharr, G. M. Measurement of Hardness and Elastic Modulus by Instrument Indentation: Advances in Understanding and Refinements to Methodology. *J. Mater. Res.*, Vol. 19, No. 1, 2004, 3-20. As used herein, hardness refers to a maximum hardness, and not an average hardness.

Typically, in nanoindentation measurement methods (such as by using a Berkovich indenter) of a coating that is harder than the underlying substrate, the measured hardness may appear to increase initially due to development of the plastic zone at shallow indentation depths and then increases and reaches a maximum value or plateau at deeper indentation depths. Thereafter, hardness begins to decrease at even deeper indentation depths due to the effect of the underlying substrate. Where a substrate having an increased hardness compared to the coating is utilized, the same effect can be seen; however, the hardness increases at deeper indentation depths due to the effect of the underlying substrate.

The indentation depth range and the hardness values at certain indentation depth range(s) can be selected to identify a particular hardness response of the optical film structures and layers thereof, described herein, without the effect of the underlying substrate. When measuring hardness of the optical film structure (when disposed on a substrate) with a Berkovich indenter, the region of permanent deformation (plastic zone) of a material is associated with the hardness of the material. During indentation, an elastic stress field extends well beyond this region of permanent deformation. As indentation depth increases, the apparent hardness and modulus are influenced by stress field interactions with the underlying substrate. The substrate influence on hardness occurs at deeper indentation depths (i.e., typically at depths greater than about 10% of the optical film structure or layer thickness). Moreover, a further complication is that the hardness response requires a certain minimum load to develop full plasticity during the indentation process. Prior to that certain minimum load, the hardness shows a generally increasing trend.

At small indentation depths (which also may be characterized as small loads) (e.g., up to about 50 nm), the apparent hardness of a material appears to increase dramatically versus indentation depth. This small indentation depth regime does not represent a true metric of hardness but instead, reflects the development of the aforementioned plastic zone, which is related to the finite radius of curvature of the indenter. At intermediate indentation depths, the apparent hardness approaches maximum levels. At deeper indentation depths, the influence of the substrate becomes more pronounced as the indentation depths increase. Hardness may begin to drop dramatically once the indentation depth exceeds about 30% of the optical film structure thickness or the layer thickness.

Figure 9:
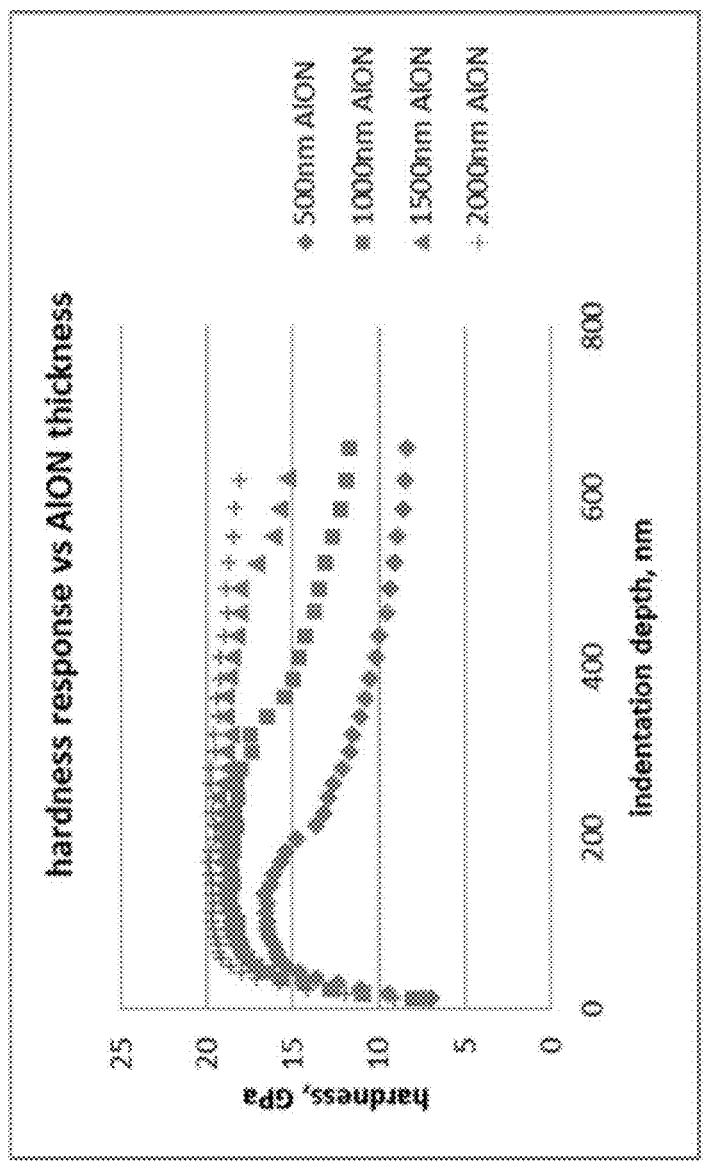
FIG. 9 is a graph illustrating the hardness measurements as a function of indentation depth and coating thickness.

FIG. 9 illustrates the changes in measured hardness value as a function of indentation depth and thickness of a coating. As shown in FIG. 9, the hardness measured at intermediate indentation depths (at which hardness approaches and is maintained at maximum levels) and at deeper indentation depths depends on the thickness of a material or layer. FIG. 9 illustrates the hardness response of four different layers of $AlO_xN_y$, having different thicknesses. The hardness of each layer was measured using the Berkovich Indenter Hardness Test. The 500 nm-thick layer exhibited its maximum hardness at indentation depths from about 100 nm to 180 nm, followed by a dramatic decrease in hardness at indentation depths from about 180 nm to about 200 nm, indicating the hardness of the substrate influencing the hardness measurement. The 1000 nm-thick layer exhibited a maximum hardness at indentation depths from about 100 nm to about 300 nm, followed by a dramatic decrease in hardness at indentation depths greater than about 300 nm. The 1500 nm-thick layer exhibited a maximum hardness at indentation depths from about 100 nm to about 550 nm and the 2000-nm thick layer exhibited a maximum hardness at indentation depths from about 100 nm to about 600 nm. Although FIG. 9 illustrates a thick single layer, the same behavior is observed in thinner coatings and those including multiple layers such as the anti-reflective coating 120 of the embodiments described herein.

In some embodiments, the optical 120 may exhibit a hardness of about 8 GPa or greater, about 10 GPa or greater or about 12 GPa or greater (e.g., 14 GPa or greater, 16 GPa or greater, 18 GPa or greater, 20 GPa or greater). The hardness of the optical coating 120 may be up to about 20 GPa or 30 GPa. The article 100, including the anti-reflective coating 120 and any additional coatings, as described herein, exhibit a hardness of about 5 GPa or greater, about 8 GPa or greater, about 10 GPa or greater or about 12 GPa or greater (e.g., 14 GPa or greater, 16 GPa or greater, 18 GPa or greater, 20 GPa or greater), as measured on the anti-reflective surface 122, by a Berkovitch Indenter Hardness Test. The hardness of the optical 120 may be up to about 20 GPa or 30 GPa. Such measured hardness values may be exhibited by the optical coating 120 and/or the article 100 along an indentation depth of about 50 nm or greater or about 100 nm or greater (e.g., from about 100 nm to about 300 nm, from about 100 nm to about 400 nm, from about 100 nm to about 500 nm, from about 100 nm to about 600 nm, from about 200 nm to about 300 nm, from about 200 nm to about 400 nm, from about 200 nm to about 500 nm, or from about 200 nm to about 600 nm). In one or more embodiments, the article exhibits a hardness that is greater than the hardness of the substrate (which can be measured on the opposite surface from the anti-reflective surface).

The optical coating 120 may have at least one layer having a hardness (as measured on the surface of such layer, e.g., surface of the second high RI layer 130B of FIG. 2 or the surface of the scratch resistant layer) of about 12 GPa or greater, about 13 GPa or greater, about 14 GPa or greater, about 15 GPa or greater, about 16 GPa or greater, about 17 GPa or greater, about 18 GPa or greater, about 19 GPa or greater, about 20 GPa or greater, about 22 GPa or greater, about 23 GPa or greater, about 24 GPa or greater, about 25 GPa or greater, about 26 GPa or greater, or about 27 GPa or greater (up to about 50 GPa), as measured by the Berkovich Indenter Hardness Test. The hardness of such layer may be in the range from about 18 GPa to about 21 GPa, as measured by the Berkovich Indenter Hardness Test. Such measured hardness values may be exhibited by the at least one layer along an indentation depth of about 50 nm or greater or 100 nm or greater (e.g., from about 100 nm to about 300 nm, from about 100 nm to about 400 nm, from about 100 nm to about 500 nm, from about 100 nm to about 600 nm, from about 200 nm to about 300 nm, from about 200 nm to about 400 nm, from about 200 nm to about 500 nm, or from about 200 nm to about 600 nm).

In one or more embodiments, the optical coating 120 or individual layers within the optical coating may exhibit an elastic modulus of about 75 GPa or greater, about 80 GPa or greater or about 85 GPa or greater, as measured on the anti-reflective surface 122, by indenting that surface with a Berkovitch indenter. These modulus values may represent a modulus measured very close to the anti-reflective surface, e.g. at indentation depths of 0 nm to about 50 nm, or it may represent a modulus measured at deeper indentation depths, e.g. from about 50 nm to about 1000 nm.

In embodiments of the article which include a scratch-resistant layer (when used as part of the anti-reflective coating, e.g., 150 of FIG. 7) or scratch resistant coating (when used as an additional coating 140), the article may exhibit a maximum hardness in the range from about 12 GPa to about 25 GPa, as measured by the Berkovich Indenter Hardness Test on the anti-reflective surface 122, or the surface of the scratch resistant coating, respectively. Such measured hardness values may be exhibited along an indentation depth of about 50 nm or greater or 100 nm or greater (e.g., from about 100 nm to about 300 nm, from about 100 nm to about 400 nm, from about 100 nm to about 500 nm, from about 100 nm to about 600 nm, from about 200 nm to about 300 nm, from about 200 nm to about 400 nm, from about 200 nm to about 500 nm, or from about 200 nm to about 600 nm). This hardness may be exhibited even when the scratch resistant layer is not disposed at or near the anti-reflective surface 122 (e.g., as shown in FIGS. 7 and 8).

Optical interference between reflected waves from the optical coating 120/air interface and the optical coating 120/substrate 110 interface can lead to spectral reflectance and/or transmittance oscillations that create apparent color in the article 100. As used herein, the term "transmittance" is defined as the percentage of incident optical power within a given wavelength range transmitted through a material (e.g., the article, the substrate or the optical film or portions thereof). The term "reflectance" is similarly defined as the percentage of incident optical power within a given wavelength range that is reflected from a material (e.g., the article, the substrate, or the optical film or portions thereof). Transmittance and reflectance are measured using a specific linewidth. In one or more embodiments, the spectral resolution of the characterization of the transmittance and reflectance is less than 5 nm or 0.02 eV. The color may be more pronounced in reflection. The angular color shifts in reflection with viewing angle due to a shift in the spectral reflectance oscillations with incident illumination angle. Angular color shifts in transmittance with viewing angle are also due to the same shift in the spectral transmittance oscillation with incident illumination angle. The observed color and angular color shifts with incident illumination angle are often distracting or objectionable to device users, particularly under illumination with sharp spectral features such as fluorescent lighting and some LED lighting. Angular color shifts in transmission may also play a factor in color shift in reflection and vice versa. Factors in angular color shifts in transmission and/or reflection may also include angular color shifts due to viewing angle or angular color shifts away from a certain white point that may be caused by material absorption (somewhat independent of angle) defined by a particular illuminant or test system.

The oscillations may be described in terms of amplitude. As used herein, the term "amplitude" includes the peak-to-valley change in reflectance or transmittance. The phrase "average amplitude" includes the peak-to-valley change in reflectance or transmittance averaged over several oscillation cycles or wavelength sub-ranges within the optical wavelength regime. As used herein, the "optical wavelength regime" includes the wavelength range from about 400 nm to about 800 nm (and more specifically from about 450 nm to about 650 nm).

The embodiments of this disclosure include an anti-reflective coating to provide improved optical performance, in terms of colorlessness and/or smaller angular color shifts with viewed at varying incident illumination angles from normal incidence under different illuminants.

One aspect of this disclosure pertains to an article that exhibits colorlessness in reflectance and/or transmittance even when viewed at different incident illumination angles under an illuminant. In one or more embodiments, the article exhibits an angular color shift in reflectance and/or transmittance of about 5 or less or about 2 or less between a reference illumination angle and any incidental illumination angles in the ranges provided herein. As used herein, the phrase "color shift" (angular or reference point) refers to the change in both a* and b*, under the CIE L*, a*, b* colorimetry system in reflectance and/or transmittance. It should be understood that unless otherwise noted, the L* coordinate of the articles described herein are the same at any angle or reference point and do not influence color shift. For example, angular color shift may be determined using the following Equation (1):

$$\sqrt{((a^*_2 - a^*_1)^2 + (b^*_2 - b^*_1)^2)}, \quad (1)$$

with $a^*_1$, and $b^*_1$ representing the a* and b* coordinates of the article when viewed at incidence reference illumination angle (which may include normal incidence) and $a^*_2$, and $b^*_2$ representing the a* and b* coordinates of the article when viewed at an incident illumination angle, provided that the incident illumination angle is different from the reference illumination angle and in some cases differs from the reference illumination angle by at least about 1 degree, 2 degrees or about 5 degrees. In some instances, an angular color shift in reflectance and/or transmittance of about 10 or less (e.g., 5 or less, 4 or less, 3 or less, or 2 or less) is exhibited by the article when viewed at various incident illumination angles from a reference illumination angle, under an illuminant. In some instances the angular color shift in reflectance and/or transmittance is about 1.9 or less, 1.8 or less, 1.7 or less, 1.6 or less, 1.5 or less, 1.4 or less, 1.3 or less, 1.2 or less, 1.1 or less, 1 or less, 0.9 or less, 0.8 or less, 0.7 or less, 0.6 or less, 0.5 or less, 0.4 or less, 0.3 or less, 0.2 or less, or 0.1 or less. In some embodiments, the angular color shift may be about 0. The illuminant can include standard illuminants as determined by the CIE, including A illuminants (representing tungsten-filament lighting), B illuminants (daylight simulating illuminants), C illuminants (daylight simulating illuminants), D series illuminants (representing natural daylight), and F series illuminants (representing various types of fluorescent lighting). In specific examples, the articles exhibit an angular color shift in reflectance and/or transmittance of about 2 or less when viewed at incident illumination angle from the reference illumination angle under a CIE F2, F10, F11, F12 or D65 illuminant, or more specifically, under a CIE F2 illuminant.

The reference illumination angle may include normal incidence (i.e., from about 0 degrees to about 10 degrees), or 5 degrees from normal incidence, 10 degrees from normal incidence, 15 degrees from normal incidence, 20 degrees from normal incidence, 25 degrees from normal incidence, 30 degrees from normal incidence, 35 degrees from normal incidence, 40 degrees from normal incidence, 50 degrees from normal incidence, 55 degrees from normal incidence, or 60 degrees from normal incidence, provided the difference between the reference illumination angle and the difference between the incident illumination angle and the reference illumination angle is at least about 1 degree, 2 degrees or about 5 degrees. The incident illumination angle may be, with respect to the reference illumination angle, in the range from about 5 degrees to about 80 degrees, from about 5 degrees to about 70 degrees, from about 5 degrees to about 65 degrees, from about 5 degrees to about 60 degrees, from about 5 degrees to about 55 degrees, from about 5 degrees to about 50 degrees, from about 5 degrees to about 45 degrees, from about 5 degrees to about 40 degrees, from about 5 degrees to about 35 degrees, from about 5 degrees to about 30 degrees, from about 5 degrees to about 25 degrees, from about 5 degrees to about 20 degrees, from about 5 degrees to about 15 degrees, and all ranges and sub-ranges therebetween, away from the reference illumination angle. The article may exhibit the angular color shifts in reflectance and/or transmittance described herein at and along all the incident illumination angles in the range from about 2 degrees to about 80 degrees (or from about 10 degrees to about 80 degrees, or from about 20 degrees to about 80 degrees), when the reference illumination angle is normal incidence. In some embodiments, the article may exhibit the angular color shifts in reflectance and/or transmittance described herein at and along all the incident illumination angles in the range from about 2 degrees to about 80 degrees (or from about 10 degrees to about 80 degrees, or from about 20 degrees to about 80 degrees), when the difference between the incident illumination angle and the reference illumination angle is at least about 1 degree, 2 degrees or about 5 degrees. In one example, the article may exhibit an angular color shift in reflectance and/or transmittance of 5 or less (e.g., 4 or less, 3 or less or about 2 or less) at any incident illumination angle in the range from about 2 degrees to about 60 degrees, from about 5 degrees to about 60 degrees, or from about 10 degrees to about 60 degrees away from a reference illumination angle equal to normal incidence. In other examples, the article may exhibit an angular color shift in reflectance and/or transmittance of 5 or less (e.g., 4 or less, 3 or less or about 2 or less) when the reference illumination angle is 10 degrees and the incident illumination angle is any angle in the range from about 12 degrees to about 60 degrees, from about 15 degrees to about 60 degrees, or from about 20 degrees to about 60 degrees away from the reference illumination angle.

In some embodiments, the angular color shift may be measured at all angles between a reference illumination angle (e.g., normal incidence) and an incident illumination angle in the range from about 20 degrees to about 80 degrees. In other words, the angular color shift may be measured and may be less than about 5 or less than about 2, at all angles in the range from about 0 degrees and 20 degrees, from about 0 degrees to about 30 degrees, from about 0 degrees to about 40 degrees, from about 0 degrees to about 50 degrees, from about 0 degrees to about 60 degrees or from about 0 degrees to about 80 degrees.

In one or more embodiments, the article exhibits a color in the CIE L*, a*, b* colorimetry system in reflectance and/or transmittance such that the distance or reference point color shift between the transmittance color or reflectance coordinates from a reference point is less than about 5 or less than about 2 under an illuminant (which can include standard illuminants as determined by the CIE, including A illuminants (representing tungsten-filament lighting), B illuminants (daylight simulating illuminants), C illuminants (daylight simulating illuminants), D series illuminants (representing natural daylight), and F series illuminants (representing various types of fluorescent lighting)). In specific examples, the articles exhibit a color shift in reflectance and/or transmittance of about 2 or less when viewed at incident illumination angle from the reference illumination angle under a CIE F2, F10, F11, F12 or D65 illuminant or more specifically under a CIE F2 illuminant. Stated another way, the article may exhibit a transmittance color (or transmittance color coordinates) and/or a reflectance color (or reflectance color coordinates) measured at the anti-reflective surface 122 having a reference point color shift of less than about 2 from a reference point, as defined herein. Unless otherwise noted, the transmittance color or transmittance color coordinates are measured on two surfaces of the article including at the anti-reflective surface 122 and the opposite bare surface of the article (i.e., 114). Unless otherwise noted, the reflectance color or reflectance color coordinates are measured on only the anti-reflective surface 122 of the article. However, the reflectance color or reflectance color coordinates described herein can be measured on both the anti-reflective surface 122 of the article and the opposite side of the article (i.e., major surface 114 in FIG. 1) using either a 2-surface measurement (reflections from two sides of an article are both included) or a 1-surface measurement (reflection only from the anti-reflective surface 122 of the article is measured). Of these, the 1-surface reflectance measurement is typically the more challenging metric to achieve low color or low-color shift values for anti-reflective coatings, and this has relevance to applications (such as smartphones, etc.) where the back surface of the article is bonded to a light absorbing medium such as black ink or an LCD or OLED device).

In one or more embodiments, the reference point may be the origin (0, 0) in the CIE L*, a*, b* colorimetry system (or the color coordinates a*=0, b*=0), the coordinates (a*=−2, b*=−2), or the transmittance or reflectance color coordinates of the substrate. It should be understood that unless otherwise noted, the L* coordinate of the articles described herein are the same as the reference point and do not influence color shift. Where the reference point color shift of the article is defined with respect to the substrate, the transmittance color coordinates of the article are compared to the transmittance color coordinates of the substrate and the reflectance color coordinates of the article are compared to the reflectance color coordinates of the substrate.

In one or more specific embodiments, the reference point color shift of the transmittance color and/or the reflectance color may be less than 1 or even less than 0.5. In one or more specific embodiments, the reference point color shift for the transmittance color and/or the reflectance color may be 1.8, 1.6, 1.4, 1.2, 0.8, 0.6, 0.4, 0.2, 0 and all ranges and sub-ranges therebetween. Where the reference point is the color coordinates a*=0, b*=0, the reference point color shift is calculated by Equation (2).

$$\text{reference point color shift} = \sqrt{((a^*_{article})^2 + (b^*_{article})^2)} \quad (2)$$

Where the reference point is the color coordinates a*=−2, b*=−2, the reference point color shift is calculated by Equation (3).

$$\text{reference point color shift} = \sqrt{((a^*_{article}+2)^2 + (b^*_{article}+2)^2)} \quad (3)$$

Where the reference point is the color coordinates of the substrate, the reference point color shift is calculated by Equation (4).

$$\text{reference point color shift} = \sqrt{((a^*_{article}-a^*_{substrate})^2 + (b^*_{article}-b^*_{substrate})^2)} \quad (4)$$

In some embodiments, the article may exhibit a transmittance color (or transmittance color coordinates) and a reflectance color (or reflectance color coordinates) such that the reference point color shift is less than 2 when the reference point is any one of the color coordinates of the substrate, the color coordinates a*=0, b*=0 and the coordinates a*=−2, b*=−2.

In one or more embodiment, the article may exhibit a b* value in reflectance (as measured at the anti-reflective surface only) in the range from about −5 to about 1, from about −5 to about 0, from about −4 to about 1, or from about −4 to about 0, in the CIE L*, a*, b* colorimetry system at all incidence illumination angles in the range from about 0 to about 60 degrees (or from about 0 degrees to about 40 degrees or from about 0 degrees to about 30 degrees).

In one or more embodiment, the article may exhibit a b* value in transmittance (as measured at the anti-reflective surface and the opposite bare surface of the article) of less than about 2 (or about 1.8 or less, about 1.6 or less, 1.5 or less, 1.4 or less, 1.2 or less, or about 1 or less) in the CIE L*, a*, b* colorimetry system at all incidence illumination angles in the range from about 0 to about 60 degrees (or from about 0 degrees to about 40 degrees or from about 0 degrees to about 30 degrees). The lower limit of the b* value in transmittance may be about −5.

In some embodiments, the article exhibits an a* value in transmittance (at the anti-reflective surface and the opposite bare surface) in the range from about −1.5 to about 1.5 (e.g., −1.5 to −1.2, −1.5 to −1, −1.2 to 1.2, −1 to 1, −1 to 0.5, or −1 to 0) at incident illumination angles in the range from about 0 degrees to about 60 degrees under illuminants D65, A, and F2. In some embodiments, the article exhibits a b* value in transmittance (at the anti-reflective surface and the opposite bare surface) in the range from about −1.5 to about 1.5 (e.g., −1.5 to −1.2, −1.5 to −1, −1.2 to 1.2, −1 to 1, −1 to 0.5, or −1 to 0) at incident illumination angles in the range from about 0 degrees to about 60 degrees under illuminants D65, A, and F2.

In some embodiments, the article exhibits an a* value in reflectance (at only the anti-reflective surface) in the range from about −5 to about 2 (e.g., −4.5 to 1.5, −3 to 0, −2.5 to 0.25) at incident illumination angles in the range from about 0 degrees to about 60 degrees under illuminants D65, A, and F2. In some embodiments, the article exhibits a b* value in reflectance (at only the anti-reflective surface) in the range from about −7 to about 0 at incident illumination angles in the range from about 0 degrees to about 60 degrees under illuminants D65, A, and F2.

The article of one or more embodiments, or the anti-reflective surface 122 of one or more articles, may exhibit an average light transmittance of about 95% or greater (e.g., about 9.5% or greater, about 96% or greater, about 96.5% or greater, about 97% or greater, about 97.5% or greater, about 98% or greater, about 98.5% or greater or about 99% or greater) over the optical wavelength regime in the range from about 400 nm to about 800 nm. In some embodiments, the article, or the anti-reflective surface 122 of one or more articles, may exhibit an average light reflectance of about 2% or less (e.g., about 1.5% or less, about 1% or less, about 0.75% or less, about 0.5% or less, or about 0.25% or less) over the optical wavelength regime in the range from about 400 nm to about 800 nm. These light transmittance and light reflectance values may be observed over the entire optical wavelength regime or over selected ranges of the optical wavelength regime (e.g., a 100 nm wavelength range, 150 nm wavelength range, a 200 nm wavelength range, a 250 nm wavelength range, a 280 nm wavelength range, or a 300 nm wavelength range, within the optical wavelength regime). In some embodiments, these light reflectance and transmittance values may be a total reflectance or total transmittance (taking into account reflectance or transmittance on both the anti-reflective surface 122 and the opposite major surface 114) or may be observed on a single side of the article, as measured on the anti-reflective surface 122 only (without taking into account the opposite surface). Unless otherwise specified, the average reflectance or transmittance is measured at an incident illumination angle in the range from about 0 degrees to about 10 degrees (however, such measurements may be provided at incident illumination angles of 45 degrees or 60 degrees).

In some embodiments, the article of one or more embodiments, or the anti-reflective surface 122 of one or more articles, may exhibit an average visible photopic reflectance of about 1% or less, about 0.7% or less, about 0.5% or less, or about 0.45% or less over the optical wavelength regime. These photopic reflectance values may be exhibited at incident illumination angles in the range from about 0° to about 20°, from about 0° to about 40° or from about 0° to about 60°. As used herein, photopic reflectance mimics the response of the human eye by weighting the reflectance versus wavelength spectrum according to the human eye's sensitivity. Photopic reflectance may also be defined as the luminance, or tristimulus Y value of reflected light, according to known conventions such as CIE color space conventions. The average photopic reflectance is defined in Equation (4) as the spectral reflectance, R(λ) multiplied by the illuminant spectrum, I(λ) and the CIE's color matching function $\bar{y}(\lambda)$, related to the eye's spectral response:

$$\langle R_p \rangle = \int_{380\,nm}^{720\,nm} R(\lambda) \times I(\lambda) \times \bar{y}(\lambda) d\lambda \quad (5)$$

In some embodiments, the article exhibits a single-side average photopic reflectance, measured at normal or near-normal incidence (e.g. 0-10 degrees) on the anti-reflective surface only of less than about 10%. In some embodiments, the single-side average photopic reflectance is about 9% or less, about 8% or less, about 7% or less, about 6% or less, about 5% or less, about 4% or less, about 3%, or about 2% or less. In a specific embodiment, the anti-reflective surface 122 of one or more articles (i.e. when measuring the anti-reflective surface only through a single-sided measurement), may exhibit the above average photopic reflectance values, while simultaneously exhibiting a maximum reflectance color shift, over the entire incident illumination angle range from about 5 degrees to about 60 degrees (with the reference illumination angle being normal incidence) using D65 illumination and/or F2 illuminant, of less than about 5.0, less than about 4.0, less than about 3.0, less than about 2.0, less than about 1.5, or less than about 1.25. These maximum reflectance color shift values represent the lowest color point value measured at any angle from about 5 degrees to about 60 degrees from normal incidence, subtracted from the highest color point value measured at any angle in the same range. The values may represent a maximum change in a* value ($a^*_{highest} - a^*_{lowest}$), a maximum change in b* value ($b^*_{highest} - b^*_{lowest}$), a maximum change in both a* and b* values, or a maximum change in the quantity $\sqrt{((a^*_{highest} - a^*_{lowest})^2 + (b^*_{highest} - b^*_{lowest})^2)}$.

Substrate

The substrate 110 may include an inorganic material and may include an amorphous substrate, a crystalline substrate or a combination thereof. The substrate 110 may be formed from man-made materials and/or naturally occurring materials (e.g., quartz and polymers). For example, in some instances, the substrate 110 may be characterized as organic and may specifically be polymeric. Examples of suitable polymers include, without limitation: thermoplastics including polystyrene (PS) (including styrene copolymers and blends), polycarbonate (PC) (including copolymers and blends), polyesters (including copolymers and blends, including polyethyleneterephthalate and polyethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic, phenolic, melamine, and silicone resins.

In some specific embodiments, the substrate 110 may specifically exclude polymeric, plastic and/or metal substrates. The substrate may be characterized as alkali-including substrates (i.e., the substrate includes one or more alkalis). In one or more embodiments, the substrate exhibits a refractive index in the range from about 1.45 to about 1.55. In specific embodiments, the substrate 110 may exhibit an average strain-to-failure at a surface on one or more opposing major surface that is 0.5% or greater, 0.6% or greater, 0.7% or greater, 0.8% or greater, 0.9% or greater, 1% or greater, 1.1% or greater, 1.2% or greater, 1.3% or greater, 1.4% or greater 1.5% or greater or even 2% or greater, as measured using ball-on-ring testing using at least 5, at least 10, at least 15, or at least 20 samples. In specific embodiments, the substrate 110 may exhibit an average strain-to-failure at its surface on one or more opposing major surface of about 1.2%, about 1.4%, about 1.6%, about 1.8%, about 2.2%, about 2.4%, about 2.6%, about 2.8%, or about 3% or greater.

Suitable substrates 110 may exhibit an elastic modulus (or Young's modulus) in the range from about 30 GPa to about 120 GPa. In some instances, the elastic modulus of the substrate may be in the range from about 30 GPa to about 110 GPa, from about 30 GPa to about 100 GPa, from about 30 GPa to about 90 GPa, from about 30 GPa to about 80 GPa, from about 30 GPa to about 70 GPa, from about 40 GPa to about 120 GPa, from about 50 GPa to about 120 GPa, from about 60 GPa to about 120 GPa, from about 70 GPa to about 120 GPa, and all ranges and sub-ranges therebetween.

In one or more embodiments, the amorphous substrate may include glass, which may be strengthened or non-strengthened. Examples of suitable glass include soda lime glass, alkali aluminosilicate glass, alkali containing borosilicate glass and alkali aluminoborosilicate glass. In some variants, the glass may be free of lithia. In one or more alternative embodiments, the substrate 110 may include crystalline substrates such as glass ceramic substrates (which may be strengthened or non-strengthened) or may include a single crystal structure, such as sapphire. In one or more specific embodiments, the substrate 110 includes an amorphous base (e.g., glass) and a crystalline cladding (e.g., sapphire layer, a polycrystalline alumina layer and/or or a spinel ($MgAl_2O_4$) layer).

The substrate 110 of one or more embodiments may have a hardness that is less than the hardness of the article (as measured by the Berkovich Indenter Hardness Test described herein). The hardness of the substrate may be measured using known methods in the art, including but not limited to the Berkovich Indenter Hardness Test or Vickers hardness test.

The substrate 110 may be substantially planar or sheet-like, although other embodiments may utilize a curved or otherwise shaped or sculpted substrate. The substrate 110 may be substantially optically clear, transparent and free from light scattering. In such embodiments, the substrate may exhibit an average light transmission over the optical wavelength regime of about 85% or greater, about 86% or greater, about 87% or greater, about 88% or greater, about 89% or greater, about 90% or greater, about 91% or greater or about 92% or greater. In one or more alternative embodiments, the substrate 110 may be opaque or exhibit an average light transmission over the optical wavelength regime of less than about 10%, less than about 9%, less than about 8%, less than about 7%, less than about 6%, less than about 5%, less than about 4%, less than about 3%, less than about 2%, less than about 1%, or less than about 0%. In some embodiments, these light reflectance and transmittance values may be a total reflectance or total transmittance (taking into account reflectance or transmittance on both major surfaces of the substrate) or may be observed on a single side of the substrate (i.e., on the anti-reflective surface 122 only, without taking into account the opposite surface). Unless otherwise specified, the average reflectance or transmittance is measured at an incident illumination angle of 0 degrees (however, such measurements may be provided at incident illumination angles of 45 degrees or 60 degrees). The substrate 110 may optionally exhibit a color, such as white, black, red, blue, green, yellow, orange etc.

Additionally or alternatively, the physical thickness of the substrate 110 may vary along one or more of its dimensions for aesthetic and/or functional reasons. For example, the edges of the substrate 110 may be thicker as compared to more central regions of the substrate 110. The length, width and physical thickness dimensions of the substrate 110 may also vary according to the application or use of the article 100.

The substrate 110 may be provided using a variety of different processes. For instance, where the substrate 110 includes an amorphous substrate such as glass, various forming methods can include float glass processes and down-draw processes such as fusion draw and slot draw.

Once formed, a substrate 110 may be strengthened to form a strengthened substrate. As used herein, the term "strengthened substrate" may refer to a substrate that has been chemically strengthened, for example through ion-exchange of larger ions for smaller ions in the surface of the substrate. However, other strengthening methods known in the art, such as thermal tempering, or utilizing a mismatch of the coefficient of thermal expansion between portions of the substrate to create compressive stress and central tension regions, may be utilized to form strengthened substrates.

Where the substrate is chemically strengthened by an ion exchange process, the ions in the surface layer of the substrate are replaced by—or exchanged with—larger ions having the same valence or oxidation state. Ion exchange processes are typically carried out by immersing a substrate in a molten salt bath containing the larger ions to be exchanged with the smaller ions in the substrate. It will be appreciated by those skilled in the art that parameters for the ion exchange process, including, but not limited to, bath composition and temperature, immersion time, the number of immersions of the substrate in a salt bath (or baths), use of multiple salt baths, additional steps such as annealing, washing, and the like, are generally determined by the composition of the substrate and the desired compressive stress (CS), depth of compressive stress layer (or depth of layer) of the substrate that result from the strengthening operation. By way of example, ion exchange of alkali metal-containing glass substrates may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 40 hours. However, temperatures and immersion times different from those described above may also be used.

In addition, non-limiting examples of ion exchange processes in which glass substrates are immersed in multiple ion exchange baths, with washing and/or annealing steps between immersions, are described in U.S. patent application Ser. No. 12/500,650, filed Jul. 10, 2009, by Douglas C. Allan et al., entitled "Glass with Compressive Surface for Consumer Applications" and claiming priority from U.S. Provisional Patent Application No. 61/079,995, filed Jul. 11, 2008, in which glass substrates are strengthened by immersion in multiple, successive, ion exchange treatments in salt baths of different concentrations; and U.S. Pat. No. 8,312,739, by Christopher M. Lee et al., issued on Nov. 20, 2012, and entitled "Dual Stage Ion Exchange for Chemical Strengthening of Glass," and claiming priority from U.S. Provisional Patent Application No. 61/084,398, filed Jul. 29, 2008, in which glass substrates are strengthened by ion exchange in a first bath is diluted with an effluent ion, followed by immersion in a second bath having a smaller concentration of the effluent ion than the first bath. The contents of U.S. patent application Ser. No. 12/500,650 and U.S. Pat. No. 8,312,739 are incorporated herein by reference in their entirety.

The degree of chemical strengthening achieved by ion exchange may be quantified based on the parameters of central tension (CT), surface CS, and depth of layer (DOL). Surface CS may be measured near the surface or within the strengthened glass at various depths. A maximum CS value may include the measured CS at the surface ($CS_s$) of the strengthened substrate. The CT, which is computed for the inner region adjacent the compressive stress layer within a glass substrate, can be calculated from the CS, the physical thickness t, and the DOL. CS and DOL are measured using those means known in the art. Such means include, but are not limited to, measurement of surface stress (FSM) using commercially available instruments such as the FSM-6000, manufactured by Luceo Co., Ltd. (Tokyo, Japan), or the like, and methods of measuring CS and DOL are described in ASTM 1422C-99, entitled "Standard Specification for Chemically Strengthened Flat Glass," and ASTM 1279.19779 "Standard Test Method for Non-Destructive Photoelastic Measurement of Edge and Surface Stresses in Annealed, Heat-Strengthened, and Fully-Tempered Flat Glass," the contents of which are incorporated herein by reference in their entirety. Surface stress measurements rely upon the accurate measurement of the stress optical coefficient (SOC), which is related to the birefringence of the glass substrate. SOC in turn is measured by those methods that are known in the art, such as fiber and four point bend methods, both of which are described in ASTM standard C770-98 (2008), entitled "Standard Test Method for Measurement of Glass Stress-Optical Coefficient," the contents of which are incorporated herein by reference in their entirety, and a bulk cylinder method. The relationship between CS and CT is given by the expression (1):

$$CT=(CS \cdot DOL)/(t-2DOL) \qquad (1),$$

wherein t is the physical thickness (μm) of the glass article. In various sections of the disclosure, CT and CS are expressed herein in megaPascals (MPa), physical thickness t is expressed in either micrometers (μm) or millimeters (mm) and DOL is expressed in micrometers (μm).

In one embodiment, a strengthened substrate 110 can have a surface CS of 250 MPa or greater, 300 MPa or greater, e.g., 400 MPa or greater, 450 MPa or greater, 500 MPa or greater, 550 MPa or greater, 600 MPa or greater, 650 MPa or greater, 700 MPa or greater, 750 MPa or greater or 800 MPa or greater. The strengthened substrate may have a DOL of 10 μm or greater, 15 μm or greater, 20 μm or greater (e.g., 25 μm, 30 μm, 35 μm, 40 μm, 45 μm, 50 μm or greater) and/or a CT of 10 MPa or greater, 20 MPa or greater, 30 MPa or greater, 40 MPa or greater (e.g., 42 MPa, 45 MPa, or 50 MPa or greater) but less than 100 MPa (e.g., 95, 90, 85, 80, 75, 70, 65, 60, 55 MPa or less). In one or more specific embodiments, the strengthened substrate has one or more of the following: a surface CS greater than 500 MPa, a DOL greater than 15 μm, and a CT greater than 18 MPa.

Example glasses that may be used in the substrate may include alkali aluminosilicate glass compositions or alkali aluminoborosilicate glass compositions, though other glass compositions are contemplated. Such glass compositions are capable of being chemically strengthened by an ion exchange process. One example glass composition comprises $SiO_2$, $B_2O_3$ and $Na_2O$, where $(SiO_2+B_2O_3) \geq 66$ mol. %, and $Na_2O \geq 9$ mol. %. In an embodiment, the glass composition includes at least 6 wt. % aluminum oxide. In a further embodiment, the substrate includes a glass composition with one or more alkaline earth oxides, such that a content of alkaline earth oxides is at least 5 wt. %. Suitable glass compositions, in some embodiments, further comprise at least one of $K_2O$, MgO, and CaO. In a particular embodiment, the glass compositions used in the substrate can comprise 61-75 mol. % SiO2; 7-15 mol. % $Al_2O_3$; 0-12 mol. % $B_2O_3$; 9-21 mol. % $Na_2O$; 0-4 mol. % $K_2O$; 0-7 mol. % MgO; and 0-3 mol. % CaO.

A further example glass composition suitable for the substrate comprises: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$;

less than 50 ppm $As_2O_3$; and less than 50 ppm $Sb_2O_3$; where 12 mol. %≤($Li_2O+Na_2O+K_2O$)≤20 mol. % and 0 mol. %≤(MgO+CaO)≤10 mol. %.

A still further example glass composition suitable for the substrate comprises: 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm $As_2O_3$; and less than 50 ppm $Sb_2O_3$; where 14 mol. %≤($Li_2O+Na_2O+K_2O$)≤18 mol. % and 2 mol. %≤(MgO+CaO)≤7 mol. %.

In a particular embodiment, an alkali aluminosilicate glass composition suitable for the substrate comprises alumina, at least one alkali metal and, in some embodiments, greater than 50 mol. % $SiO_2$, in other embodiments at least 58 mol. % $SiO_2$, and in still other embodiments at least 60 mol. % $SiO_2$, wherein the ratio $(Al_2O_3+B_2O_3)/\Sigma$modifiers (i.e., sum of modifiers) is greater than 1, where in the ratio the components are expressed in mol. % and the modifiers are alkali metal oxides. This glass composition, in particular embodiments, comprises: 58-72 mol. % $SiO_2$; 9-17 mol. % $Al_2O_3$; 2-12 mol. % $B_2O_3$; 8-16 mol. % $Na_2O$; and 0-4 mol. % $K_2O$, wherein the ratio $(Al_2O_3+B_2O_3)/\Sigma$modifiers (i.e., sum of modifiers) is greater than 1.

In still another embodiment, the substrate may include an alkali aluminosilicate glass composition comprising: 64-68 mol. % $SiO_2$; 12-16 mol. % $Na_2O$; 8-12 mol. % $Al_2O_3$; 0-3 mol. % $B_2O_3$; 2-5 mol. % $K_2O$; 4-6 mol. % MgO; and 0-5 mol. % CaO, wherein: 66 mol. %≤$SiO_2+B_2O_3+CaO$≤69 mol. %; $Na_2O+K_2O+B_2O_3+MgO+CaO+SrO$>10 mol. %; 5 mol. %≤MgO+CaO+SrO≤8 mol. %; $(Na_2O+B_2O_3)-Al_2O_3$≤2 mol. %; 2 mol. %≤$Na_2O-Al_2O_3$≤6 mol. %; and 4 mol. %≤$(Na_2O+K_2O)-Al_2O_3$≤10 mol. %.

In an alternative embodiment, the substrate may comprise an alkali aluminosilicate glass composition comprising: 2 mol % or more of $Al_2O_3$ and/or $ZrO_2$, or 4 mol % or more of $Al_2O_3$ and/or $ZrO_2$.

Where the substrate 110 includes a crystalline substrate, the substrate may include a single crystal, which may include $Al_2O_3$. Such single crystal substrates are referred to as sapphire. Other suitable materials for a crystalline substrate include polycrystalline alumina layer and/or spinel ($MgAl_2O_4$).

Optionally, the crystalline substrate 110 may include a glass ceramic substrate, which may be strengthened or non-strengthened. Examples of suitable glass ceramics may include $Li_2O$—$Al_2O_3$—$SiO_2$ system (i.e. LAS-System) glass ceramics, MgO—$Al_2O_3$—$SiO_2$ system (i.e. MAS-System) glass ceramics, and/or glass ceramics that include a predominant crystal phase including β-quartz solid solution, β-spodumeness, cordierite, and lithium disilicate. The glass ceramic substrates may be strengthened using the chemical strengthening processes disclosed herein. In one or more embodiments, MAS-System glass ceramic substrates may be strengthened in $Li_2SO_4$ molten salt, whereby an exchange of $2Li^+$ for $Mg^{2+}$ can occur.

The substrate 110 according to one or more embodiments can have a physical thickness ranging from about 100 µm to about 5 mm. Example substrate 110 physical thicknesses range from about 100 µm to about 500 µm (e.g., 100, 200, 300, 400 or 500 µm). Further example substrate 110 physical thicknesses range from about 500 µm to about 1000 µm (e.g., 500, 600, 700, 800, 900 or 1000 µm). The substrate 110 may have a physical thickness greater than about 1 mm (e.g., about 2, 3, 4, or 5 mm). In one or more specific embodiments, the substrate 110 may have a physical thickness of 2 mm or less or less than 1 mm. The substrate 110 may be acid polished or otherwise treated to remove or reduce the effect of surface flaws.

Anti-Reflective Coating

As shown in FIG. 1, the anti-reflective coating 130 may include a plurality of layers such that one or more layers may be disposed on the opposite side of the substrate 110 from the anti-reflective coating 130 (i.e., on major surface 114) (shown in FIG. 1).

The physical thickness of the anti-reflective coating 130 disposed on the major surface 114 may be in the range from about 0.1 µm to about 5 µm. In some instances, the physical thickness of the anti-reflective coating 140 disposed on major surface 114 may be in the range from about 0.01 µm to about 0.9 µm, from about 0.01 µm to about 0.8 µm, from about 0.01 µm to about 0.7 µm, from about 0.01 µm to about 0.6 µm, from about 0.01 µm to about 0.5 µm, from about 0.01 µm to about 0.4 µm, from about 0.01 µm to about 0.3 µm, from about 0.01 µm to about 0.2 µm, from about 0.01 µm to about 0.1 µm, from about 0.02 µm to about 1 µm, from about 0.03 µm to about 1 µm, from about 0.04 µm to about 1 µm, from about 0.05 µm to about 1 µm, from about 0.06 µm to about 1 µm, from about 0.07 µm to about 1 µm, from about 0.08 µm to about 1 µm, from about 0.09 µm to about 1 µm, from about 0.2 µm to about 1 µm, from about 0.3 µm to about 5 µm, from about 0.4 µm to about 3 µm, from about 0.5 µm to about 3 µm, from about 0.6 µm to about 2 µm, from about 0.7 µm to about 1 µm, from about 0.8 µm to about 1 µm, or from about 0.9 µm to about 1 µm, and all ranges and sub-ranges therebetween.

Figure 54A:
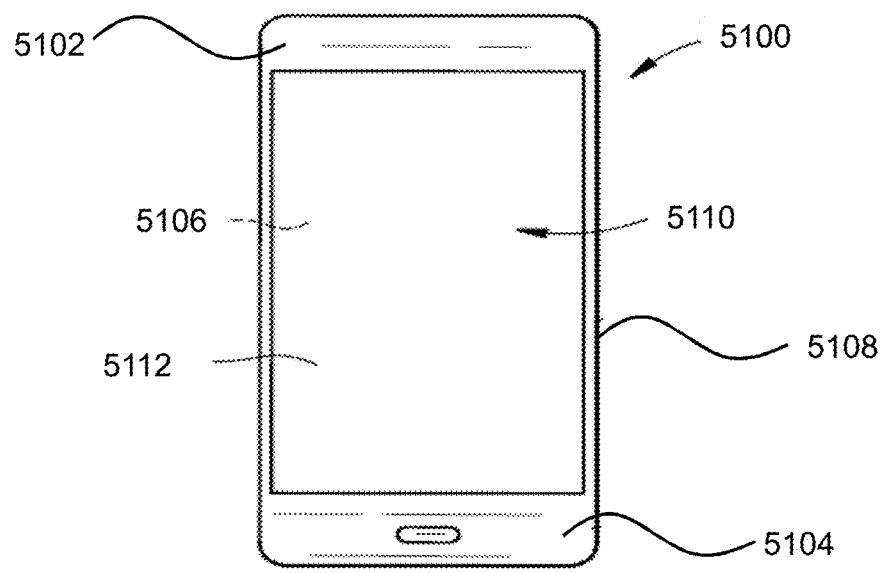
FIG. 54A is a plan view of an exemplary electronic device incorporating any of the articles disclosed herein.
Figure 54B:
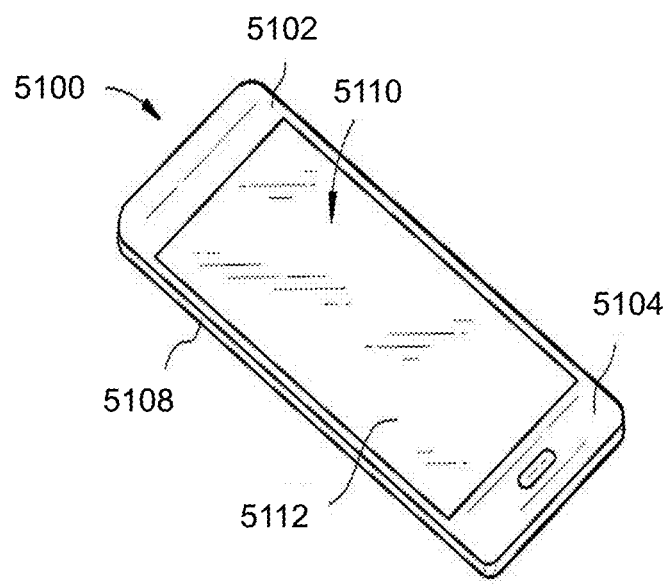
FIG. 54B is a perspective view of the exemplary electronic device of FIG. 54A.

The articles 100 disclosed herein may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any one of articles 100 is shown in FIGS. 54A and 54B. Specifically, FIGS. 54A and 54B show a consumer electronic device 5100 including a housing 5102 having front 5104, back 5106, and side surfaces 5108; electrical components (not shown) that are at least partially inside or entirely within the housing and including at least a controller, a memory, and a display 5110 at or adjacent to the front surface of the housing; and a cover substrate 5112 at or over the front surface of the housing such that it is over the display. In some embodiments, the cover substrate 5112 may include any one of articles 100 disclosed herein.

A second aspect of this disclosure pertains to a method for forming the articles described herein. In one embodiment, the method includes providing a substrate having a major surface in a coating chamber, forming a vacuum in the coating chamber, forming a durable optical coating as described herein on the major surface, optionally forming an additional coating comprising at least one of an easy-to-clean coating and a scratch resistant coating, on the optical coating, and removing the substrate from the coating chamber. In one or more embodiments, the optical coating and the additional coating are formed in either the same coating chamber or without breaking vacuum in separate coating chambers.

In one or more embodiments, the method may include loading the substrate on carriers which are then used to move the substrate in and out of different coating chambers, under load lock conditions so that a vacuum is preserved as the substrate is moved.

The optical coating 120 and/or the additional coating 140 may be formed using various deposition methods such as vacuum deposition techniques, for example, chemical vapor deposition (e.g., plasma enhanced chemical vapor deposition (PECVD), low-pressure chemical vapor deposition, atmospheric pressure chemical vapor deposition, and plasma-enhanced atmospheric pressure chemical vapor deposition), physical vapor deposition (e.g., reactive or nonreactive sputtering or laser ablation), thermal or e-beam evaporation and/or atomic layer deposition. Liquid-based methods may also be used such as spraying, dipping, spin coating, or slot coating (for example, using sol-gel materials). Where vacuum deposition is utilized, inline processes may be used to form the optical coating 120 and/or the additional coating 140 in one deposition run. In some instances, the vacuum deposition can be made by a linear PECVD source.

In some embodiments, the method may include controlling the thickness of the optical coating 120 and/or the additional coating 140 so that it does not vary by more than about 4% along at least about 80% of the area of the anti-reflective surface 122 or from the target thickness for each layer at any point along the substrate area. In some embodiments, the thickness of the optical coating 120 and/or the additional coating 140 so that it does not vary by more than about 4% along at least about 95% of the area of the anti-reflective surface 122.

EXAMPLES

Various embodiments will be further clarified by the following examples. In the Examples, it should be noted that $AlO_xN_y$ and $Si_uAl_vO_xN_y$ were found to be substantially interchangeable as the high-index material in the modeled examples, with only minor process adjustments necessary to re-create the targeted refractive index dispersion values and layer thickness designs provided, which are apparent to one of ordinary skill in the art. In addition, for each of the examples, an optional capping layer can be added, with a preferred capping layer being a low-friction, hydrophobic, or easy-to-clean coating or surface treatment, such as a diamond-like carbon, silane (e.g. fluorosilane), phosphonate, alkene, or alkyne. In some embodiments, these coatings or surface treatments can be added directly on the top surface of the examples as listed below. In some embodiments, the top-most (air side) layer of the examples as described below can be truncated or reduced in thickness to account for the optical effect of the capping layer, which may comprise a finite thickness of about 0.5-30 nm and an effective refractive index of 1.3-1.7. In examples, the thickness of the thickest (scratch resistant) layer is sometimes listed as a range. The coating is designed to be optically robust to changes in the thickness of the thickest layer, which can be adjusted to optimize trade-offs between various parameters such as cost, coating time, and hardness or scratch resistance.

Modeled Examples 1-12

Modeled Examples 1-12 used modeling to demonstrate the reflectance spectra of articles that included embodiments of a durable and scratch-resistant optical coating, as described herein. In Modeled Examples 1-12 the optical coating included $AlO_xN_y$ and $SiO_2$ layers, and a strengthened aluminosilicate glass substrate having a nominal composition of about 58 mol % $SiO_2$, 17 mol % $Al_2O_3$, 17 mol % $Na_2O$, 3 mol % MgO, 0.1 mol % SnO, and 6.5 mol % $P_2O_5$, as shown in Tables 1-12.

To determine the refractive index dispersion curves for the coating materials, layers of each coating material were formed onto silicon wafers by DC, RF or RF superimposed DC reactive sputtering from a silicon, aluminum, silicon and aluminum combined or co-sputtered, or magnesium fluoride target (respectively) at a temperature of about 50° C. using ion assist. The wafer was heated to 200° C. during deposition of some layers and targets having a 3 inch diameter were used. Reactive gases used included nitrogen, fluorine and oxygen; argon was used as the inert gas. The RF power was supplied to the silicon target at 13.56 Mhz and DC power was supplied to the Si target, Al target and other targets.

The refractive indices (as a function of wavelength) of each of the formed layers and the glass substrate were measured using spectroscopic ellipsometry. The refractive indices thus measured were then used to calculate reflectance spectra for Modeled Examples 2-5. The modeled examples use a single refractive index value in their descriptive tables for convenience, which corresponds to a point selected from the dispersion curves at about 550 nm wavelength.

TABLE 1

Structure of Modeled Example 1.

| Coating/ Layer | Periods, if applicable | Material | Refractive Index (at 550 nm) | Physical Thickness (nm) |
|---|---|---|---|---|
| Ambient medium | — | Air | 1 | |
| Optical coating | 1 | $AlO_xN_y$ | 2.00605 | 32 |
| | | $SiO_2$ | 1.48114 | 12 |
| Scratch-Resistant Layer | | $AlO_xN_y$ | 2.00605 | 2000 (may be in range from 100-5000 nm) |
| | 1 | $SiO_2$ | 1.48114 | 8.78 |
| | | $AlO_xN_y$ | 2.00605 | 44.19 |
| | 2 | $SiO_2$ | 1.48114 | 32.41 |
| | | $AlO_xN_y$ | 2.00605 | 24.3 |
| | 3 | $SiO_2$ | 1.48114 | 58.55 |
| | | $AlO_xN_y$ | 2.00605 | 7.47 |
| — | — | AS Glass | 1.50542 | |
| Total coating thickness (nm) | | | | 2219.7 |

TABLE 2

Structure of Modeled Example 2.

| Coating/ Layer | Periods, if applicable | Material | Refractive Index (at 550 nm) | Physical Thickness (nm) |
|---|---|---|---|---|
| Ambient medium | — | Air | 1 | |
| Optical coating | | $SiO_2$ | 1.48114 | 45 |
| | 1 | $AlO_xN_y$ | 2.00605 | 45 |
| | | $SiO_2$ | 1.48114 | 10 |
| Scratch-Resistant Layer | | $AlO_xN_y$ | 2.00605 | 2000 (may be in range from 100-5000 nm) |
| | 1 | $SiO_2$ | 1.48114 | 8.78 |
| | | $AlO_xN_y$ | 2.00605 | 44.19 |
| | 2 | $SiO_2$ | 1.48114 | 32.41 |
| | | $AlO_xN_y$ | 2.00605 | 24.3 |

TABLE 2-continued

Structure of Modeled Example 2.

| Coating/Layer | Periods, if applicable | Material | Refractive Index (at 550 nm) | Physical Thickness (nm) |
|---|---|---|---|---|
| | 3 | $SiO_2$ | 1.48114 | 58.55 |
| | | $AlO_xN_y$ | 2.00605 | 7.47 |
| — | — | AS Glass | 1.50542 | |
| Total coating thickness (nm) | | | | 2275.7 |

TABLE 3

Structure of Modeled Example 3.

| Coating/Layer | Periods, if applicable | Material | Refractive Index (at 550 nm) | Physical Thickness (nm) |
|---|---|---|---|---|
| Ambient medium | — | Air | 1 | |
| Optical coating | 1 | $SiO_2$ | 1.48114 | 10 |
| | | $AlO_xN_y$ | 2.00605 | 30 |
| | | $SiO_2$ | 1.48114 | 10 |
| Scratch-Resistant Layer | | $AlO_xN_y$ | 2.00605 | 2000 (may be in range from 100-5000 nm) |
| | 1 | $SiO_2$ | 1.48114 | 8.78 |
| | | $AlO_xN_y$ | 2.00605 | 44.19 |
| | 2 | $SiO_2$ | 1.48114 | 32.41 |
| | | $AlO_xN_y$ | 2.00605 | 24.3 |
| | 3 | $SiO_2$ | 1.48114 | 58.55 |
| | | $AlO_xN_y$ | 2.00605 | 7.47 |
| — | — | AS Glass | 1.50542 | |
| Total coating thickness (nm) | | | | 2225.7 |

TABLE 4

Structure of Modeled Example 4.

| Coating/Layer | Periods, if applicable | Material | Refractive Index (at 550 nm) | Physical Thickness (nm) |
|---|---|---|---|---|
| Ambient medium | — | Air | 1 | |
| Optical coating | 1 | $SiO_2$ | 1.48114 | 30 |
| | | $AlO_xN_y$ | 2.00605 | 47 |
| | | $SiO_2$ | 1.48114 | 5 |
| Scratch-Resistant Layer | | $AlO_xN_y$ | 2.00605 | 2000 (may be in range from 100-5000 nm) |
| | 1 | $SiO_2$ | 1.48114 | 8.78 |
| | | $AlO_xN_y$ | 2.00605 | 44.19 |
| | 2 | $SiO_2$ | 1.48114 | 32.41 |
| | | $AlO_xN_y$ | 2.00605 | 24.3 |
| | 3 | $SiO_2$ | 1.48114 | 58.55 |
| | | $AlO_xN_y$ | 2.00605 | 7.47 |
| — | — | AS Glass | 1.50542 | |
| Total coating thickness (nm) | | | | 2257.7 |

TABLE 5

Structure of Modeled Example 5.

| Coating/Layer | Periods, if applicable | Material | Refractive Index (at 550 nm) | Physical Thickness (nm) |
|---|---|---|---|---|
| Ambient medium | — | Air | 1 | |
| Optical coating | | $SiO_2$ | 1.48114 | 2 |
| | 1 | $AlO_xN_y$ | 2.00605 | 25 |
| | | $SiO_2$ | 1.48114 | 25 |
| Scratch-Resistant Layer | | $AlO_xN_y$ | 2.00605 | 2000 (may be in range from 100-5000 nm) |
| | 1 | $SiO_2$ | 1.48114 | 8.78 |
| | | $AlO_xN_y$ | 2.00605 | 44.19 |
| | 2 | $SiO_2$ | 1.48114 | 32.41 |
| | | $AlO_xN_y$ | 2.00605 | 24.3 |
| | 3 | $SiO_2$ | 1.48114 | 58.55 |
| | | $AlO_xN_y$ | 2.00605 | 7.47 |
| — | — | AS Glass | 1.50542 | |
| Total coating thickness (nm) | | | | 2227.7 |

TABLE 6

Structure of Modeled Example 6.

| Coating/Layer | Periods, if applicable | Material | Refractive Index (at 550 nm) | Physical Thickness (nm) |
|---|---|---|---|---|
| Ambient medium | — | Air | 1 | |
| Optical coating | 1 | $AlO_xN_y$ | 2.00605 | 25 |
| | | $SiO_2$ | 1.48114 | 25 |
| Scratch-Resistant Layer | | $AlO_xN_y$ | 2.00605 | 2000 (may be in range from 100-5000 nm) |
| | 1 | $SiO_2$ | 1.48114 | 8.78 |
| | | $AlO_xN_y$ | 2.00605 | 44.19 |
| | 2 | $SiO_2$ | 1.48114 | 32.41 |
| | | $AlO_xN_y$ | 2.00605 | 24.3 |
| | 3 | $SiO_2$ | 1.48114 | 58.55 |
| | | $AlO_xN_y$ | 2.00605 | 7.47 |
| — | — | AS Glass | 1.50542 | |
| Total coating thickness (nm) | | | | 2225.7 |

TABLE 7

Structure of Modeled Example 7.

| Coating/Layer | Periods, if applicable | Material | Refractive Index (at 550 nm) | Physical Thickness (nm) |
|---|---|---|---|---|
| Ambient medium | — | Air | 1 | |
| Optical coating | 1 | $SiO_2$ | 1.48114 | 20 |
| | | $AlO_xN_y$ | 2.00605 | 24 |
| | | $SiO_2$ | 1.48114 | 18 |
| Scratch-Resistant Layer | | $AlO_xN_y$ | 2.00605 | 2000 (may be in range from 100-5000 nm) |
| | 1 | $SiO_2$ | 1.48114 | 8.78 |
| | | $AlO_xN_y$ | 2.00605 | 44.19 |
| | 2 | $SiO_2$ | 1.48114 | 32.41 |
| | | $AlO_xN_y$ | 2.00605 | 24.3 |
| | 3 | $SiO_2$ | 1.48114 | 58.55 |
| | | $AlO_xN_y$ | 2.00605 | 7.47 |
| — | — | AS Glass | 1.50542 | |
| Total coating thickness (nm) | | | | 2237.7 |

TABLE 8

Structure of Modeled Example 8.

| Coating/Layer | Periods, if applicable | Material | Refractive Index (at 550 nm) | Physical Thickness (nm) |
|---|---|---|---|---|
| Ambient medium | — | Air | 1 | |
| Optical coating | | $SiO_2$ | 1.48114 | 40 |
| | 1 | $AlO_xN_y$ | 2.00605 | 22 |
| | | $SiO_2$ | 1.48114 | 18 |
| Scratch-Resistant Layer | | $AlO_xN_y$ | 2.00605 | 2000 (may be in range from 100-5000 nm) |
| | 1 | $SiO_2$ | 1.48114 | 8.78 |
| | | $AlO_xN_y$ | 2.00605 | 44.19 |
| | 2 | $SiO_2$ | 1.48114 | 32.41 |
| | | $AlO_xN_y$ | 2.00605 | 24.3 |
| | 3 | $SiO_2$ | 1.48114 | 58.55 |
| | | $AlO_xN_y$ | 2.00605 | 7.47 |
| — | — | AS Glass | 1.50542 | |
| Total coating thickness (nm) | | | | 2255.7 |

TABLE 9

Structure of Modeled Example 9.

| Coating/Layer | Periods, if applicable | Material | Refractive Index (at 550 nm) | Physical Thickness (nm) |
|---|---|---|---|---|
| Ambient medium | — | Air | 1 | |
| Optical coating | | $SiO_2$ | 1.48114 | 75 |
| | 1 | $AlO_xN_y$ | 2.00605 | 27 |
| | | $SiO_2$ | 1.48114 | 16 |
| Scratch-Resistant Layer | | $AlO_xN_y$ | 2.00605 | 2000 (may be in range from 100-5000 nm) |
| | 1 | $SiO_2$ | 1.48114 | 8.78 |
| | | $AlO_xN_y$ | 2.00605 | 44.19 |
| | 2 | $SiO_2$ | 1.48114 | 32.41 |
| | | $AlO_xN_y$ | 2.00605 | 24.3 |
| | 3 | $SiO_2$ | 1.48114 | 58.55 |
| | | $AlO_xN_y$ | 2.00605 | 7.47 |
| — | — | AS Glass | 1.50542 | |
| Total coating thickness (nm) | | | | 2239.7 |

TABLE 10

Structure of Modeled Example 10.

| Coating/Layer | Periods, if applicable | Material | Refractive Index (at 550 nm) | Physical Thickness (nm) |
|---|---|---|---|---|
| Ambient medium | — | Air | 1 | |
| Optical coating | | $SiO_2$ | 1.48114 | 100 |
| | 1 | $AlO_xN_y$ | 2.00605 | 34 |
| | | $SiO_2$ | 1.48114 | 15 |
| Scratch-Resistant Layer | | $AlO_xN_y$ | 2.00605 | 2000 (may be in range from 100-5000 nm) |
| | 1 | $SiO_2$ | 1.48114 | 8.78 |
| | | $AlO_xN_y$ | 2.00605 | 44.19 |
| | 2 | $SiO_2$ | 1.48114 | 32.41 |
| | | $AlO_xN_y$ | 2.00605 | 24.3 |
| | 3 | $SiO_2$ | 1.48114 | 58.55 |
| | | $AlO_xN_y$ | 2.00605 | 7.47 |
| — | — | AS Glass | 1.50542 | |
| Total coating thickness (nm) | | | | 2324.7 |

TABLE 11

Structure of Modeled Example 11.

| Coating/Layer | Periods, if applicable | Material | Refractive Index (at 550 nm) | Physical Thickness (nm) |
|---|---|---|---|---|
| Ambient medium | — | Air | 1 | |
| Optical coating | 1 | $AlO_xN_y$ | 2.00605 | 18 |
| | | $SiO_2$ | 1.48114 | 50 |
| Scratch-Resistant Layer | | $AlO_xN_y$ | 2.00605 | 2000 (may be in range from 100-5000 nm) |
| | 1 | $SiO_2$ | 1.48114 | 8.78 |
| | | $AlO_xN_y$ | 2.00605 | 44.19 |
| | 2 | $SiO_2$ | 1.48114 | 32.41 |
| | | $AlO_xN_y$ | 2.00605 | 24.3 |
| | 3 | $SiO_2$ | 1.48114 | 58.55 |
| | | $AlO_xN_y$ | 2.00605 | 7.47 |
| — | — | AS Glass | 1.50542 | |
| Total coating thickness (nm) | | | | 2243.7 |

TABLE 12

Structure of Modeled Example 12.

| Coating/Layer | Periods, if applicable | Material | Refractive Index (at 550 nm) | Physical Thickness (nm) |
|---|---|---|---|---|
| Ambient medium | — | Air | 1 | |
| Optical coating | | $SiO_2$ | 1.48114 | 60 |
| | 1 | $AlO_xN_y$ | 2.00605 | 34 |
| | | $SiO_2$ | 1.48114 | 15.5 |
| Scratch-Resistant Layer | | $AlO_xN_y$ | 2.00605 | 2000 (may be in range from 100-5000 nm) |
| | 1 | $SiO_2$ | 1.48114 | 8.78 |
| | | $AlO_xN_y$ | 2.00605 | 44.19 |
| | 2 | $SiO_2$ | 1.48114 | 32.41 |
| | | $AlO_xN_y$ | 2.00605 | 24.3 |
| | 3 | $SiO_2$ | 1.48114 | 58.55 |
| | | $AlO_xN_y$ | 2.00605 | 7.47 |
| — | — | AS Glass | 1.50542 | |
| Total coating thickness (nm) | | | | 2293.7 |

Figure 10:
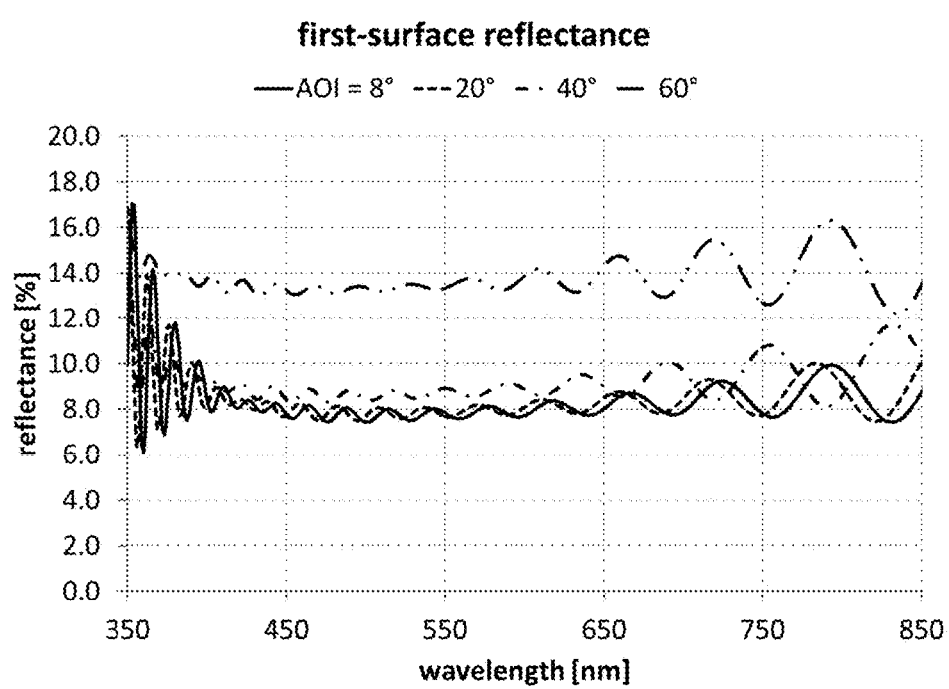
FIG. 10 is a reflectance spectra of Modeled Example 1, calculated from the anti-reflective surface only, at different viewing angles.
Figure 11:
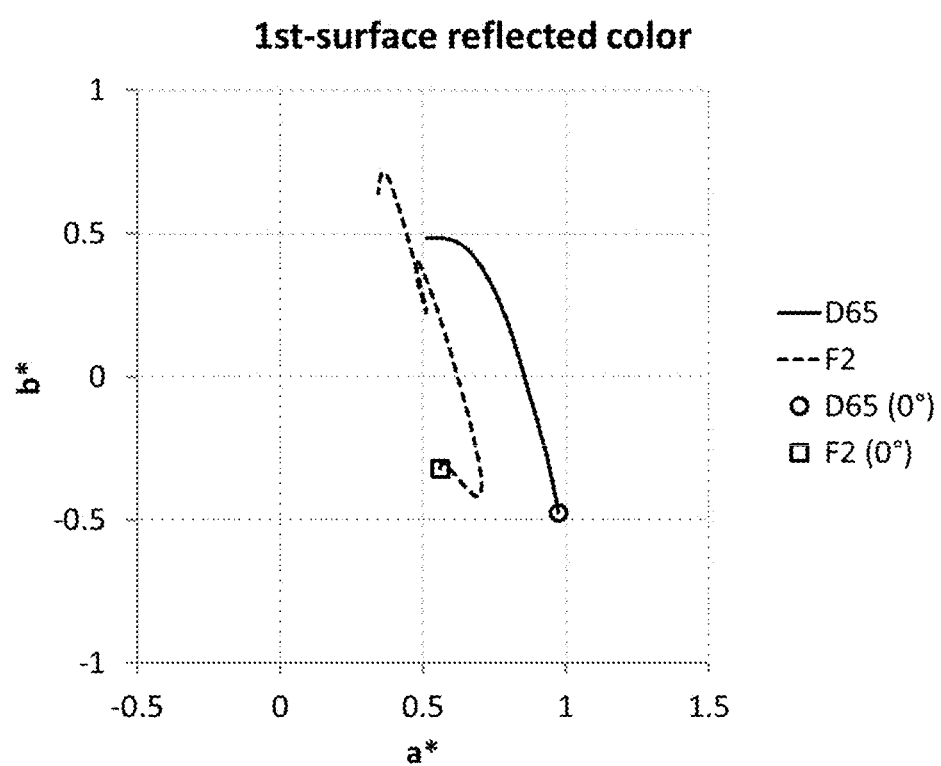
FIG. 11 depicts the reflected color of the article of Example 1 showing the reflected color under different illuminants at different viewing angles from 0° to 60°.
Figure 12:
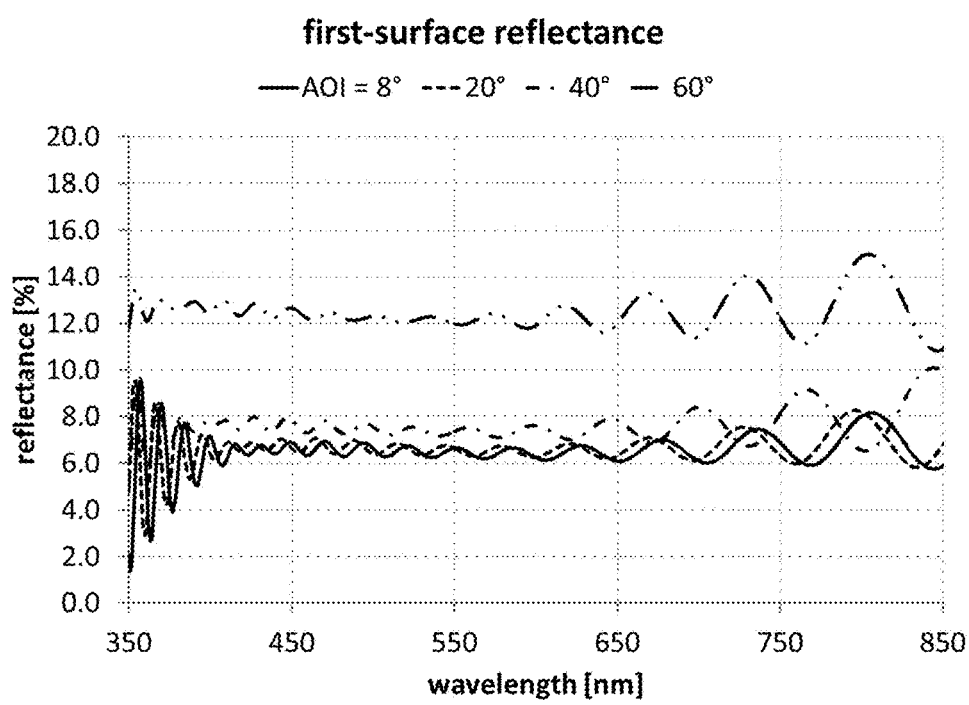
FIG. 12 is a reflectance spectra of Modeled Example 2, calculated from the anti-reflective surface only, at different viewing angles.
Figure 13:
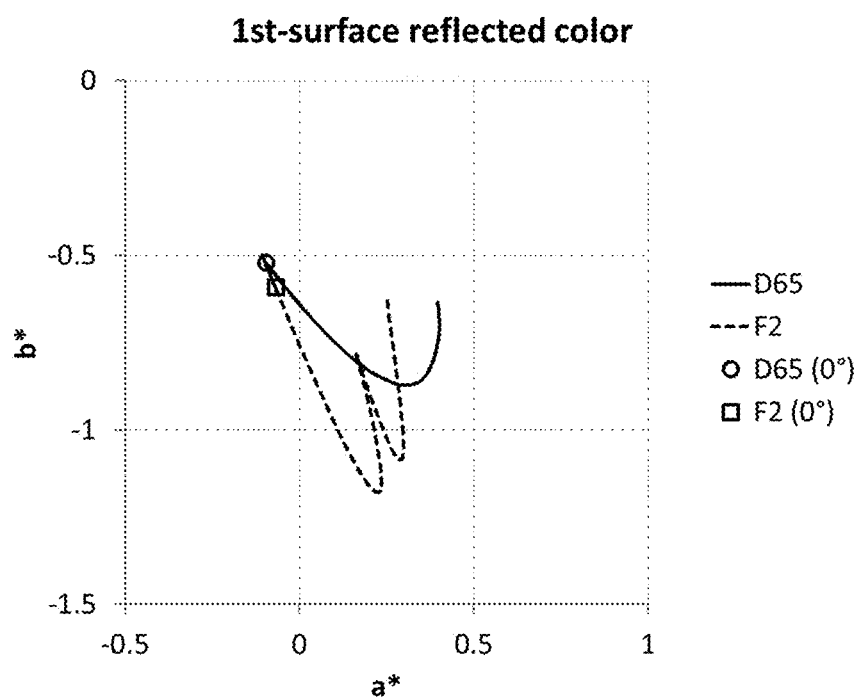
FIG. 13 depicts the reflected color of the article of Example 2 showing the reflected color under different illuminants at different viewing angles from 0° to 60°.
Figure 14:
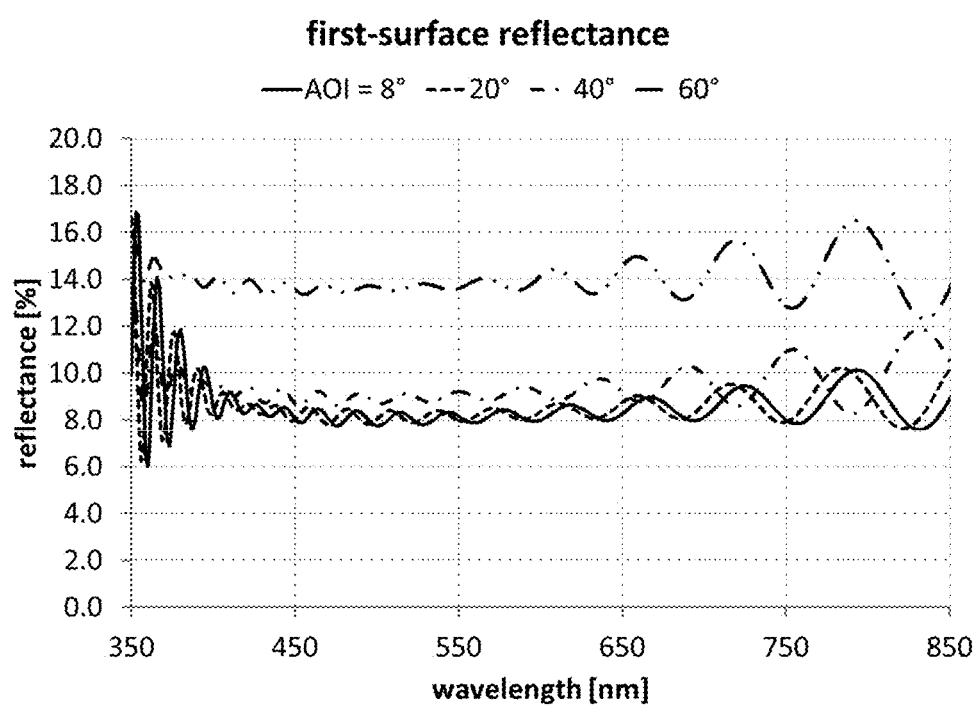
FIG. 14 is a reflectance spectra of Modeled Example 3, calculated from the anti-reflective surface only, at different viewing angles.
Figure 15:
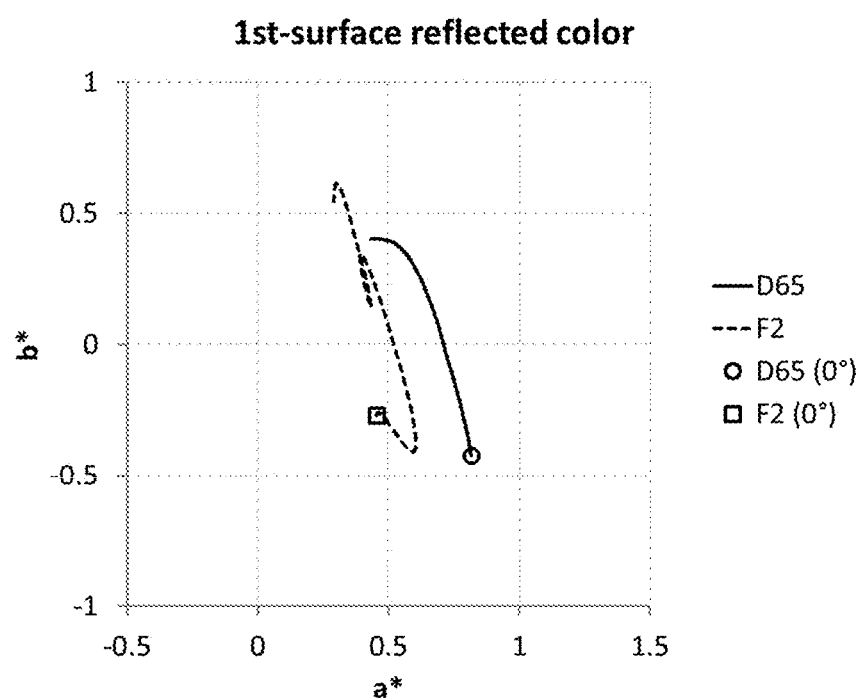
FIG. 15 depicts the reflected color of the article of Example 3 showing the reflected color under different illuminants at different viewing angles from 0° to 60°.
Figure 16:
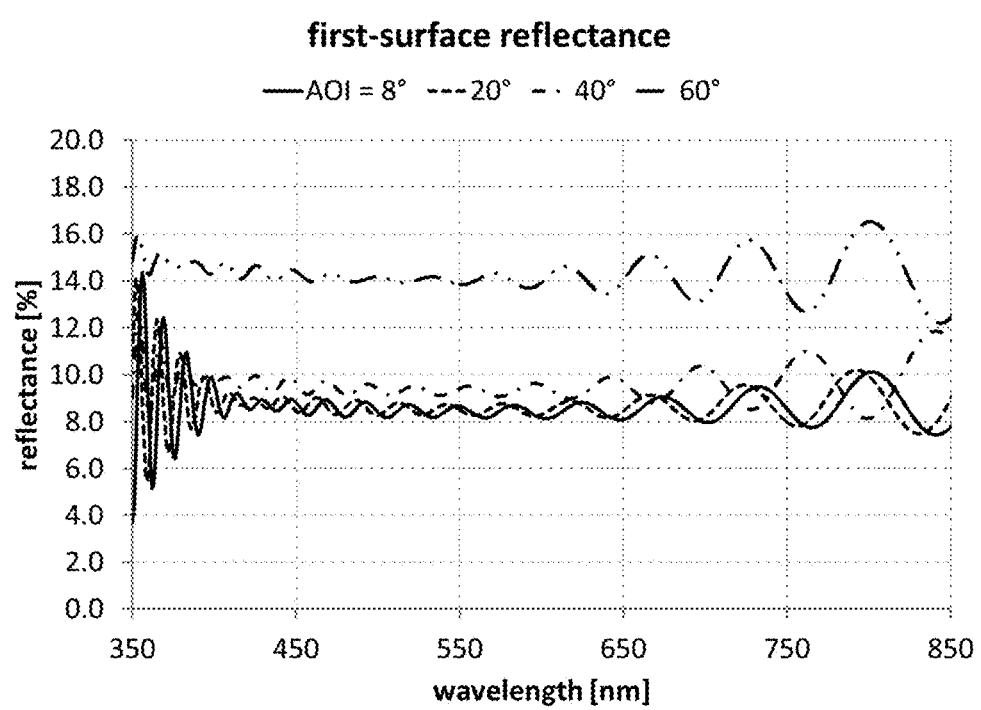
FIG. 16 is a reflectance spectra of Modeled Example 4, calculated from the anti-reflective surface only, at different viewing angles.
Figure 17:
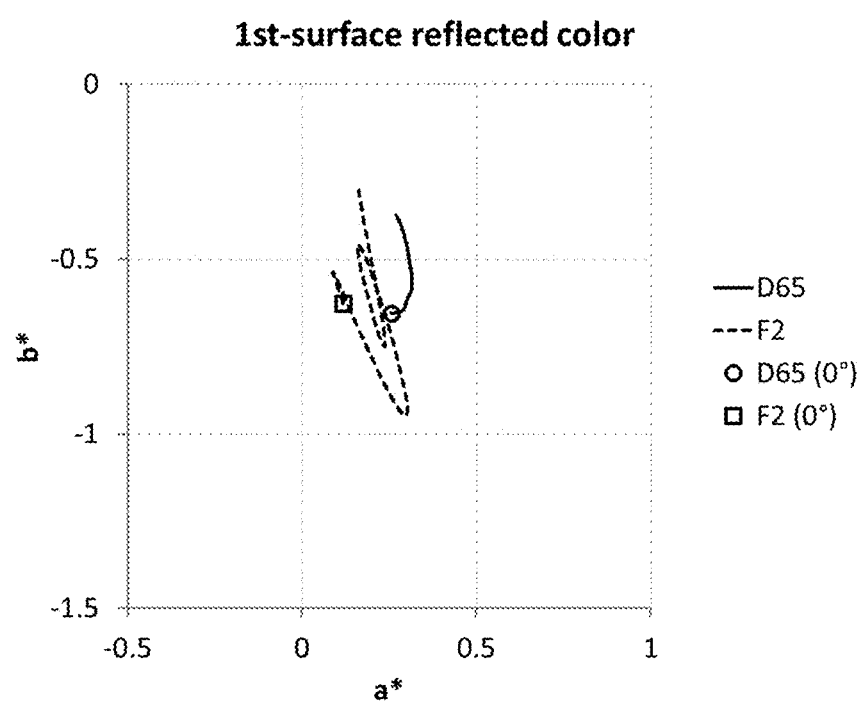
FIG. 17 depicts the reflected color of the article of Example 4 showing the reflected color under different illuminants at different viewing angles from 0° to 60°.
Figure 18:
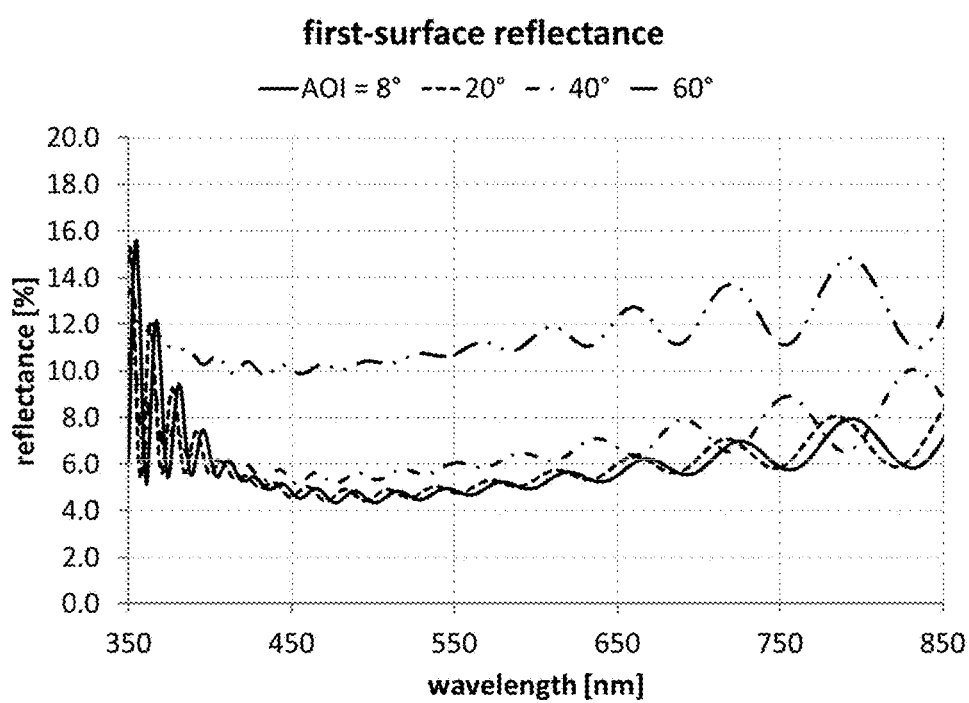
FIG. 18 is a reflectance spectra of Modeled Example 5, calculated from the anti-reflective surface only, at different viewing angles.
Figure 19:
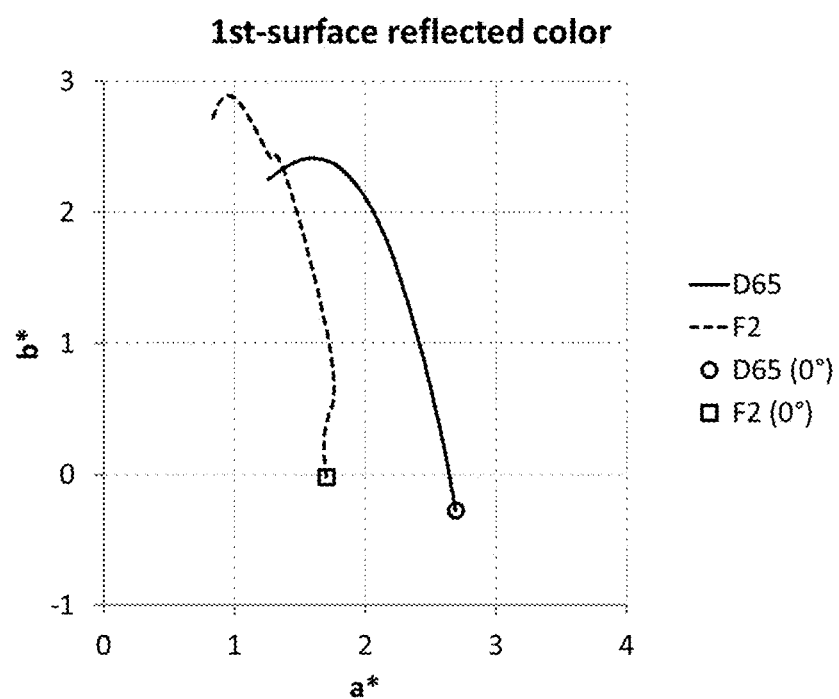
FIG. 19 depicts the reflected color of the article of Example 5 showing the reflected color under different illuminants at different viewing angles from 0° to 60°.
Figure 20:
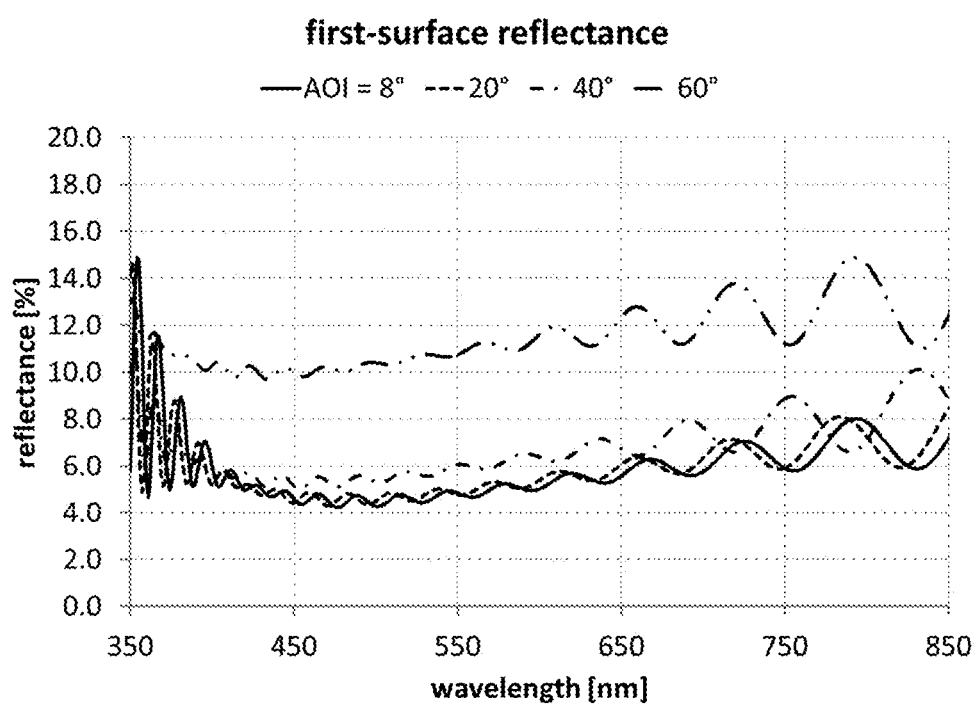
FIG. 20 is a reflectance spectra of Modeled Example 6, calculated from the anti-reflective surface only, at different viewing angles.
Figure 21:
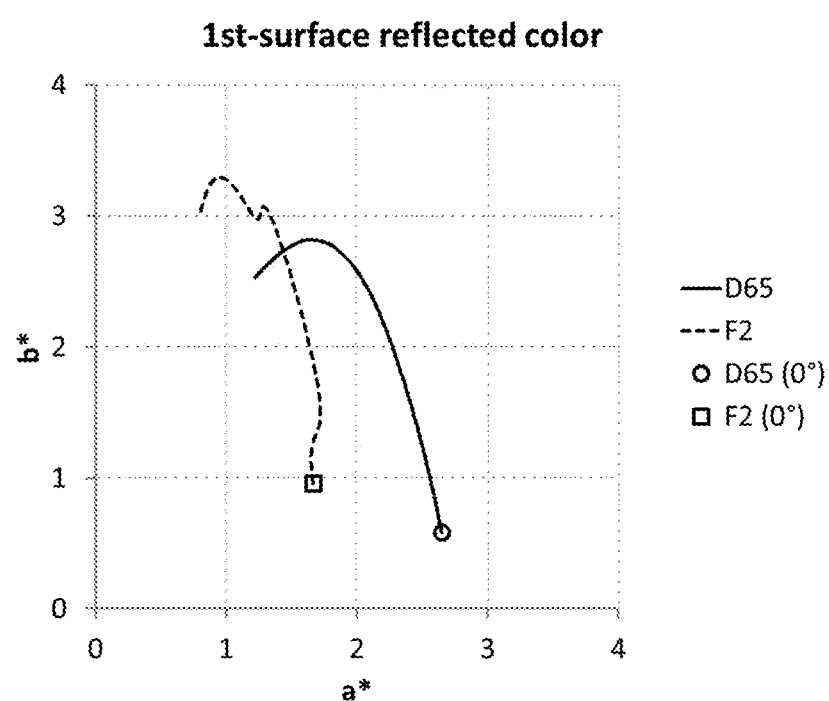
FIG. 21 depicts the reflected color of the article of Example 6 showing the reflected color under different illuminants at different viewing angles from 0° to 60°.
Figure 22:
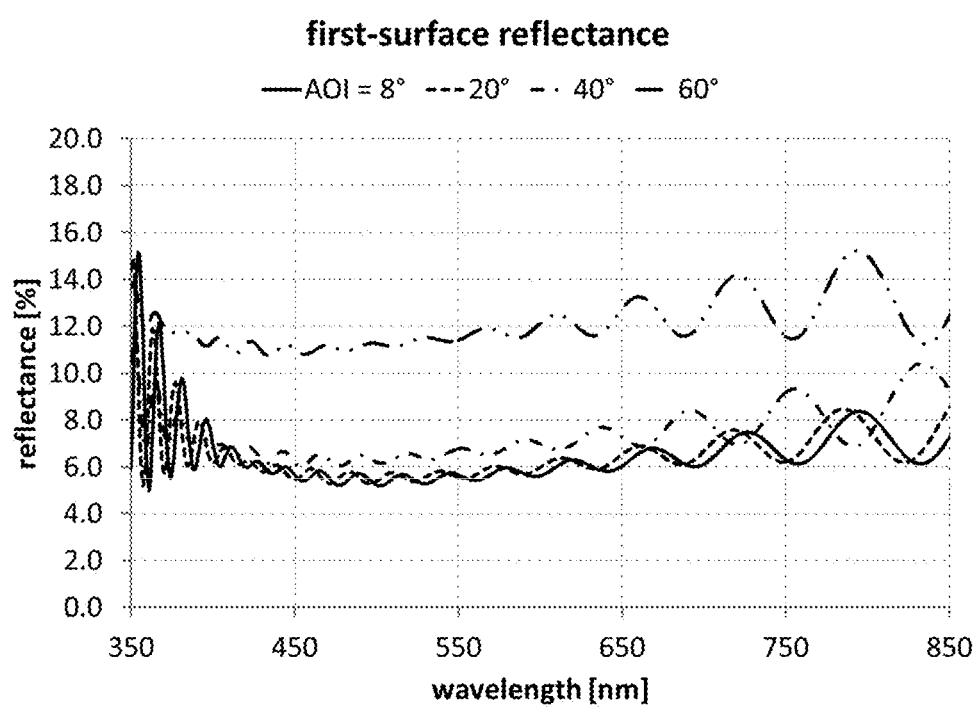
FIG. 22 is a reflectance spectra of Modeled Example 7, calculated from the anti-reflective surface only, at different viewing angles.
Figure 23:
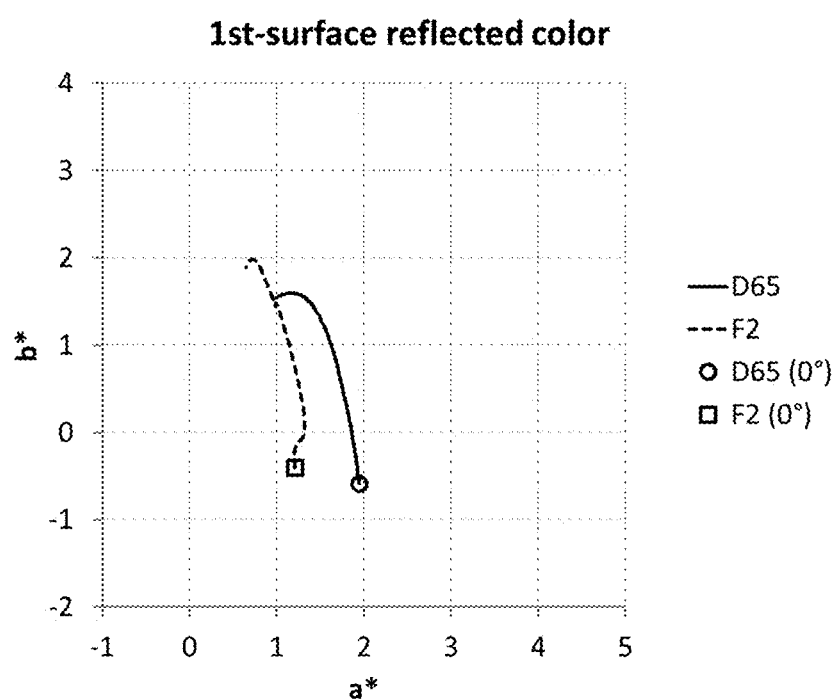
FIG. 23 depicts the reflected color of the article of Example 7 showing the reflected color under different illuminants at different viewing angles from 0° to 60°.
Figure 24:
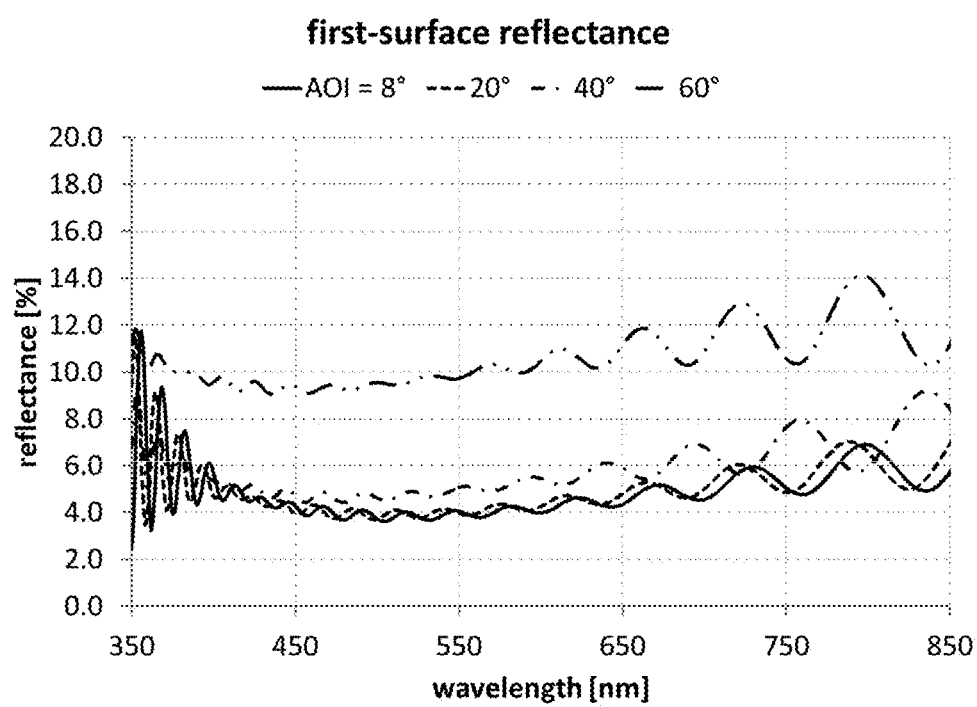
FIG. 24 is a reflectance spectra of Modeled Example 8, calculated from the anti-reflective surface only, at different viewing angles.
Figure 25:
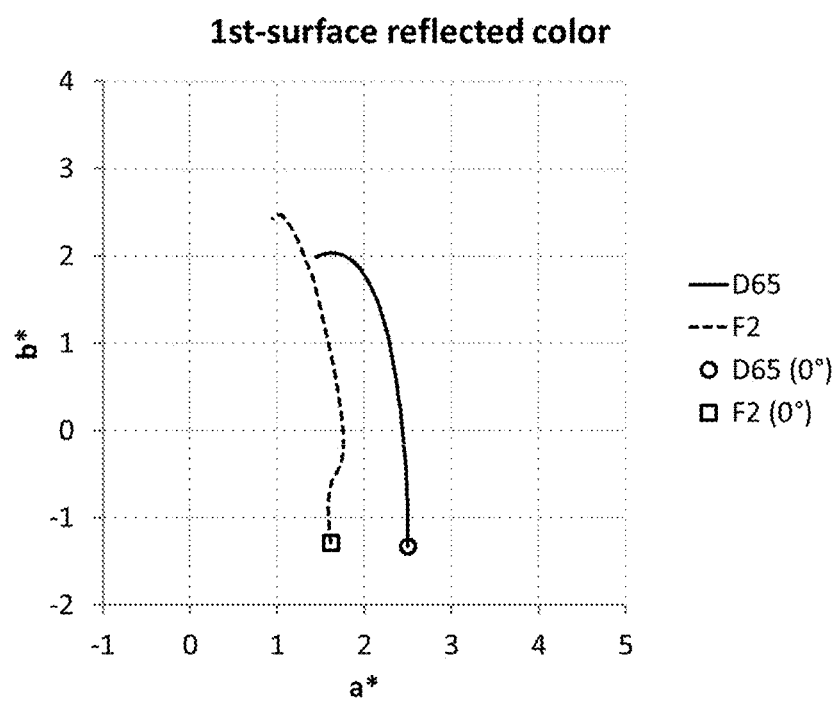
FIG. 25 depicts the reflected color of the article of Example 8 showing the reflected color under different illuminants at different viewing angles from 0° to 60°.
Figure 26:
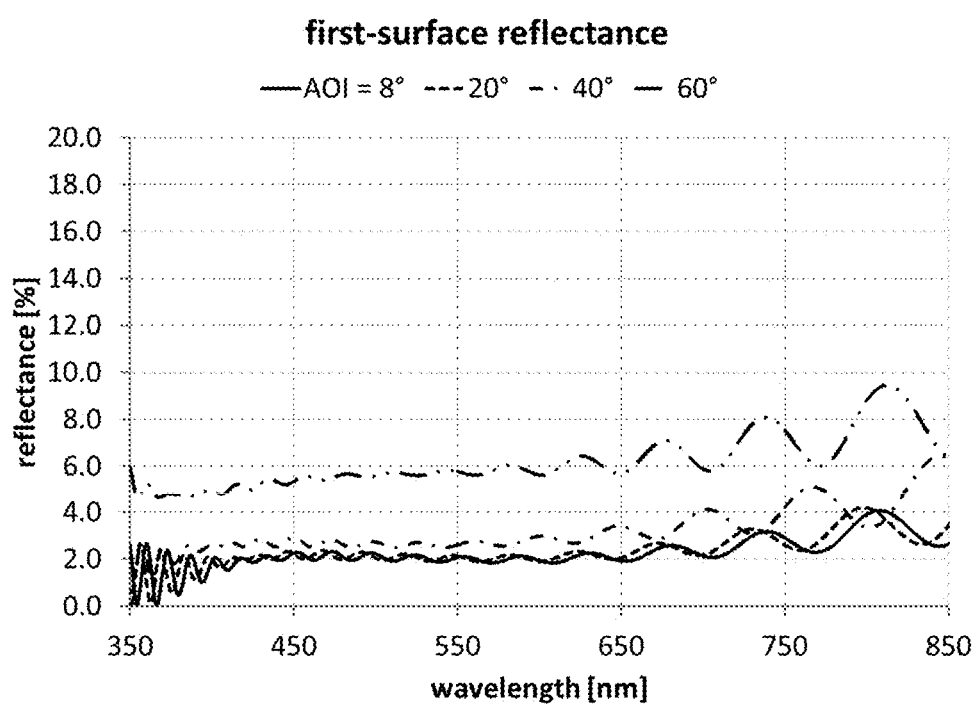
FIG. 26 is a reflectance spectra of Modeled Example 9, calculated from the anti-reflective surface only, at different viewing angles.
Figure 27:
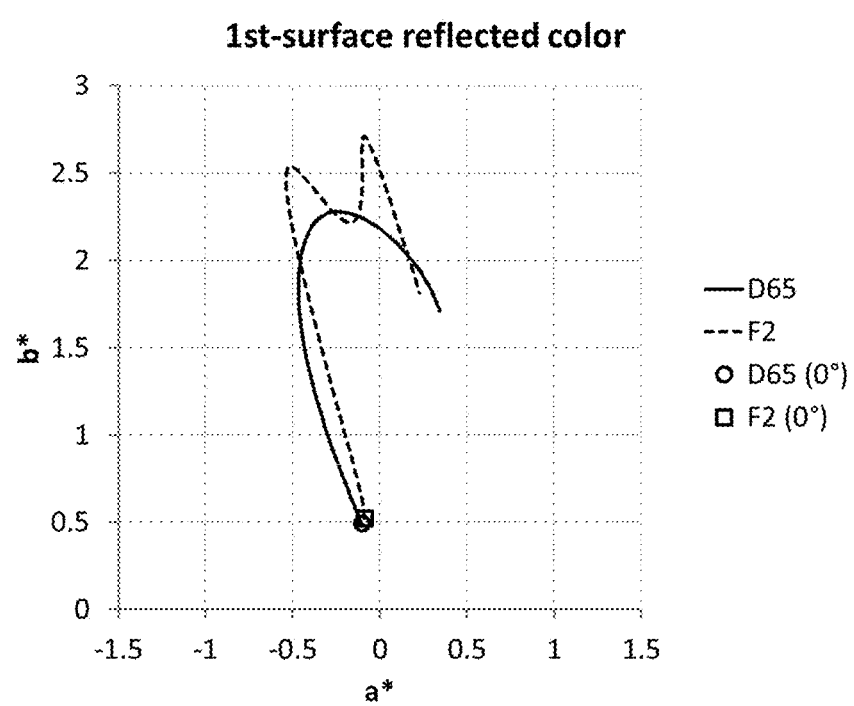
FIG. 27 depicts the reflected color of the article of Example 9 showing the reflected color under different illuminants at different viewing angles from 0° to 60°.
Figure 28:
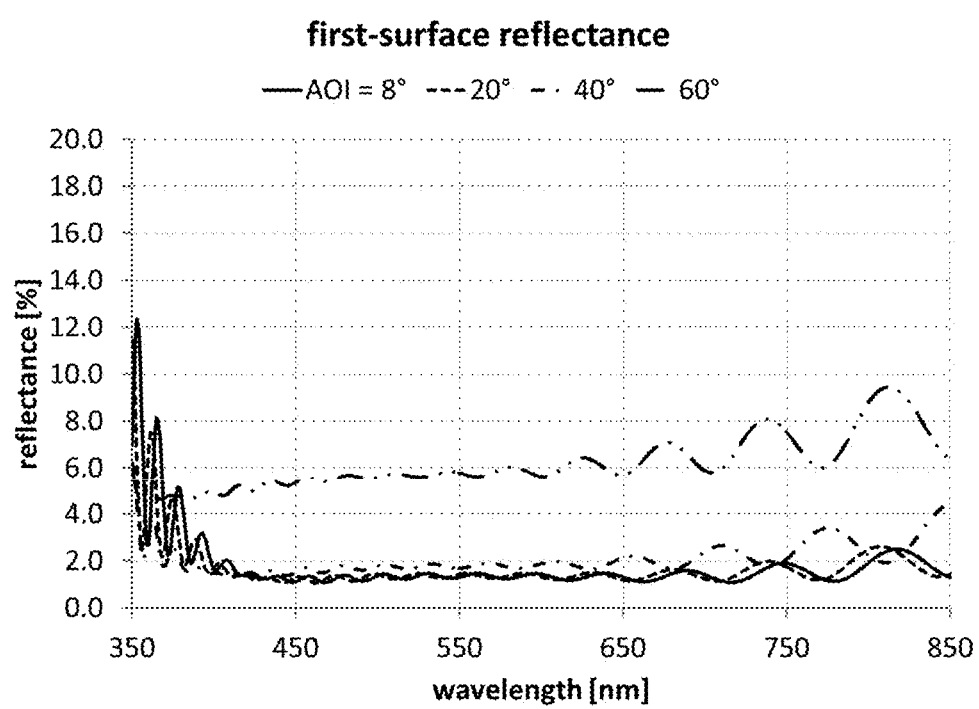
FIG. 28 is a reflectance spectra of Modeled Example 10, calculated from the anti-reflective surface only, at different viewing angles.
Figure 29:
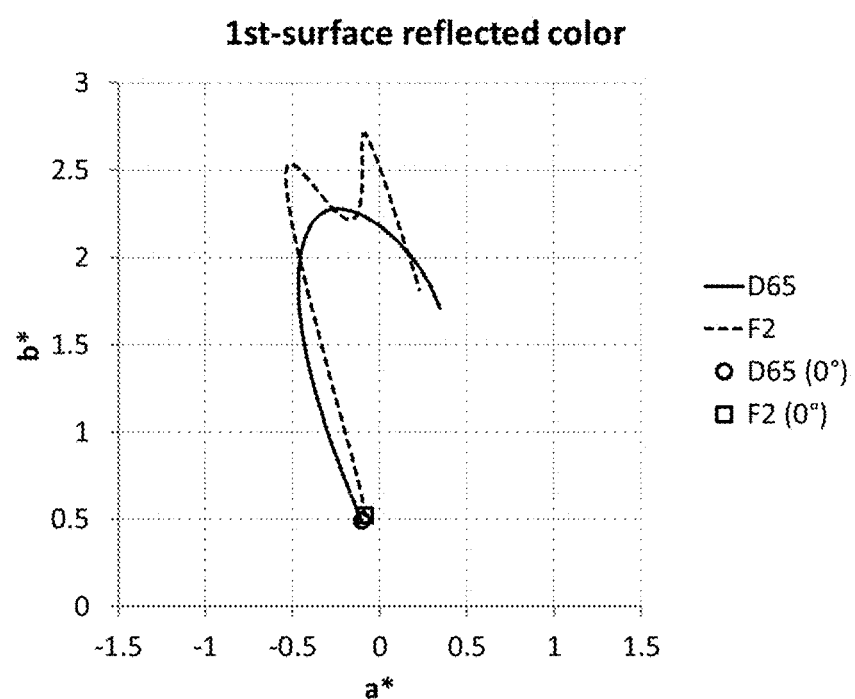
FIG. 29 depicts the reflected color of the article of Example 10 showing the reflected color under different illuminants at different viewing angles from 0° to 60°.
Figure 30:
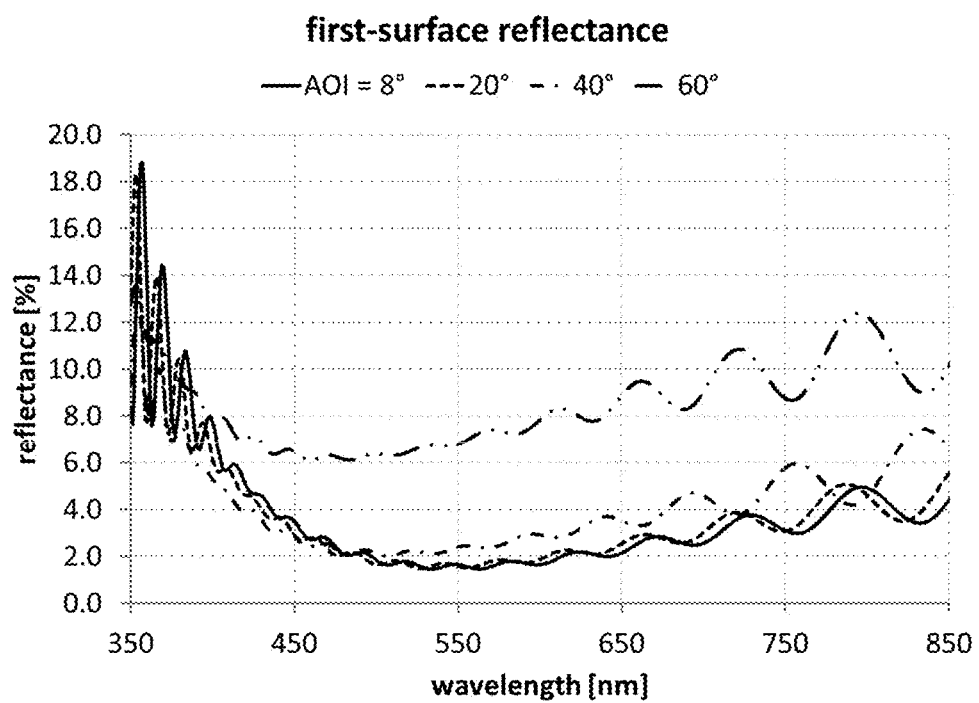
FIG. 30 is a reflectance spectra of Modeled Example 11, calculated from the anti-reflective surface only, at different viewing angles.
Figure 31:
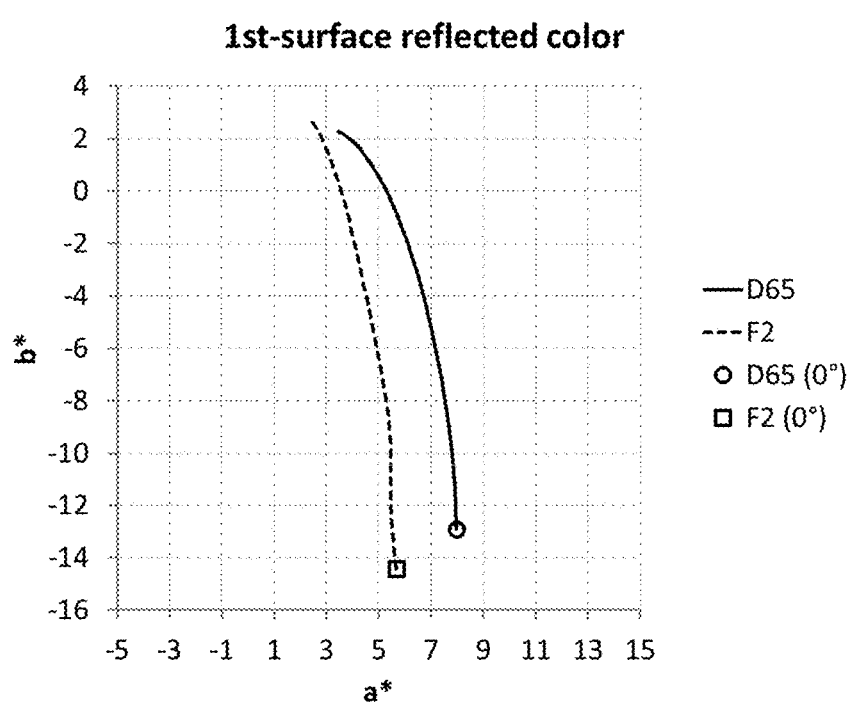
FIG. 31 depicts the reflected color of the article of Example 11 showing the reflected color under different illuminants at different viewing angles from 0° to 60°.
Figure 32:
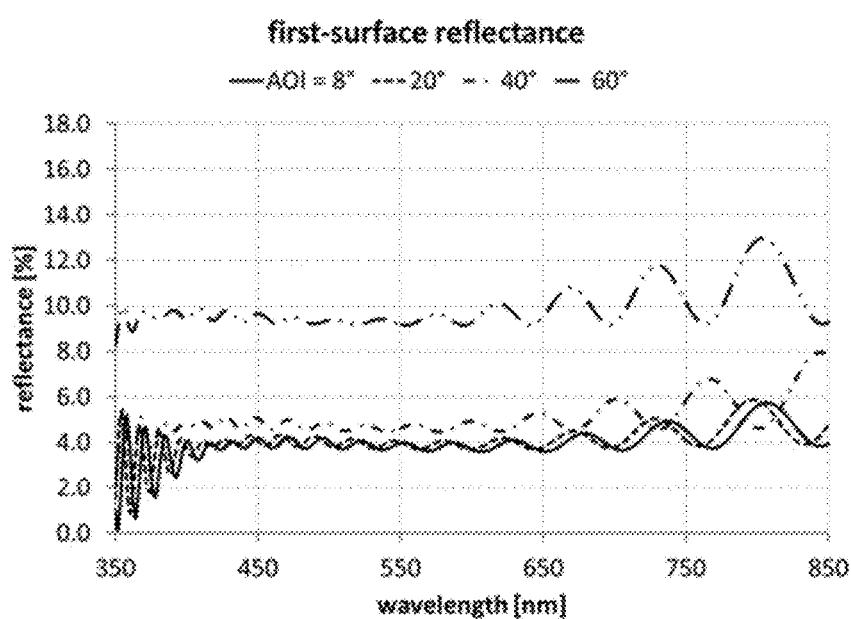
FIG. 32 is a reflectance spectra of Modeled Example 12, calculated from the anti-reflective surface only, at different viewing angles.
Figure 33:
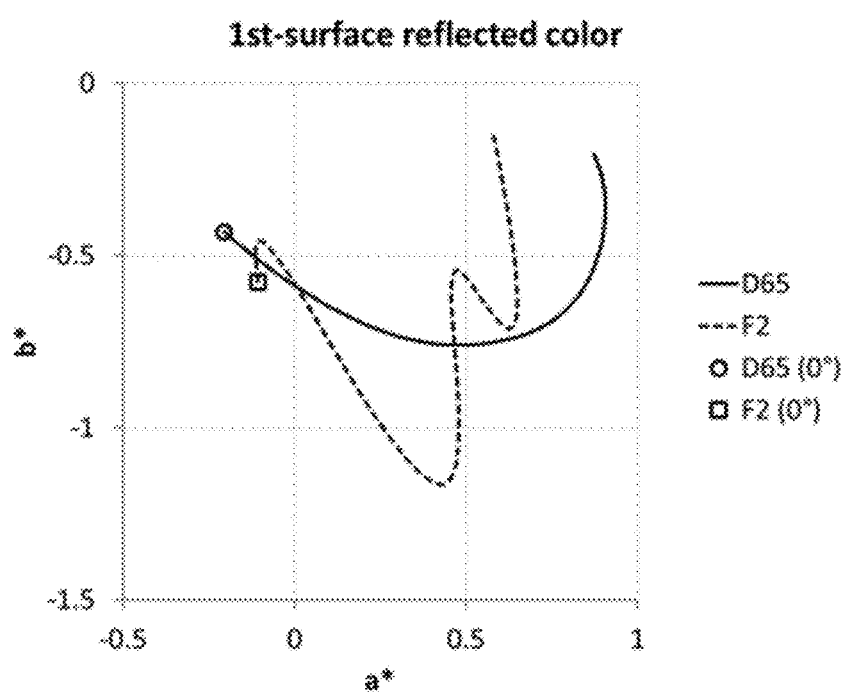
FIG. 33 depicts the reflected color of the article of Example 12 showing the reflected color under different illuminants at different viewing angles from 0° to 60°.

FIGS. 10-33 show the reflectance spectrum for viewing angles of incidence of 8°, 20°, 40°, and 60° and reflected color for angles from 0°-60° for D65 and F2 illumination. FIGS. 10-11 show the calculated reflectance spectra and the calculated reflected color, respectively, for only the anti-reflective surface of Modeled Example 1. FIGS. 12-13 show the calculated reflectance spectra and the calculated reflected color, respectively, for only the anti-reflective surface of Modeled Example 2. FIGS. 14-15 show the calculated reflectance spectra and the calculated reflected color, respectively, for only the anti-reflective surface of Modeled Example 3. FIGS. 16-17 show the calculated reflectance spectra and the calculated reflected color, respectively, for only the anti-reflective surface of Modeled Example 4. FIGS. 18-19 show the calculated reflectance spectra and the calculated reflected color, respectively, for only the anti-reflective surface of Modeled Example 5. FIGS. 20-21 show the calculated reflectance spectra and the calculated reflected color, respectively, for only the anti-reflective surface of Modeled Example 6. FIGS. 22-23 show the calculated reflectance spectra and the calculated reflected color, respectively, for only the anti-reflective surface of Modeled Example 7. FIGS. 24-25 show the calculated reflectance spectra and the calculated reflected color, respectively, for only the anti-reflective surface of Modeled Example 8. FIGS. 26-27 show the calculated reflectance spectra and the calculated reflected color, respectively, for only the anti-reflective surface of Modeled Example 9. FIGS. 28-29 show the calculated reflectance spectra and the calculated reflected color, respectively, for only the anti-reflective surface of Modeled Example 10. FIGS. 30-31 show the calculated reflectance spectra and the calculated reflected color, respectively, for only the anti-reflective surface of Modeled Example 11. FIGS. 32-33 show the calculated reflectance spectra and the calculated reflected color, respectively, for only the anti-reflective surface of Modeled Example 12.

The optical performance of Modeled Examples 1-12 is summarized in Table 13.

viewing angles from normal incidence to 60°, of less than about 3 for both D65 and F2 illuminants.

The optical coatings of Modeled Examples 5 and 12 (Tables 5 and 12) have a balance of optical and mechanical properties. That is, these examples balance scratch resistance with good optical performance in terms of reflectance, color, and/or color shift. More specifically, these examples have a reflectance (over the optical wavelength regime, at angles of incidence of from 8 degrees to about 40 degrees) of about 4% to about 6% (and less than about 10% or about 12% in some examples—angle of incidence of about 60 degrees), and maintain good scratch resistance. Compared to optical coatings optimized for scratch resistance (which have a tradeoff of higher reflectance, i.e., about 10%), the coatings in these examples sacrifice a small amount of scratch resistance to desirably decrease reflectance (to a range of from about 4% to about 6%, and to less than about 10% in some examples). Compared to optical coatings optimized for low reflectance (i.e., about 1%, which would sacrifice scratch resistance for the low reflectance), the coatings in these examples sacrifice a small amount of reflectance (i.e., reflectance in a range of from about 4% to about 6%, and to less than about 10% in some examples, versus the about 1% for a coating optimized for low reflectance) to desirably increase the scratch resistance. These Examples also maintain good optical characteristics in terms of transmitted/reflected color coordinates (i.e., low color), and low color shift.

TABLE 13

Optical performance of Modeled Examples 1-12.

| Modeled Example | Anti-reflective surface reflectance, photopic average (%) (single side) | Maximum angular color shift, viewing angles 0-60 degrees, D65 or F2, sample referenced to itself | Total Amount (sum) of low-index material on air-side of thickest high-index hard layer (nm) | Thickness of top-most (user side) low index (e.g. $SiO_2$) layer (nm) | Amount of high-index material in top 500 nm of coated article (%) |
|---|---|---|---|---|---|
| 1 | 7.85 | 1.1 | 12 | 0 | 97.6 |
| 2 | 6.45 | 0.8 | 55 | 45 | 89 |
| 3 | 8.1 | 1.05 | 20 | 10 | 96 |
| 4 | 8.4 | 0.6 | 35 | 30 | 93 |
| 5 | 4.9 | 3.0 | 27 | 2 | 94.6 |
| 6 | 4.9 | 2.7 | 25 | 0 | 95 |
| 7 | 5.65 | 2.4 | 38 | 20 | 92.4 |
| 8 | 4.0 | 3.75 | 58 | 40 | 88.4 |
| 9 | 2.0 | 2.2 | 91 | 75 | 81.8 |
| 10 | 1.3 | 2.2 | 115 | 100 | 77 |
| 11 | 1.8 | 17.6 | 50 | 0 | 90 |
| 12 | 4.0 | 1.2 | 75.5 | 60 | 84.9 |

As shown in FIGS. 10, 12, 14, 16, 18, 20, 22, 24, 26, 28, 30, and 32, Modeled Examples 1-12 exhibit low reflectance (i.e., values less than about 10% and less than about 8%), for viewing angles of 8°, 20°, and 40°, with the reflectance for a viewing angle of 60° being slightly higher, over the optical wavelength regime. Modeled Example 10 exhibited very low reflectance for viewing angles of 8°, 20°, 40° and 60° (e.g., a maximum average reflectance of about 7% or less). At viewing angles of 8°, 20°, and 40°, the average reflectance is even lower (i.e., less than about 2%).

As shown in FIGS. 11 and 29, Modeled Examples 1 and 10 exhibited a reflected color, at viewing angles from normal incidence to 60°, of less than about 2 for both D65 and F2 illuminants. As shown in FIGS. 19 and 21, Modeled Example 5 and 6 exhibited a range of reflected color, at It is believed that Modeled Examples 1-12 also exhibit the hardness values described herein, as measured by the Berkovich Indenter Hardness Test (and, in particular, a hardness in the range from about 14 GPa to about 21 GPa).

Example 13 and Modeled Example 14

Example 13 and Modeled Example 14 used modeling to demonstrate the reflectance spectra of articles that included embodiments of a durable and scratch-resistant optical coating, as described herein. Also, the optical coating of Example 13 was fabricated and tested. In Example 13 and Modeled Example 14 the optical coating included $AlO_xN_y$ and $SiO_2$ layers, and a strengthened aluminosilicate glass substrate having a nominal composition of about 58 mol % $SiO_2$, 17 mol % $Al_2O_3$, 17 mol % $Na_2O$, 3 mol % MgO, 0.1 mol % SnO, and 6.5 mol % $P_2O_5$, prior to ion exchange with a $K_2O$ bath, as shown in Tables 13 and 14. Refractive index dispersion curves for coating materials and substrate used for Example 13 and Modeled Example 14 were obtained in a similar manner as Modeled Examples 1-12.

TABLE 14

Structure of Example 13

| Coating/ Layer | Periods, if applicable | Material | Refractive Index (at 550 nm) | Physical Thickness (nm) |
|---|---|---|---|---|
| Ambient medium | — | Air | 1 | |
| Optical coating | | $SiO_2$ | 1.48114 | 60 |
| | 1 | $AlO_xN_y$ | 2.00605 | 34 |
| | | $SiO_2$ | 1.48114 | 15.5 |
| | Scratch-Resistant Layer | $AlO_xN_y$ | 2.00605 | 2000 (may be in range from 100-5000 nm) |
| | 1 | $SiO_2$ | 1.48114 | 8.93 |
| | | $AlO_xN_y$ | 2.00605 | 42.63 |
| | 2 | $SiO_2$ | 1.48114 | 30.12 |
| | | $AlO_xN_y$ | 2.00605 | 24.48 |
| | 3 | $SiO_2$ | 1.48114 | 52.41 |
| | | $AlO_xN_y$ | 2.00605 | 7.7 |
| — | — | AS Glass | 1.50542 | |
| Total coating thickness (nm) | | | | 2275.77 |

TABLE 15

Structure of Modeled Example 14.

| Coating/ Layer | Periods, if applicable | Material | Refractive Index (at 550 nm) | Physical Thickness (nm) |
|---|---|---|---|---|
| Ambient medium | — | Air | 1 | |
| Optical coating | | $SiO_2$ | 1.48114 | 10 |
| | 1 | $AlO_xN_y$ | 2.00605 | 25 |
| | | $SiO_2$ | 1.48114 | 25 |
| | Scratch-Resistant Layer | $AlO_xN_y$ | 2.00605 | 2000 (may be in range from 100-5000 nm) |
| | 1 | $SiO_2$ | 1.48114 | 8.93 |
| | | $AlO_xN_y$ | 2.00605 | 42.63 |
| | 2 | $SiO_2$ | 1.48114 | 30.12 |
| | | $AlO_xN_y$ | 2.00605 | 24.48 |
| | 3 | $SiO_2$ | 1.48114 | 52.41 |
| | | $AlO_xN_y$ | 2.00605 | 7.7 |
| — | — | AS Glass | 1.50542 | |
| Total coating thickness (nm) | | | | 2226.27 |

Figure 49:
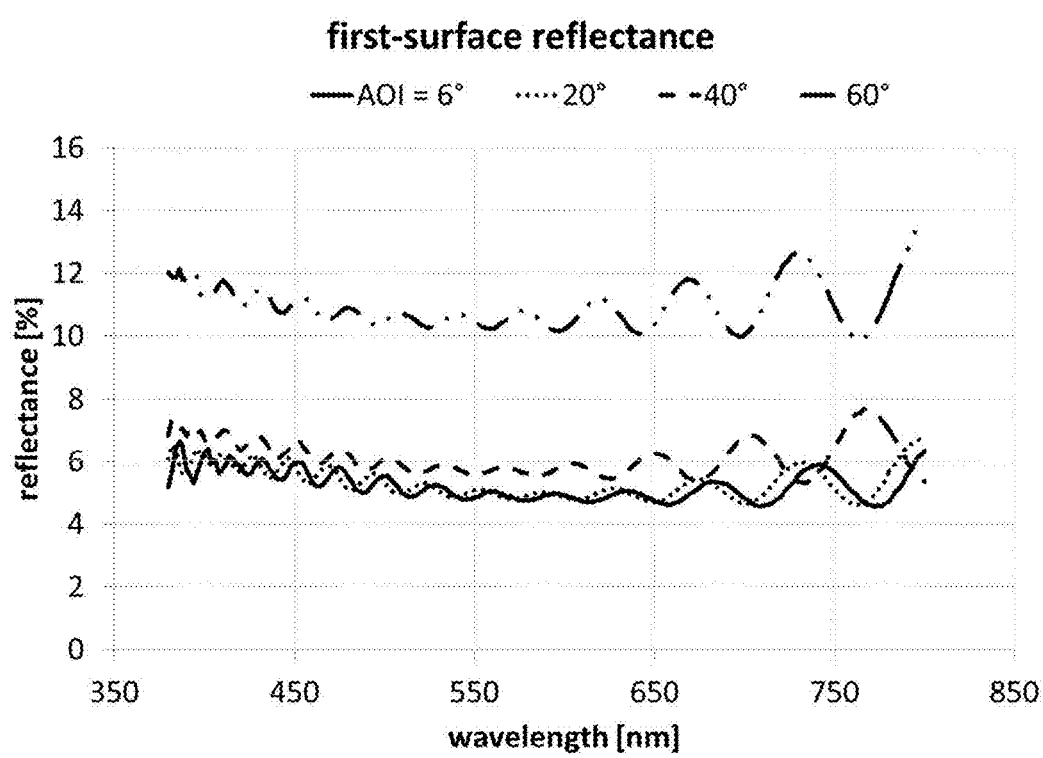
FIG. 49 depicts light reflectance of one or more coated articles described herein.
Figure 50:
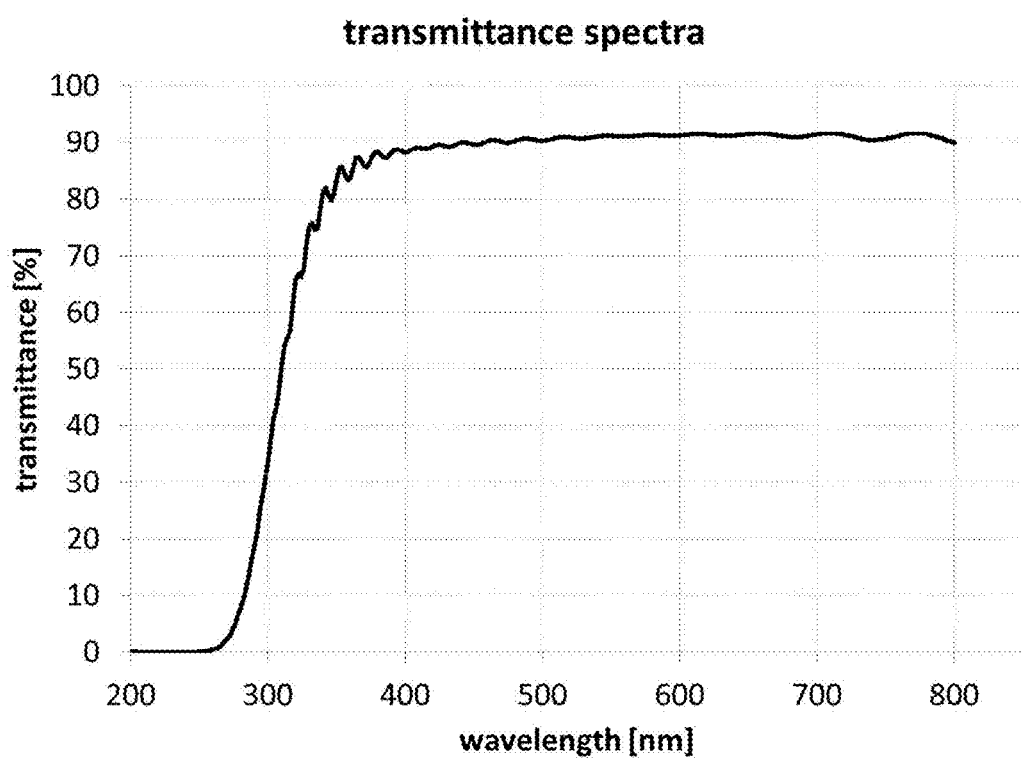
FIG. 50 depicts light transmittance of one or more coated articles described herein.
Figure 51:
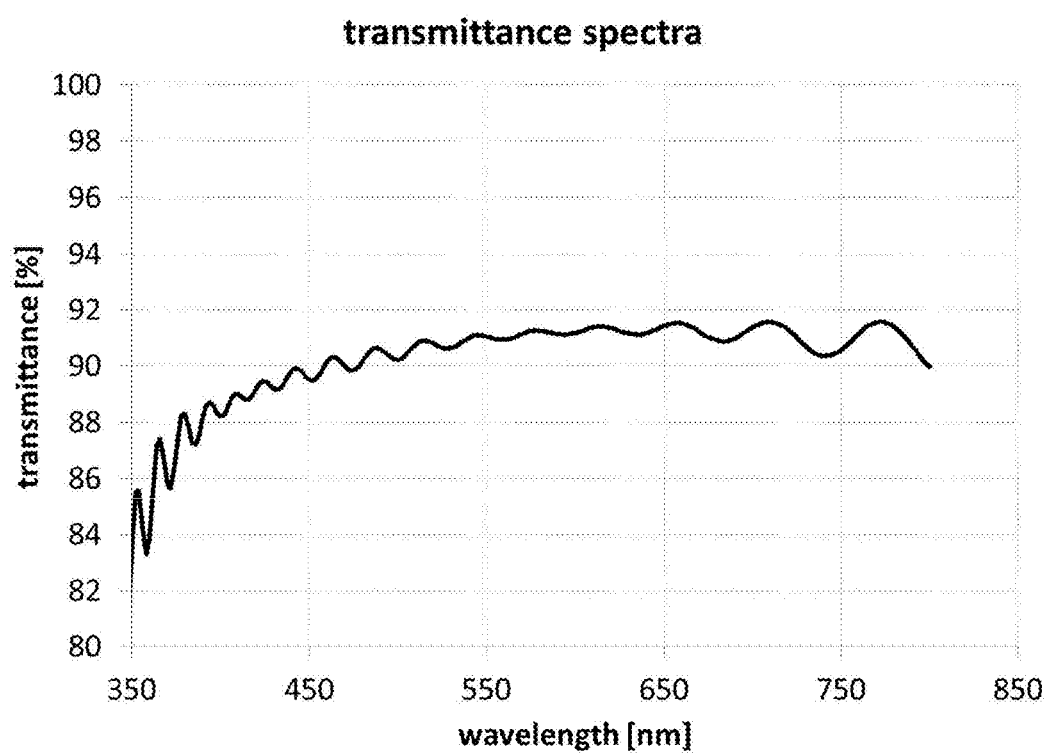
FIG. 51 depicts light transmittance of one or more coated articles described herein.
Figure 52:
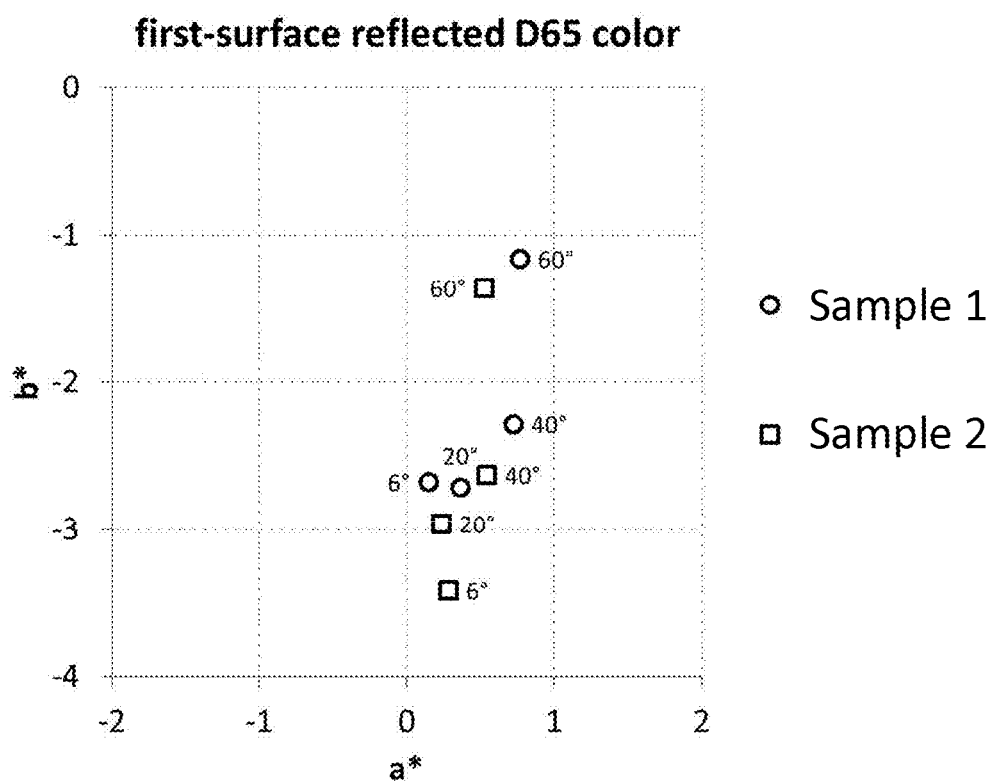
FIG. 52 depicts reflectance color of one or more coated articles described herein.
Figure 53:
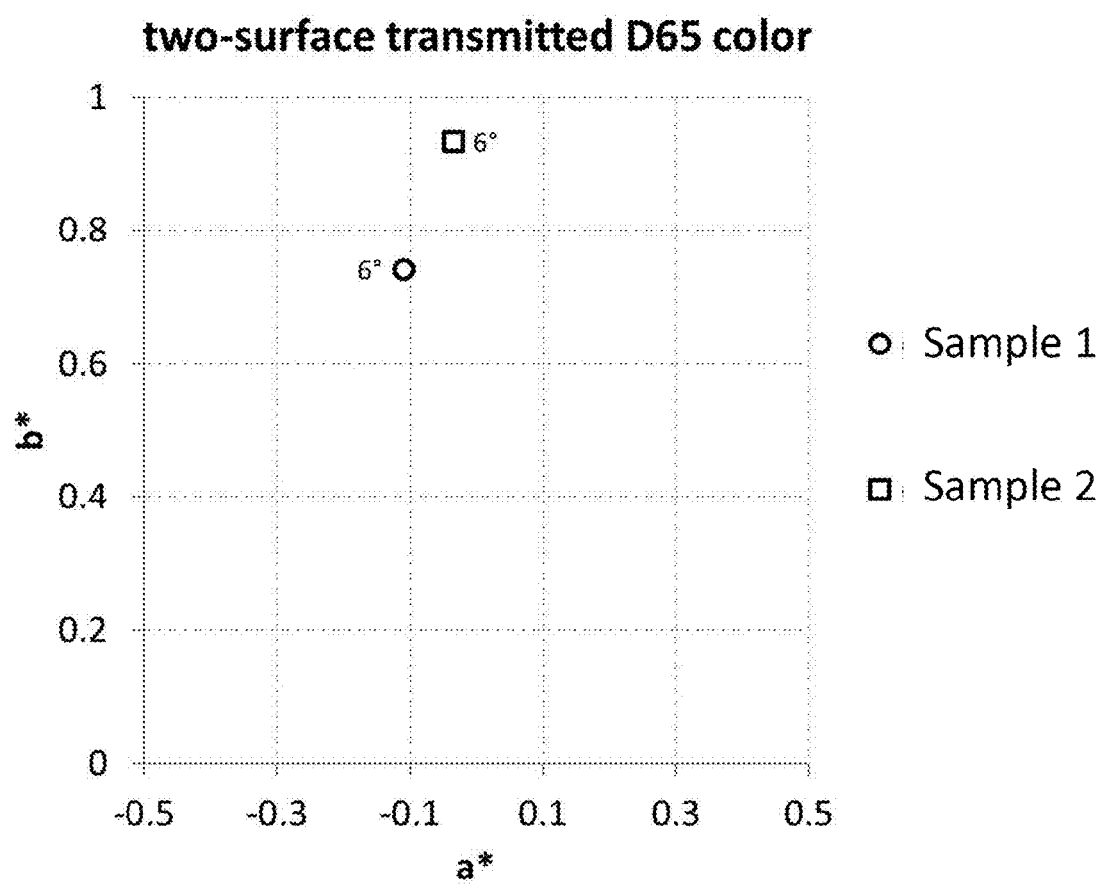
FIG. 53 depicts transmitted color of one or more coated articles described herein.

The optical coating of Example 13 had a reflected D65 color of a* equal to about 0.05 and b* equal to about −1.7 and had a transmitted D65 color of a* equal to about −0.05 and b* equal to about 0.8. Additionally, the optical coating of Example 13 was fabricated and experimentally analyzed. Two samples were fabricated for the optical coating of Example 13 (Sample 1 and Sample 2). Sample 1 was tested for reflectance over the visible wavelength regime at various angles of incidence, which is shown in FIG. 49. The light transmittance of the optical coating of Sample 1 is shown in FIGS. 50 and 51, where FIG. 50 shows light transmittance over a wider range of light wavelengths than FIG. 51. FIGS. 52 and 53 depict reflected color and transmitted color for Samples 1 and 2 at specified angles of incidence, respectively.

Figure 34:
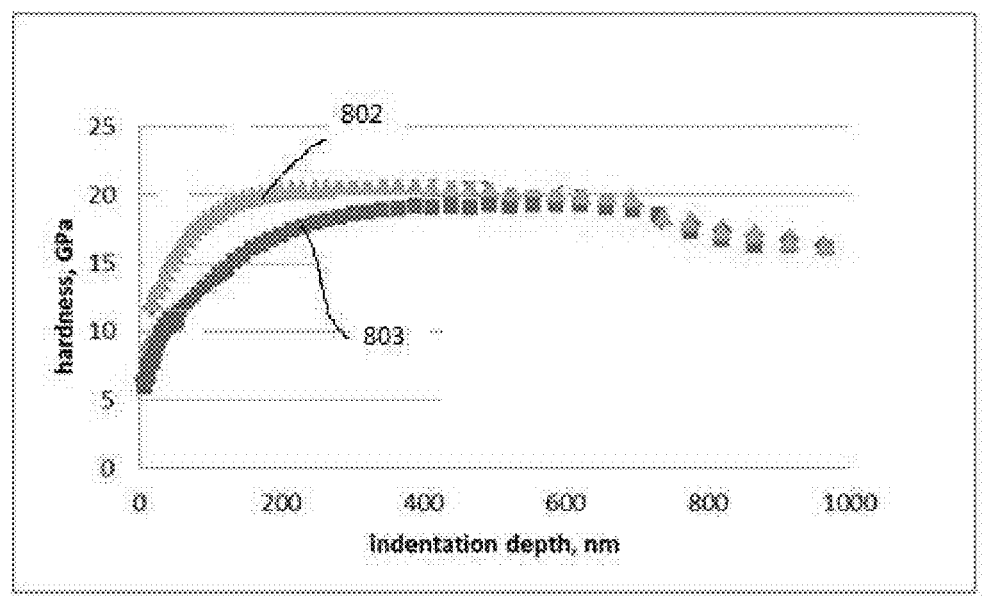
FIG. 34 depicts hardness of one or more coated glass articles described herein.

FIG. 34 shows the hardness profile (Berkovitch hardness for indentation depths of from about 0 nm to about 1000 nm for four optical coatings, where the optical coating of Table 13 is shown as 803, the optical coating of Table 14 is shown as 802.

Example 15

Optical coatings were prepared that included $AlO_xN_y$ and $SiO_2$ layers, and following such preparation were subjected to a plasma treatments, were capped with an $SiO_2$ layer of 6 nm and a easy to clean coating comprising 6.4 nm of a fluorosilane material. The optical coating prepared is shown in Table 15. The uppermost $SiO_2$ layer was deposited using e-beam PVD (sputtering was implemented in sister experiments).

TABLE 16

Structure of Example 15.

| Coating/ Layer | Periods, if applicable | Material | Refractive Index (at 550 nm) | Physical Thickness (nm) |
|---|---|---|---|---|
| Ambient medium | — | Air | 1 | |
| | | fluorsilane | | 6.4 |
| | | $SiO_2$ | 1.48114 | 6 |
| Optical coating | | $SiO_2$ | 1.48114 | 47.3 |
| | 1 | $AlO_xN_y$ | 2.00605 | 32.8 |
| | | $SiO_2$ | 1.48114 | 16.6 |
| | Scratch-Resistant Layer | $AlO_xN_y$ | 2.00605 | 2025.3 (may be in range from 100-5000 nm) |
| | 1 | $SiO_2$ | 1.48114 | 10.7 |
| | | $AlO_xN_y$ | 2.00605 | 40.8 |
| | 2 | $SiO_2$ | 1.48114 | 33.5 |
| | | $AlO_xN_y$ | 2.00605 | 22.9 |
| | 3 | $SiO_2$ | 1.48114 | 54.9 |
| | | $AlO_xN_y$ | 2.00605 | 7.1 |
| — | — | AS Glass | 1.50542 | |
| Total coating thickness (nm) | | | | 2304.3 |

Figure 35:
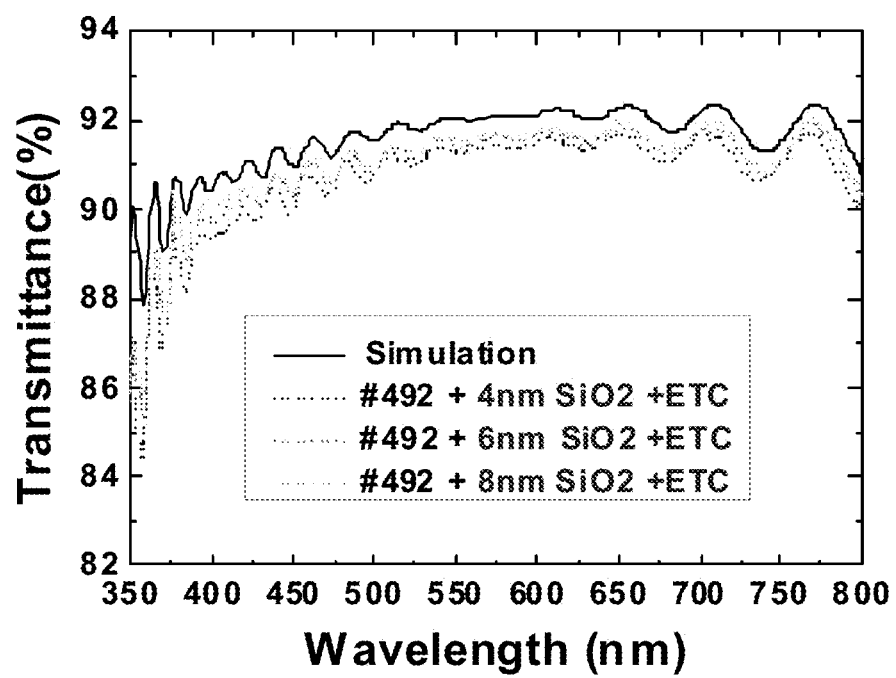
FIG. 35 depicts light transmittance of one or more coated articles described herein.
Figure 36:
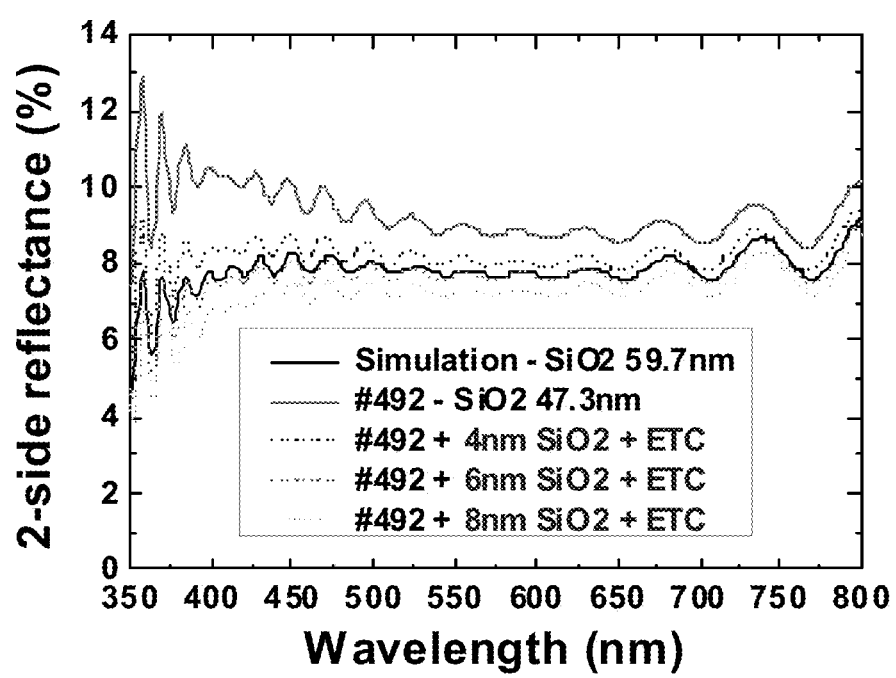
FIG. 36 depicts light reflectance of one or more coated articles described herein.

Optical data was simulated and experimentally collected for the optical coating of Table 15. The uppermost $SiO_2$ layer was also changed to 4 nm and 8 nm to experimentally test slight changes in the thickness of the $SiO_2$ layer which may be present in industrial application of the coatings. FIG. 35 shows transmittance of the optical coating of Example 15 (Table 16), where a simulated model of a 6 nm uppermost $SiO_2$ layer is depicted, and the other data points refer to measured transmittance of the optical coating of Example 15 (Table 16) where 4 nm, 6 nm, and 8 nm $SiO_2$ coatings were deposited following a plasma treatment. FIG. 36 shows 2-sided reflectance of the optical coating of Example 15 (Table 16), where a simulated model of a 6 nm uppermost $SiO_2$ layer is depicted, and the other data points refer to measured reflectance of the optical coating of Table 16 where 0 nm (no additional coating), 4 nm, 6 nm, and 8 nm $SiO_2$ coatings were deposited following a plasma treatment. Table 17 shows the transmitted color of the optical coatings of Example 15 (transmittance shown in FIG. 35), and Table 18 shows the reflected color of the optical coatings of Example 15 (reflectance shown in FIG. 36).

TABLE 17

| Transmitted color | Y | L | a* | b* |
|---|---|---|---|---|
| Simulation | 91.92 | 96.79 | −0.04 | 0.51 |
| #492 + 4 nm | 91.22 | 96.50 | −0.07 | 0.63 |
| #492 + 6 nm | 91.38 | 96.57 | −0.03 | 0.55 |
| #492 + 8 nm | 91.47 | 96.60 | −0.01 | 0.52 |

TABLE 18

| Reflected color | Y | L | a* | b* |
|---|---|---|---|---|
| Simulation | 7.76 | 33.47 | −0.06 | −0.66 |
| #492 + 4 nm | 8.09 | 34.16 | −0.04 | −1.01 |
| #492 + 6 nm | 7.69 | 33.33 | −0.07 | −0.24 |
| #492 + 8 nm | 7.27 | 32.41 | −0.08 | 0.35 |

Figure 37:
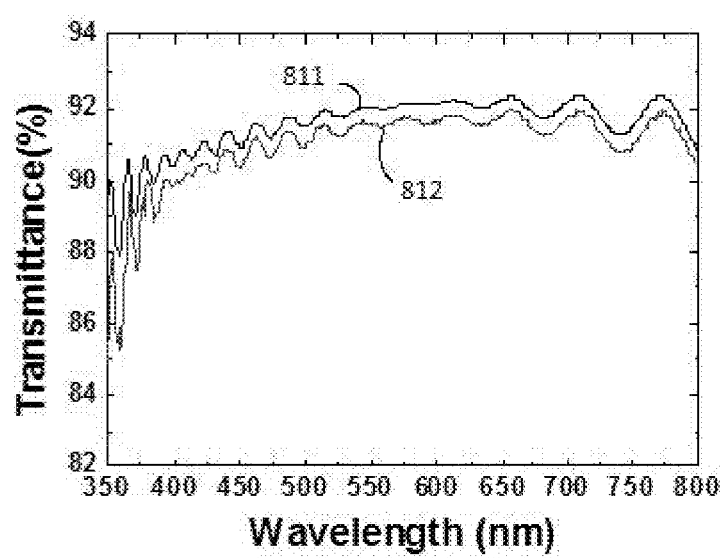
FIG. 37 depicts light transmittance of one or more coated articles described herein.

FIG. 37 shows modeled and observed transmittance data for the optical coating of Example 15. In FIG. 37, 811 corresponds to simulated transmittance at 8° viewing angle and 812 corresponds to observed transmittance at 8° viewing angle. Table 19 shows reflected color data for the optical coating of Example 15.

TABLE 19

| Spectrum | | Y | L* | a* | b* |
|---|---|---|---|---|---|
| Transmitted b* (D65, AOI 8°) | | 90.9 | 96.37 | −0.08 | 0.78 |
| Reflected b* (F2) | 8° | 8.45 | 34.90 | 0.08 | −1.96 |
| | 20° | 8.55 | 35.10 | 0.06 | −1.76 |
| | 40° | 9.47 | 36.87 | 0.30 | −1.60 |
| | 60° | 15.15 | 45.83 | 0.27 | −0.65 |

The optical coatings of Example 15 (Table 16) have a balance of optical and mechanical properties. That is, these examples balance scratch resistance with good optical performance in terms of reflectance, color, and/or color shift. More specifically, these examples have a reflectance (over the optical wavelength regime) of about 6% to less than about 10% (and less than about 8% in some examples), and maintain good scratch resistance. Compared to optical coatings optimized for scratch resistance (which have a tradeoff of higher reflectance, i.e., about 10%), the coatings in these examples sacrifice a small amount of scratch resistance to desirably decrease reflectance (to a range of from about 6% to less than about 10%, and to less than about 8% in some examples). Compared to optical coatings optimized for low reflectance (i.e., about 1%, which would sacrifice scratch resistance for the low reflectance), the coatings in this example sacrifice a small amount of reflectance (i.e., in a range of from about 6% to less than about 10%, and to less than about 8% in some examples, versus the about 1% for a coating optimized for low reflectance) to desirably increase the scratch resistance. These Examples also maintain good optical characteristics in terms of transmitted/reflected color coordinates (i.e., low color), and low color shift.

Examples 15'-17

Examples 15'-17 used modeling and testing to demonstrate the optical properties of articles that included embodiments of a durable and scratch-resistant optical coating, as described herein. Also, the optical coatings in Examples 15'-17 were fabricated and tested. In Examples 15'-17 the optical coating included $AlO_xN_y$ and $SiO_2$ layers, and a strengthened aluminosilicate glass substrate having a nominal composition of about 58 mol % $SiO_2$, 17 mol % $Al_2O_3$, 17 mol % $Na_2O$, 3 mol % MgO, 0.1 mol % SnO, and 6.5 mol % $P_2O_5$, prior to ion exchange with a $K_2O$ bath, as shown in Tables 20, 21 and 22. Refractive index dispersion curves for coating materials and substrate used for Examples 15'-17 were obtained in a similar manner as Modeled Examples 1-12.

TABLE 20

Example 15'

| Coating/Layer | Periods, if applicable | Material | Refractive Index (at 550 nm) | Physical Thickness (nm) |
|---|---|---|---|---|
| Ambient medium | — | Air | 1 | |
| Optical coating | | $SiO_2$ | 1.48114 | 14.0 |
| | 1 | $AlO_xN_y$ | 2.00605 | 23.0 |
| | | $SiO_2$ | 1.48114 | 30.0 |
| Scratch-Resistant Layer | | $AlO_xN_y$ | 2.00605 | 2000.0 (may be in range from 100-5000 nm) |
| | 1 | $SiO_2$ | 1.48114 | 8.6 |
| | | $AlO_xN_y$ | 2.00605 | 44.1 |
| | 2 | $SiO_2$ | 1.48114 | 29.4 |
| | | $AlO_xN_y$ | 2.00605 | 26.0 |
| | 3 | $SiO_2$ | 1.48114 | 50.2 |
| | | $AlO_xN_y$ | 2.00605 | 8.6 |
| — | — | AS Glass | 1.50542 | |
| Total coating thickness (nm) | | | | 2233.9 |

TABLE 21

Example 16

| Coating/Layer | Periods, if applicable | Material | Refractive Index (at 550 nm) | Physical Thickness (nm) |
|---|---|---|---|---|
| Ambient medium | — | Air | 1 | |
| Optical coating | | $SiO_2$ | 1.48114 | 60.0 |
| | 1 | $AlO_xN_y$ | 2.00605 | 34.0 |
| | | $SiO_2$ | 1.48114 | 18.0 |
| Scratch-Resistant Layer | | $AlO_xN_y$ | 2.00605 | 2000.0 (may be in range from 100-5000 nm) |
| | 1 | $SiO_2$ | 1.48114 | 8.6 |
| | | $AlO_xN_y$ | 2.00605 | 44.1 |
| | 2 | $SiO_2$ | 1.48114 | 29.4 |
| | | $AlO_xN_y$ | 2.00605 | 26.0 |
| | 3 | $SiO_2$ | 1.48114 | 50.2 |
| | | $AlO_xN_y$ | 2.00605 | 8.6 |
| — | — | AS Glass | 1.50542 | |
| Total coating thickness (nm) | | | | 2278.9 |

TABLE 22

Example 17

| Coating/Layer | Periods, if applicable | Material | Refractive Index (at 550 nm) | Physical Thickness (nm) |
|---|---|---|---|---|
| Ambient medium | — | Air | 1 | |
| Optical coating | | $SiO_2$ | 1.48114 | 105.0 |
| | 1 | $AlO_xN_y$ | 2.00605 | 32.0 |
| | | $SiO_2$ | 1.48114 | 16.0 |

TABLE 22-continued

Example 17

| Coating/Layer | Periods, if applicable | Material | Refractive Index (at 550 nm) | Physical Thickness (nm) |
|---|---|---|---|---|
| Scratch-Resistant Layer | | $AlO_xN_y$ | 2.00605 | 2000.0 (may be in range from 100-5000 nm) |
| | 1 | $SiO_2$ | 1.48114 | 8.6 |
| | | $AlO_xN_y$ | 2.00605 | 44.1 |
| | 2 | $SiO_2$ | 1.48114 | 29.4 |
| | | $AlO_xN_y$ | 2.00605 | 26.0 |
| | 3 | $SiO_2$ | 1.48114 | 50.2 |
| | | $AlO_xN_y$ | 2.00605 | 8.6 |
| — | — | AS Glass | 1.50542 | |
| Total coating thickness (nm) | | | | 2319.9 |

Figure 38:
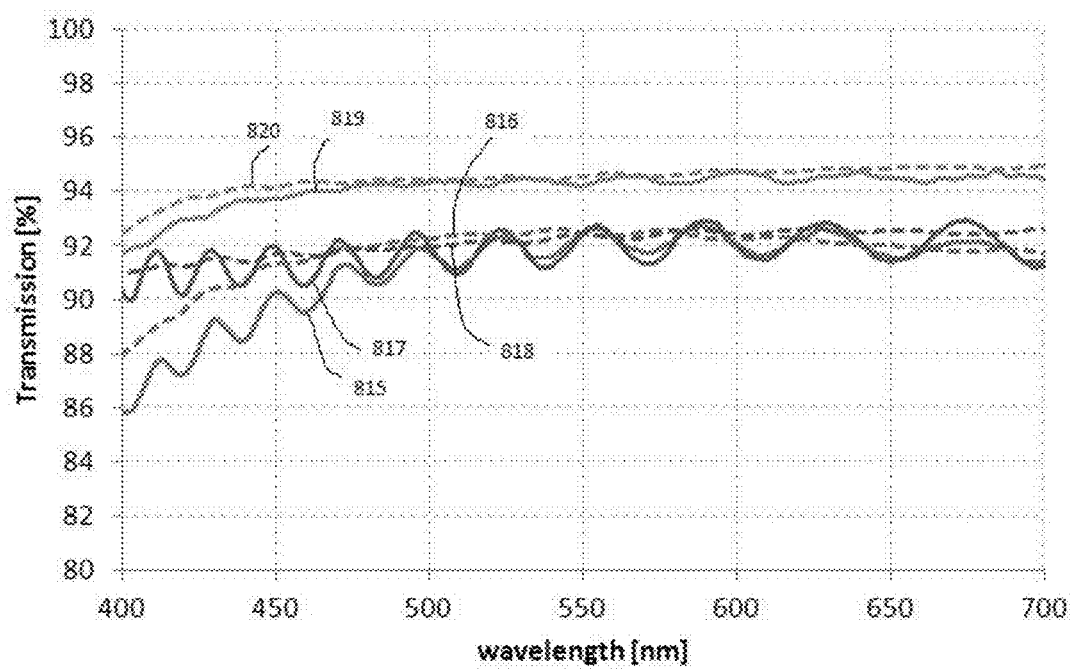
FIG. 38 depicts light transmittance of one or more coated articles described herein.
Figure 39:
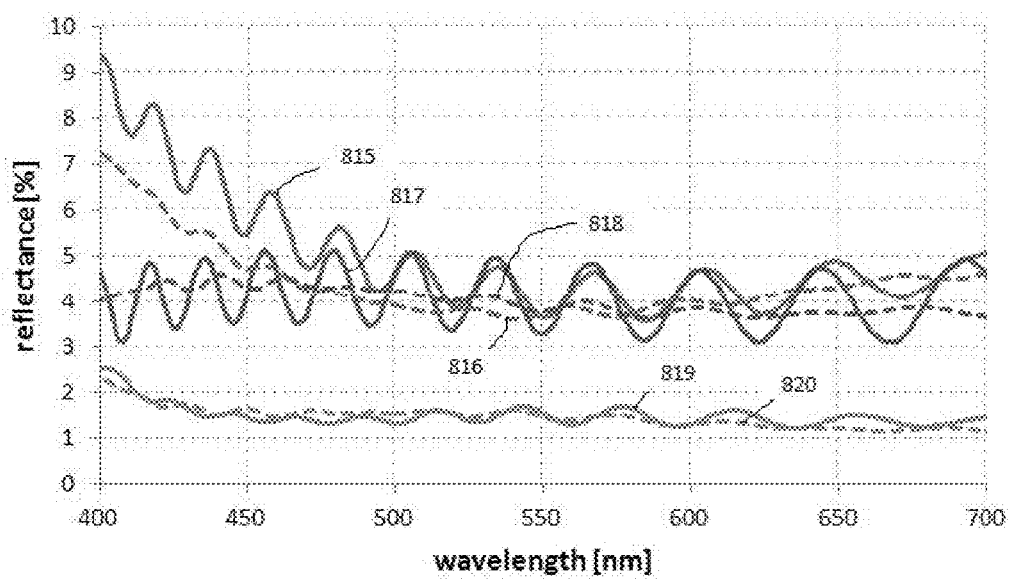
FIG. 39 depicts light reflectance of one or more coated articles described herein.
Figure 40:
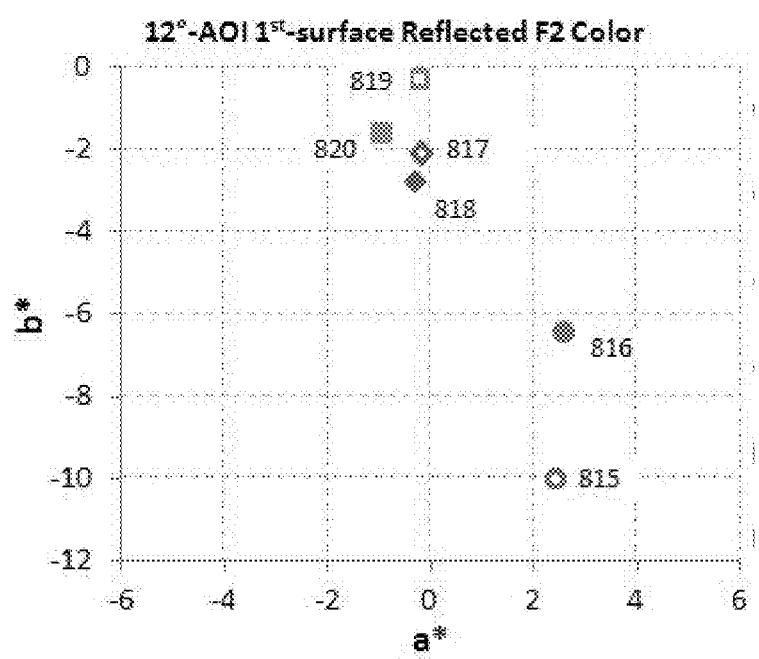
FIG. 40 depicts reflectance color of one or more coated articles described herein.
Figure 41:
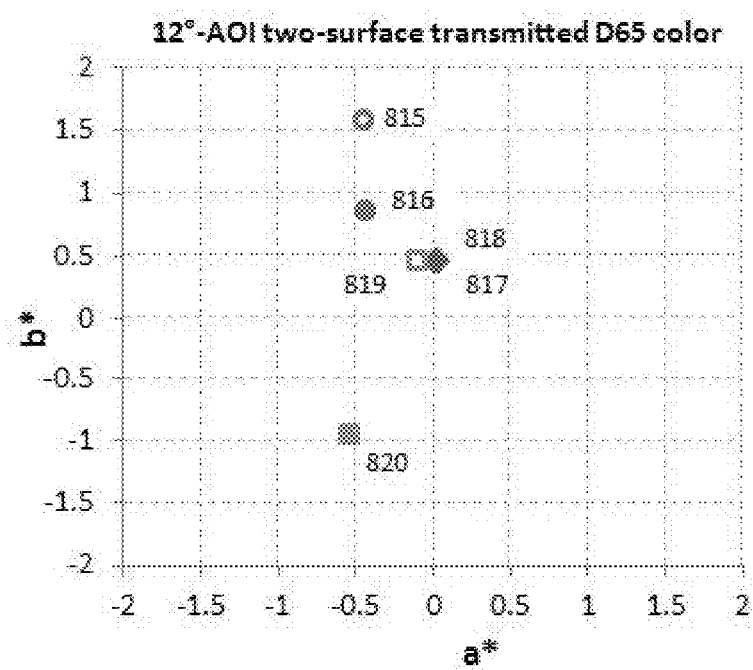
FIG. 41 depicts reflectance color of one or more coated articles described herein.
Figure 42:
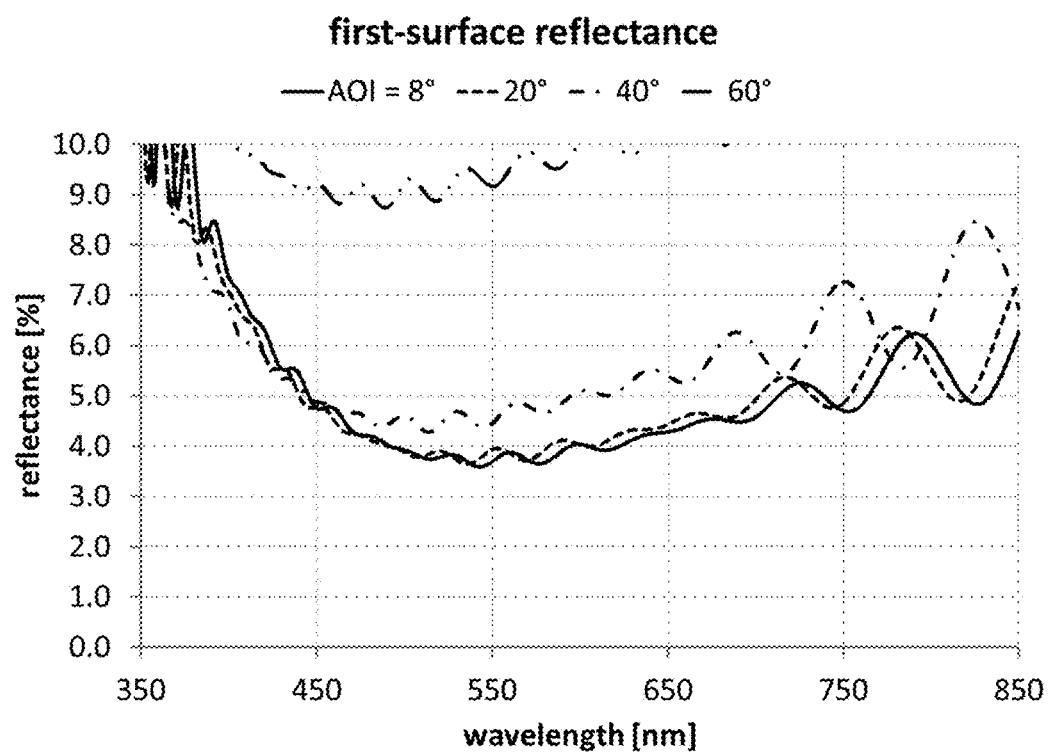
FIG. 42 depicts light reflectance of one or more coated articles described herein.
Figure 43:
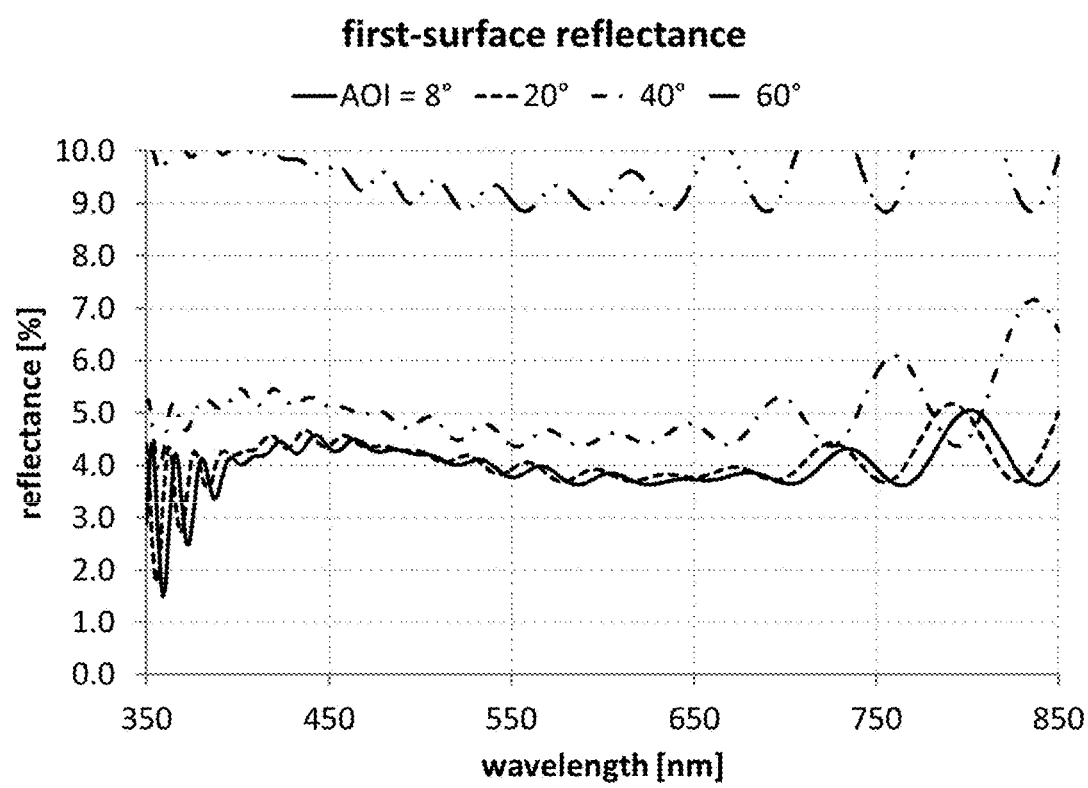
FIG. 43 depicts light reflectance of one or more coated articles described herein.
Figure 44:
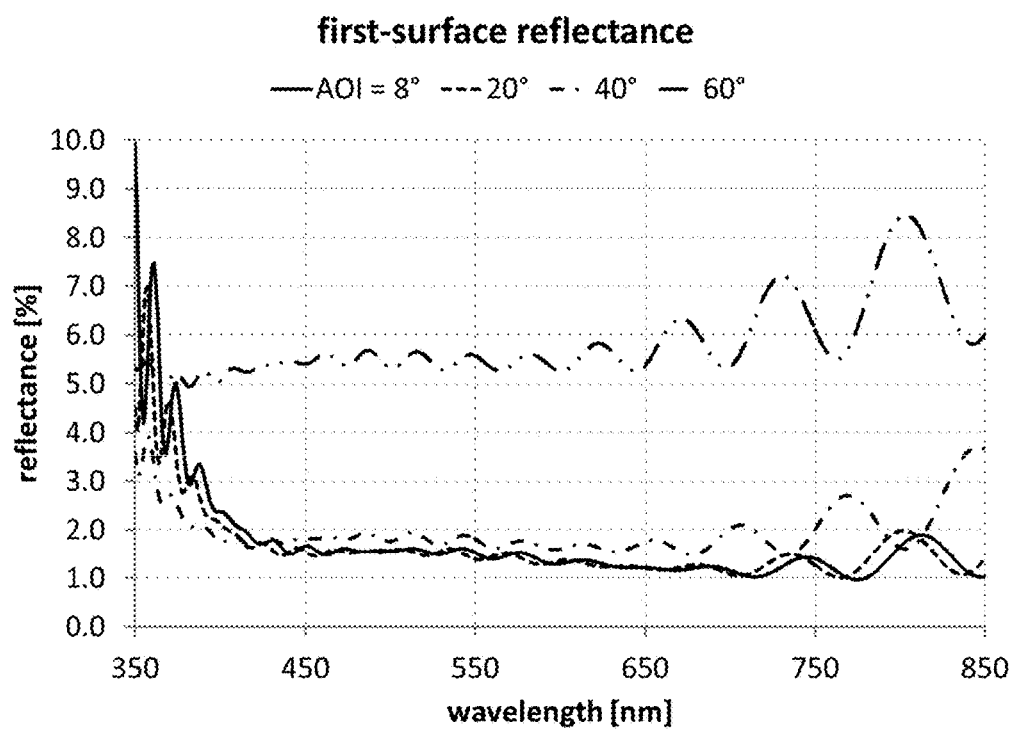
FIG. 44 depicts light reflectance of one or more coated articles described herein.
Figure 45:
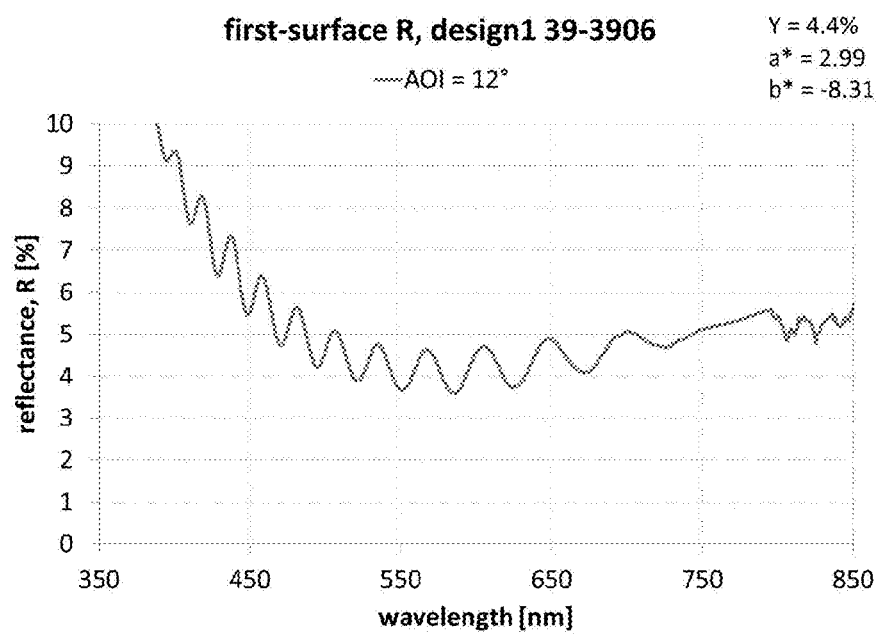
FIG. 45 depicts light reflectance of one or more coated articles described herein.
Figure 46:
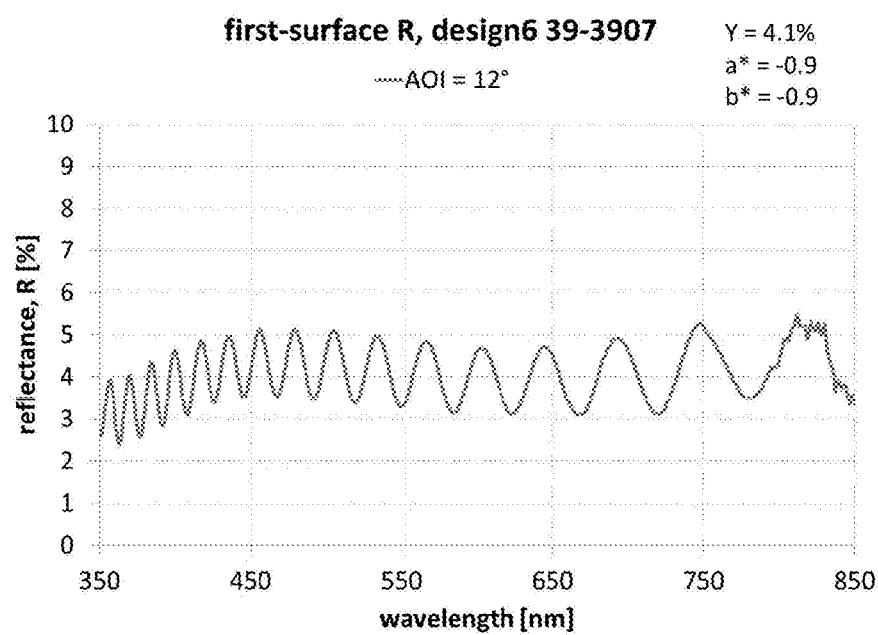
FIG. 46 depicts light reflectance of one or more coated articles described herein.
Figure 47:
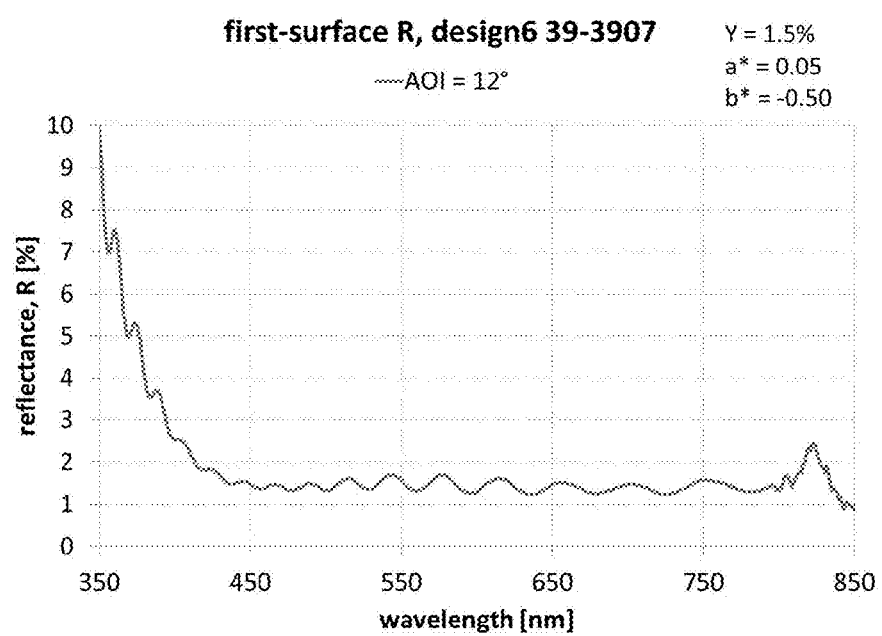
FIG. 47 depicts light reflectance of one or more coated articles described herein.
Figure 48:
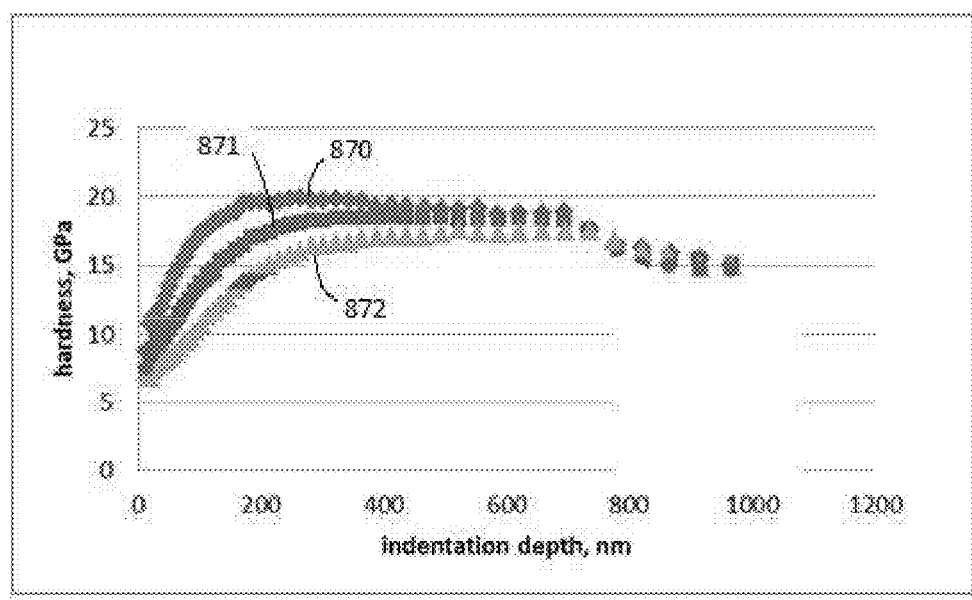
FIG. 48 depicts hardness of one or more coated articles described herein.

FIG. 38 depicts transmission for the optical coatings of Tables 20-22 based on modeled and observed results, where 815 corresponds to the coating of Table 20 measured, 816 corresponds to the coating of Table 20 modeled, 817 corresponds to the coating of Table 21 measured, 818 corresponds to the coating of Table 21 modeled, 819 corresponds to the coating of Table 22 measured, and 820 corresponds to the coating of Table 22 modeled. FIG. 39 depicts reflectance for the optical coatings of Tables 20-22 based on modeled and observed results. FIG. 40 depicts color reflected and FIG. 41 depicts color transmitted for the optical coatings of Tables 20-22 as measured and modeled. FIG. 42 shows modeled reflectance for the optical coating of Table 20, FIG. 43 shows modeled reflectance for the optical coating of Table 21, and FIG. 44 shows modeled reflectance for the optical coating of Table 22. FIG. 45 shows measured reflectance for the optical coating of Table 20, FIG. 46 shows measured reflectance for the optical coating of Table 21, and FIG. 47 shows measured reflectance for the optical coating of Table 22. The modeled and measured reflectance were similar. FIG. 48 shows nanohardness measurements for the optical coatings of Tables 20-22, where 870 corresponds to the optical coating of Table 20, 871 corresponds to the optical coating of Table 21, and 872 corresponds to the optical coating of Table 22. As seen from FIG. 48, desirably, hardness quickly increases within the first 100 nm from the surface (up to a value of about 17 to 20 GPa), and is maintained at about the same value (about 17 to 20 GPa) as depth increases from 100 nm to about 700 nm or about 800 nm, as measured from the surface. Such a hardness profile is desirable in reducing damage from scratches, both more severe scratch events responsible for more visible scratches, and less severe scratch events that might otherwise affect the surface characteristics of the optical coatings.

The optical coatings of Examples 15'-17 (Tables 20-22) have a balance of optical and mechanical properties. That is, these examples balance scratch resistance with good optical performance in terms of reflectance, color and/or color shift. More specifically, these examples have a reflectance (as measured at a angles of incidence over the range of from about 8 degrees to about 40 degrees, and in some examples up to about 60 degrees) of about greater than 1% to about 6% (over the over the optical wavelength regime), and maintain good scratch resistance. Compared to optical coatings optimized for scratch resistance (which have a tradeoff of higher reflectance, i.e., about 10%), the coatings in these examples sacrifice a small amount of scratch resistance to desirably decrease reflectance (to values in a range of from about greater than 1% to about 6%). Compared to optical coatings optimized for low reflectance (i.e., about 1% reflectance, which would sacrifice scratch resistance for the low reflectance), the coatings in these examples sacrifice a small amount of reflectance (i.e., to values from about greater than 1% to about 6% versus the about 1% for a coating optimized for low reflectance) to desirably increase the scratch resistance.

It will be apparent to those skilled in the art that various modifications and variations can be made without departing from the spirit or scope of the invention.

What is claimed is:

1. An article comprising:
    a translucent substrate having a major surface; and
    an optical coating disposed on the major surface and forming an anti-reflective surface, the optical coating comprising an anti-reflective coating, wherein:
        the article comprises a maximum hardness of about 10 GPa or greater on the anti-reflective surface;
        the article exhibits a single side average light reflectance at the anti-reflective surface of about 8% or less, at an incident illumination angle from about 0 degrees to about 10 degrees, over an optical wavelength regime in the range from about 400 nm to about 800 nm; and
        the article exhibits an average light transmission of about 10% or less, at an incident illumination angle from about 0 degrees to about 10 degrees, over an optical wavelength regime in the range from about 400 nm to about 800 nm.

2. The article of claim 1, wherein article exhibits a single side average photopic light reflectance only at the anti-reflective surface of about 2% or less, at an incident illumination angle from about 0 degrees to about 10 degrees, over an optical wavelength regime in the range from about 400 nm to about 800 nm.

3. The article of claim 1, wherein the article comprises a maximum hardness of about 12 GPa or greater on the anti-reflective surface.

4. The article of claim 1, wherein the article exhibits an average light transmission of about 6% or less, at an incident illumination angle from about 0 degrees to about 10 degrees, over an optical wavelength regime in the range from about 400 nm to about 800 nm.

5. The article of claim 1, wherein the article exhibits an average light transmission of about 1% or less, at an incident illumination angle from about 0 degrees to about 10 degrees, over an optical wavelength regime in the range from about 400 nm to about 800 nm.

6. The article of claim 5, wherein the substrate comprises glass-ceramic.

7. The article of claim 6, wherein the substrate is chemically strengthened.

8. The article of claim 6, wherein the substrate comprises a white or black color.

9. The article of claim 1, wherein the substrate has a thickness from about 0.2 mm to about 2.0 mm.

10. The article of claim 1, further comprising an easy-to-clean coating disposed on the anti-reflective coating.

11. The article of claim 1, wherein the article comprises a scratch resistant layer having a thickness in the range from about 0.5 micrometer to about 3 micrometers, and one or more additional layers positioned over the scratch resistant layer.

12. The article of claim 11, wherein the scratch resistant layer comprises a high refractive index material, one or more of the layers positioned over the scratch resistant layer comprises the high refractive index material, and one or more of the layers positioned over the scratch resistant layer comprises a low refractive index material.

13. The article of claim 1, wherein the uppermost 500 nm of the optical coating measured from the anti-reflective surface comprises at least one of:
less than about 30% of low refractive index material; and
at least about 70% of high refractive index material.

14. The article of claim 1, wherein:
the article reflectance color coordinates in the (L*, a*, b*) colorimetry system at normal incidence under an International Commission on Illumination illuminant exhibiting a reference point color shift of less than about 5 from a reference point at the anti-reflective surface, the reference point comprising at least one of the color coordinates (a*=0, b*=0), the color coordinates (a*=−2, b*=−2), and the reflectance color coordinates of the substrate,
wherein, when the reference point is the color coordinates (a*=0, b*=0), the color shift is defined by $\sqrt{((a^*_{article})^2+(b^*_{article})^2)}$,
wherein, when the reference point is the color coordinates (a*=−2, b*=−2), the color shift is defined by $\sqrt{((a^*_{article}+2)^2+(b^*_{article}+2)^2)}$, and
wherein, when the reference point is the color coordinates of the substrate, the color shift is defined by $\sqrt{((a^*_{article}-a^*_{substrate})^2+(b^*_{article}-b^*_{substrate})^2)}$.

15. The article of claim 1, wherein the article exhibits an angular color shift, in reflection, of about 5 or less at an incident illumination angle that is 20 degrees or greater, referenced to normal incidence, under an International Commission on Illumination illuminant selected from the group consisting of A series illuminants, B series illuminants, C series illuminants, D series illuminants, and F series illuminants, wherein angular color shift is calculated using the equation $\sqrt{((a^*_2-a^*_1)^2+(b^*_2-b^*_1)^2)}$, with $a^*_1$, and $b^*_1$ representing the coordinates of the article when viewed at normal incidence and $a^*_2$, and $b^*_2$ representing the coordinates of the article when viewed at the incident illumination angle.

16. The article of claim 15, wherein the article exhibits an angular color shift, in reflection, of about 5 or less at all incident illumination angles in the range from about 20 degrees to about 60 degrees.

17. The article of claim 1, wherein the anti-reflective coating comprises a plurality of layers, wherein the plurality of layers comprises a first low refractive index layer, a second high refractive index layer, and an optional third layer, and further wherein the anti-reflective coating comprises a plurality of periods such that the first low refractive index layer and the second high refractive index layer alternate.

18. The article of claim 1, wherein the anti-reflective coating comprises a first portion and a second portion, and wherein the scratch resistant layer is disposed between the first portion and the second portion.

19. The article of claim 1, wherein the optical coating comprises a thickness and a plurality of layers comprising a nitride or oxy-nitride material, and where the combined thickness of the layers comprising a nitride or an oxynitride is 50% or greater of the thickness of the optical coating.

20. A device comprising:
a housing having front, back, and side surfaces;
electrical components that are at least partially inside the housing;
a display at or adjacent to the front surface of the housing; and
a cover substrate comprising at least a part of the housing, wherein the cover substrate comprises the article of claim 1.

21. An article comprising:
a transparent substrate having a major surface; and
an optical coating disposed on the major surface, wherein:
the article comprises a maximum hardness of about 10 GPa or greater on the anti-reflective surface;
the article exhibits a single side average light reflectance at the anti-reflective surface of about 8% or less, at an incident illumination angle from about 0 degrees to about 10 degrees, over an optical wavelength regime in the range from about 400 nm to about 800 nm;
the article exhibits an average light transmission of about 10% or less, at an incident illumination angle from about 0 degrees to about 10 degrees, over an optical wavelength regime in the range from about 400 nm to about 800 nm;
the substrate comprises glass-ceramic;
the article reflectance color coordinates in the (L*, a*, b*) colorimetry system at normal incidence under an International Commission on Illumination illuminant exhibit a reference point color shift of less than about 5 from a reference point at the anti-reflective surface, the reference point comprising at least one of the color coordinates (a*=0, b*=0), the color coordinates (a*=−2, b*=−2), and the reflectance color coordinates of the substrate,
wherein, when the reference point is the color coordinates (a*=0, b*=0), the color shift is defined by $\sqrt{((a^*_{article})^2+(b^*_{article})^2)}$,
wherein, when the reference point is the color coordinates (a*=−2, b*=−2), the color shift is defined by $\sqrt{((a^*_{article}+2)^2+(b^*_{article}+2)^2)}$, and
wherein, when the reference point is the color coordinates of the substrate, the color shift is defined by $\sqrt{((a^*_{article}-a^*_{substrate})^2+(b^*_{article}-b^*_{substrate})^2)}$.

22. The article of claim 21, wherein the substrate is chemically strengthened.

23. The article of claim 22, wherein the substrate comprises a white or black color.

24. The article of claim 21, wherein the substrate has a thickness from about 0.21 mm to about 2.0 mm.

25. The article of claim 21, further comprising an easy-to-clean coating disposed on the optical coating.

26. The article of claim 21, wherein the article comprises a scratch resistant layer having a thickness in the range from about 0.5 micrometer to about 3 micrometers, and one or more additional layers positioned over the scratch resistant layer.

27. The article of claim 26, wherein the scratch resistant layer comprises a high refractive index material, one or more of the layers positioned over the scratch resistant layer comprises the high refractive index material, and one or more of the layers positioned over the scratch resistant layer comprises a low refractive index material.

28. The article of claim 21, wherein the optical coating comprises a first portion and a second portion, and wherein a scratch resistant layer is disposed between the first portion and the second portion.

29. The article of claim 21, wherein the optical coating comprises a thickness and a plurality of layers comprising a nitride or oxy-nitride material, and where the combined thickness of the layers comprising a nitride or an oxynitride is 50% or greater of the thickness of the optical coating.

30. A device comprising:
a housing having front, back, and side surfaces;
electrical components that are at least partially inside the housing;
a display at or adjacent to the front surface of the housing; and
a cover substrate comprising at least part of the housing, wherein the cover substrate comprises the article of claim 21.

* * * * *

UNITED STATES PATENT AND TRADEMARK OFFICE
CERTIFICATE OF CORRECTION

PATENT NO. : 10,451,773 B2
APPLICATION NO. : 15/434920
DATED : October 22, 2019
INVENTOR(S) : Shandon Dee Hart et al.

Page 1 of 1

It is certified that error appears in the above-identified patent and that said Letters Patent is hereby corrected as shown below:

On the Title Page

Page 2, in Column 1, item [56], Line 3, delete "5,077,569 A 12/1991 Notagashira et al." and insert -- 6,077,569 A 06/2000 Knapp Bradley J et al. --, therefor.

Page 2, in Column 2, item [56], Line 1, delete ""Manufacture" and insert -- "Manufacture of --, therefor.

Page 2, in Column 2, item [56], Line 6, delete "Y2O3" and insert -- $Y_2O_3$ --, therefor.

Page 3, in Column 1, item [56], Line 17, delete "notride" and insert -- nitride --, therefor.

Page 3, in Column 2, item [56], Line 13, delete "Yttria-Stabilzed" and insert -- Yttria-Stabilized --, therefor.

Page 3, in Column 2, item [56], Line 19, delete "Rofessional" and insert -- Professional --, therefor.

In the Claims

Column 48, Line 36, Claim 21, delete "$\sqrt{((a*_{article}+^2)^2}$" and insert -- $\sqrt{((a*_{article}+2)^2}$ --, therefor.

Signed and Sealed this
Eleventh Day of February, 2020

Andrei Iancu
*Director of the United States Patent and Trademark Office*